US012578648B2

(12) United States Patent

Takahashi et al.

(10) Patent No.: US 12,578,648 B2

(45) Date of Patent: Mar. 17, 2026

(54) RINSING LIQUID AND PATTERN FORMING METHOD

(71) Applicant: FUJIFILM Corporation, Tokyo (JP)

(72) Inventors: Satomi Takahashi, Shizuoka (JP); Toru Tsuchihashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 523 days.

(21) Appl. No.: 18/062,021

(22) Filed: Dec. 6, 2022

(65) Prior Publication Data

US 2023/0132693 A1 May 4, 2023

Related U.S. Application Data

(63) Continuation of application No. PCT/JP2021/018367, filed on May 14, 2021.

(30) Foreign Application Priority Data

Jun. 11, 2020 (JP) ................................ 2020-101795

(51) Int. Cl.
*G03F 7/32* (2006.01)

(52) U.S. Cl.
CPC .................................... *G03F 7/325* (2013.01)

(58) Field of Classification Search
CPC .......... G03F 7/325; G03F 7/405; G03F 7/425; G03F 7/40; H01L 21/027; C11D 7/5022
USPC .......................................................... 430/331
See application file for complete search history.

(56) References Cited

U.S. PATENT DOCUMENTS

| | | | |
|---|---|---|---|
| 8,709,704 B2 | 4/2014 | Kamimura et al. | |
| 2015/0118852 A1* | 4/2015 | Lee ..................... | H01L 21/0273 438/703 |
| 2017/0199461 A1 | 7/2017 | Yamamoto et al. | |
| 2018/0081277 A1 | 3/2018 | Inoue et al. | |
| 2018/0120706 A1* | 5/2018 | Shirakawa ........... | C09D 125/18 |
| 2018/0120708 A1 | 5/2018 | Tsubaki et al. | |
| 2018/0275518 A1 | 9/2018 | Inoue et al. | |

(Continued)

FOREIGN PATENT DOCUMENTS

| | | |
|---|---|---|
| JP | 2010152353 | 7/2010 |
| KR | 1020170116339 | 10/2017 |
| TW | 201936671 | 9/2019 |

(Continued)

OTHER PUBLICATIONS

"International Search Report (Form PCT/ISA/210) of PCT/JP2021/018367," mailed on Aug. 3, 2021, with English translation thereof, pp. 1-5.

(Continued)

*Primary Examiner* — Caleen O Sullivan
(74) *Attorney, Agent, or Firm* — JCIPRNET

(57) ABSTRACT

An object of the present invention is to provide a rinsing liquid that has excellent resolution and excellent film thickness loss suppressiveness in a case where the rinsing liquid is used to rinse a resist film and a pattern forming method that uses the rinsing liquid. The rinsing liquid according to an embodiment of the present invention is a rinsing liquid for resist film patterning for a resist film obtained from an actinic ray-sensitive or radiation-sensitive composition, and contains at least a first ester-based solvent having 7 carbon atoms other than an acetate.

13 Claims, 1 Drawing Sheet

(56) References Cited

U.S. PATENT DOCUMENTS

2021/0223698 A1 7/2021 Kamimura

FOREIGN PATENT DOCUMENTS

| | | |
|---|---|---|
| WO | 2016052273 | 4/2016 |
| WO | 2016194613 | 12/2016 |
| WO | 2016208312 | 12/2016 |
| WO | 2017094860 | 6/2017 |
| WO | 2020071042 | 4/2020 |

OTHER PUBLICATIONS

"Written Opinion of the International Searching Authority (Form PCT/ISA/237) of PCT/JP2021/018367," mailed on Aug. 3, 2021, with English translation thereof, pp. 1-6.
Office Action of Japan Counterpart Application, with English translation thereof, issued on Dec. 19, 2023, pp. 1-6.
"Office Action of Korea Counterpart Application", issued on May 28, 2024, with English translation thereof, p. 1-p. 12.
"Office Action of Taiwan Counterpart Application", issued on Jul. 31, 2024, with English translation thereof, p. 1-p. 9.

* cited by examiner

| SHOT NUMBER | EXPOSURE AMOUNT ($\mu C/m^2$) | COMPARATIVE EXAMPLE 1 | EXAMPLE 19 |
|---|---|---|---|
| | | NUMBER OF RESOLUTION FRAMES | |
| | | 1 | 5 |
| 3 | 198 | 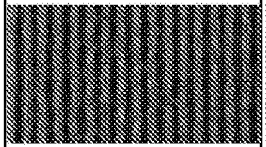 | 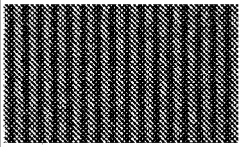 |
| 4 | 177 | 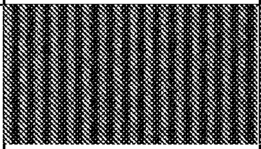 | 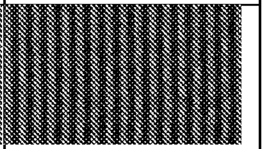 |
| 5 | 157 | 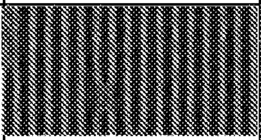 | 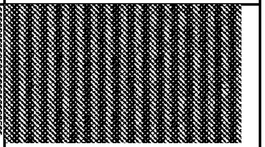 |
| 6 | 140 | 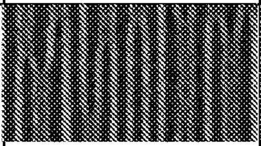 | 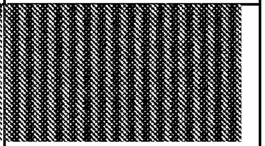 |
| 7 | 125 | 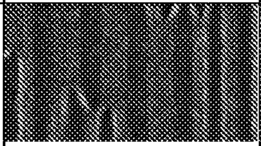 | 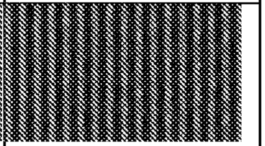 |
| 8 | 112 | 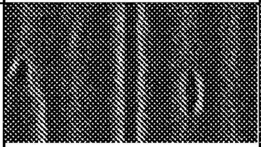 | 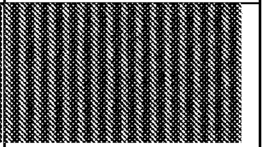 |
| 9 | 99 | 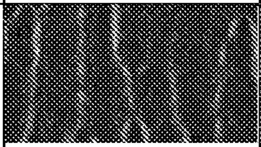 | 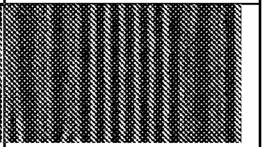 |
| 10 | 89 | 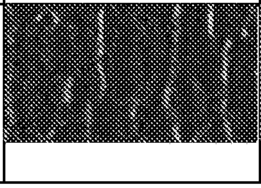 | 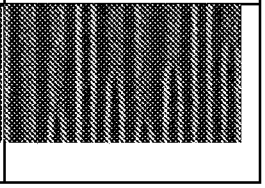 |

RINSING LIQUID AND PATTERN FORMING METHOD

CROSS-REFERENCE TO RELATED APPLICATIONS

This application is a Continuation of PCT International Application No. PCT/JP2021/018367 filed on May 14, 2021, which claims priority under 35 U.S.C. § 119(a) to Japanese Patent Application No. 2020-101795 filed on Jun. 11, 2020. The above applications are hereby expressly incorporated by reference, in its entirety, into the present application.

BACKGROUND OF THE INVENTION

1. Field of the Invention

The present invention relates to a rinsing liquid for resist film patterning and a pattern forming method.

More specifically, the present invention relates to a rinsing liquid and a pattern forming method used for a manufacturing process of a semiconductor such as an integrated circuit (IC), manufacturing of circuit boards such as liquid crystals and thermal heads, other lithography processes such as photofabrication, and the like.

2. Description of the Related Art

Conventionally, in a manufacturing process of semiconductor devices such as an integrated circuit (IC) and a large scale integrated circuit (LSI), nanofabrication is performed by lithography using a photoresist composition. In recent years, as a degree of integration of integrated circuits has been heightened, it has been required that an ultrafine pattern be formed in a submicron region and a quartermicron region. At the same time, a trend toward shorter exposure wavelengths, such as the transition from g-line to i-line and KrF excimer laser light, has been observed. Furthermore, currently, lithography using electron beams, X-rays, or extreme ultra violet (EUV light) in addition to excimer laser light is under development.

In such lithography, after a film (resist film) is formed using an actinic ray-sensitive or radiation-sensitive composition (also called resist composition), a treatment of developing the obtained film with a developer or rinsing the developed film with a rinsing liquid is carried out.

For example, JP2010-152353A discloses a rinsing liquid containing a predetermined solvent.

SUMMARY OF THE INVENTION

In recent years, as a degree of integration of integrated circuits has been heightened, it has been required that high-resolution patterns be formed using a resist composition. During the formation of such fine patterns, the distance between the patterns decreases due to miniaturization, which induces the occurrence of a strong capillary force and leads to a problem in that high-quality patterns are unlikely to be formed. Hereinafter, obtaining a high-resolution pattern will be described as having high resolution.

Furthermore, because the film thickness of patterns also tends to decrease in step with miniaturization, it is markedly required to relieve the performance deterioration of patterns resulting from "film thickness loss of a pattern" in the rinsing treatment. Hereinafter, the ability to suppress the occurrence of film thickness loss of a pattern will be described as having excellent film thickness loss suppressiveness.

The inventors of the present invention have found that in a case where the rinsing liquid (4-methyl-2-pentanol) or the like specifically disclosed in JP2010-152353A is used, at least either resolution or film thickness loss suppressiveness deteriorates.

In view of the above aspects, an object of the present invention is to provide a rinsing liquid having excellent resolution and excellent film thickness loss suppressiveness in a case where the rinsing liquid is used to rinse a resist film.

Another object of the present invention is to provide a pattern forming method using the above rinsing liquid.

Regarding the above objects, the inventors of the present invention conducted intensive studies. As a result, the inventors have found that the objects can be achieved by the following configuration, and accomplished the present invention.

[1] A rinsing liquid for resist film patterning for a resist film obtained from an actinic ray-sensitive or radiation-sensitive composition, the rinsing liquid containing at least a first ester-based solvent having 7 carbon atoms other than an acetate.

[2] The rinsing liquid described in [1], in which a content of the first ester-based solvent is 10% to 100% by mass with respect to a total mass of the rinsing liquid.

[3] The rinsing liquid described in [1] or [2], in which the first ester-based solvent includes at least one compound selected from the group consisting of butyl propionate, propyl butyrate, ethyl valerate, isobutyl propionate, isopropyl butyrate, propyl isobutyrate, isopropyl isobutyrate, ethyl isovalerate, and methyl hexanoate.

[4] The rinsing liquid described in any one of [1] to [3], in which the first ester-based solvent has a linear alkyl group.

[5] The rinsing liquid described in any one of [1] to [4], in which the first ester-based solvent is butyl propionate.

[6] The rinsing liquid described in any one of [1] to [5], in which the rinsing liquid further contains an organic solvent other than the first ester-based solvent.

[7] The rinsing liquid described in [6], in which the organic solvent includes at least one solvent selected from the group consisting of a ketone-based solvent, an ether-based solvent, a hydrocarbon-based solvent, and a second ester-based solvent other than the first ester-based solvent.

[8] The rinsing liquid described in [6] or [7], in which the organic solvent further includes a ketone-based solvent, and the ketone-based solvent includes at least one compound selected from the group consisting of 2-heptanone, 2,6-dimethyl-4-heptanone, 3-methyl-2-butanone, 3,3-dimethyl-2-butanone, 2-methyl-3-pentanone, 3-methyl-2-pentanone, 4-methyl-2-pentanone, diisopropylketone, 2-methyl-3-hexanone, and 5-methyl-2-hexanone.

[9] The rinsing liquid described in [6] or [7], in which the organic solvent further includes an ether-based solvent, and the ether-based solvent includes at least one compound selected from the group consisting of diisobutyl ether and diisopentyl ether.

[10] The rinsing liquid described in [6] or [7], in which the organic solvent further includes a hydrocarbon-based solvent, and the hydrocarbon-based solvent includes at least one compound selected from the group consisting of decane, undecane, and mesitylene.

[11] The rinsing liquid described in [6] or [7], in which the organic solvent further includes a second ester-based solvent, and the second ester-based solvent includes at least one compound selected from the group consisting of butyl acetate, isobutyl acetate, tert-butyl acetate, pentyl formate, isopentyl formate, tert-pentyl formate, isopropyl propionate, ethyl butyrate, and diethyl carbonate.

[12] The rinsing liquid described in any one of [1] to [11], in which the actinic ray-sensitive or radiation-sensitive composition contains a resin having a hydroxystyrene-based repeating unit.

[13]A pattern forming method including a resist film forming step of forming a resist film by using an actinic ray-sensitive or radiation-sensitive composition, an exposure step of exposing the resist film, and a treatment step of treating the exposed resist film with the rinsing liquid described in any one of [1] to [12].

[14]A pattern forming method including a resist film forming step of forming a resist film by using an actinic ray-sensitive or radiation-sensitive resin composition;

an exposure step of exposing the resist film, and a treatment step of treating the exposed resist film, in which the treatment step comprises a development step of developing the resist film with a developer and a rinsing step of rinsing the resist film with a rinsing liquid, and the rinsing liquid is the rinsing liquid described in any one of [1] to [12].

According to the present invention, it is possible to provide a rinsing liquid having excellent resolution and excellent film thickness loss suppressiveness in a case where the rinsing liquid is used to rinse a resist film.

Furthermore, according to the present invention, it is possible to provide a pattern forming method using the rinsing liquid.

BRIEF DESCRIPTION OF THE DRAWINGS

FIG. 1 is a microphotograph showing an example of patterns prepared in examples and comparative examples.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

Regarding the notation of a group (atomic group) in the present specification, unless the gist of the present invention is missed, the notation without the terms "substituted" and "unsubstituted" includes both the group having no substituent and the group having a substituent. For example, "alkyl group" includes not only an alkyl group having no substituent (unsubstituted alkyl group) but also an alkyl group having a substituent (substituted alkyl group). Furthermore, in the present specification, "organic group" refers to a group having at least one carbon atom.

In the present specification, "actinic ray" or "radiation" means, for example, a bright line spectrum of a mercury lamp, a far ultraviolet ray represented by an excimer laser, extreme ultraviolet (EUV light), an X-ray, an electron beam (EB), and the like. In the present specification, "light" means an actinic ray or radiation.

Unless otherwise specified, "exposure" in the present specification means the exposure performed using a bright line spectrum of a mercury lamp, a far ultraviolet ray represented by an excimer laser, extreme ultraviolet, an X-ray, EUV light, and the like, and the drawing performed using particle beams such as an electron beam and an ion beam.

In the present specification, a range described using "to" includes the numerical values, listed before and after "to" as a lower limit and an upper limit.

In the present specification, the bonding direction of a divalent group described is not limited unless otherwise specified. For example, in a case Y in a compound represented by General Formula "X—Y—Z" is —COO—, Y may be —CO—O— or —O—CO—. In addition, the compound may be "X—CO—O—Z" or "X—O—CO—Z".

In the present specification, (meth)acrylate represents acrylate and methacrylate, and (meth)acryloyl represents acryloyl and methacryloyl.

In the present specification, examples of halogen atoms include a fluorine atom, a chlorine atom, a bromine atom, and an iodine atom.

In the present specification, the weight-average molecular weight (Mw), number-average molecular weight (Mn), and dispersity (Mw/Mn) (hereinafter, also called "molecular weight distribution") of a resin are defined as polystyrene-equivalent values measured by GPC ((solvent: tetrahydrofuran, flow rate (sample injection amount): 10 μL, column: TSK gel Multipore HXL-M manufactured by TOSOH CORPORATION, column temperature: 40° C., flow rate: 1.0 mL/min, detector: differential refractive index detector (refractive index detector)) by using a gel permeation chromatography (GPC) device (HLC-8120GPC manufactured by TOSOH CORPORATION).

In the present specification, the boiling point means a boiling point at 1 atmospheric pressure.

In the present specification, a solvent means an organic compound that is a liquid at 25° C. The type, content, and the like of the organic compound contained in the rinsing liquid are measured by, for example, direct injection mass chromatography (DI-MS).

[Rinsing Liquid]

The rinsing liquid according to an embodiment of the present invention contains at least a first ester-based solvent having 7 carbon atoms (hereinafter, also called "first ester-based solvent") other than the acetate that will be described later.

In addition, the rinsing liquid is a rinsing liquid for resist film patterning used to rinse a resist film obtained from an actinic ray-sensitive or radiation-sensitive composition (hereinafter, also called "resist composition").

Examples of characteristics of the rinsing liquid according to the embodiment of the present invention include containing a first ester-based solvent.

In a case where a resist film is subjected to exposure, development, or the like to form a pattern, usually, a solvent having high polarity is used. However, in some cases, the solvent having high polarity dissolves the pattern of the resist film and induces film thickness loss of the pattern. In addition, the solvent having high polarity has low volatility in many cases, which can cause deterioration of resolution particularly in a dense pattern (for example, causes pattern collapse in a dense pattern).

As a result of studies based on the above findings, the inventors of the present invention have revealed that with the rinsing liquid containing the first ester-based solvent, the film thickness loss of the formed pattern can be suppressed, and resolution can also be improved.

According to the inventors of the present invention, presumably, the use of the rinsing liquid containing the first ester-based solvent may suppress the action of causing dissolution or swelling of the pattern, which may contribute to the suppression of film thickness loss by suppressing dissolution of the pattern and to the improvement of resolution. Hereinafter, obtaining at least either the effect of further improving resolution or the effect of further suppressing film thickness loss will be described as further improving the effect of the present invention.

Hereinbelow, the rinsing liquid according to an embodiment of the present invention will be specifically described.

[First Ester-Based Solvent Having 7 Carbon Atoms Other than Acetate]

The rinsing liquid according to an embodiment of the present invention contains a first ester-based solvent having 7 carbon atoms (first ester-based solvent) other than an acetate. The first ester-based solvent is an ester-based solvent that has 7 carbon atoms and is other than an acetate.

The acetate means an ester generated from acetic acid and an alcohol, and examples thereof include isopentyl acetate and the like.

The content of the first ester-based solvent with respect to the total mass of the rinsing liquid is often 1% to 100% by mass, preferably 10% to 100% by mass, more preferably 10% to 90% by mass, even more preferably 20% to 80% by mass, particularly preferably 20% to 50% by mass, and most preferably 20% to 40% by mass.

In view of further improving the effect of the present invention, the first ester-based solvent preferably includes at least one compound selected from the group consisting of butyl propionate, propyl butyrate, ethyl valerate, isobutyl propionate, isopropyl butyrate, propyl isobutyrate, isopropyl isobutyrate, ethyl isovalerate, and methyl hexanoate, more preferably includes at least one compound selected from the group consisting of butyl propionate, propyl butyrate, ethyl valerate, and methyl hexanoate, and even more preferably includes butyl propionate.

The first ester-based solvent may have a linear or branched alkyl group or a linear or branched alkenyl group. Particularly, in view of further improving the effect of the present invention, the first ester-based solvent preferably has a linear or branched alkyl group, and more preferably has a linear alkyl group.

The first ester-based solvent may have one alkyl or alkenyl group described above or a plurality of alkyl or alkenyl groups described above.

The number of carbon atoms in the alkyl or alkenyl group described above is preferably 1 to 6, and more preferably 2 to 4.

On the other hand, in view of volatility and/or solubility, the number of oxygen atoms contained in the molecule of the first ester-based solvent is preferably 2. The first ester-based solvent is preferably composed of only a linear or branched alkyl group (preferably a branched alkyl group), an ester bond, and a hydrogen atom that can be bonded to the carbonyl carbon in the ester bond. Furthermore, it is also preferable that the first ester-based solvent do not have an aromatic ring group, an oxo group, an amino group, and/or a carbamoyl group.

In a case where the first ester-based solvent has a heteroatom (for example, an oxygen atom, a nitrogen atom, a sulfur atom, a halogen atom, or the like), only an oxygen atom is preferable as the heteroatom.

One first ester-based solvent may be used alone, or two or more first ester-based solvents may be used.

[Organic Solvent Other than First Ester-Based Solvent]

The rinsing liquid according to the embodiment the present invention may contain an organic solvent other than the first ester-based solvent (hereinafter, also called "second organic solvent").

Examples of the second organic solvent include a ketone-based solvent, an ether-based solvent, a hydrocarbon-based solvent, and a second ester-based solvent other than the first ester-based solvent.

Particularly, in view of further improving the effect of the present invention, as the second organic solvent, the second ester-based solvent other than the first ester-based solvent is preferable.

<Ketone-Based Solvent>

The second organic solvent may include a ketone-based solvent.

Examples of the ketone-based solvent include 2-heptanone, 2,6-dimethyl-4-heptanone, 3-methyl-2-butanone, 3,3-dimethyl-2-butanone, 2-methyl-3-pentanone, 3-methyl-2-pentanone, 4-methyl-2-pentanone, diisopropylketone, 2-methyl-3-hexanone, and 5-methyl-2-hexanone.

Particularly, in view of further improving the effect of the present invention, the ketone-based solvent preferably includes at least one compound selected from the group consisting of 2-heptanone, 2,6-dimethyl-4-heptanone, 3-methyl-2-butanone, 3,3-dimethyl-2-butanone, 2-methyl-3-pentanone, 3-methyl-2-pentanone, 4-methyl-2-pentanone, diisopropylketone, 2-methyl-3-hexanone, and 5-methyl-2-hexanone, more preferably includes at least one compound selected from the group consisting of 2-heptanone, 2,6-dimethyl-4-heptanone, 3-methyl-2-butanone, 3,3-dimethyl-2-butanone, 2-methyl-3-pentanone, 3-methyl-2-pentanone, and 4-methyl-2-pentanone, and even more preferably includes at least one compound selected from the group consisting of 2-heptanone and 2,6-dimethyl-4-heptanone.

The number of carbon atoms in the ketone-based solvent is preferably 3 to 10, more preferably 5 to 9, and even more preferably 7 to 9.

The ketone-based solvent may have a linear structure, a branched structure, or a cyclic structure.

The ketone-based solvent may have a linear or branched alkyl group.

Particularly, in view of further improving the effect of the present invention, the ketone-based solvent preferably has a branched alkyl group. In addition, the ketone-based solvent may have one alkyl group described above or a plurality of alkyl groups described above.

On the other hand, in view of volatility and/or solubility, the number of oxygen atoms contained in the molecule of the ketone-based solvent is preferably 1. The ketone-based solvent is preferably composed of only a linear or branched alkyl group (preferably a branched alkyl group) and a carbonyl bond. Furthermore, it is also preferable that the ketone-based solvent do not have an aromatic ring group, an alkoxycarbonyl group, an oxo group, an amino group, and/or a carbamoyl group.

In a case where the ketone-based solvent has a heteroatom (for example, an oxygen atom, a nitrogen atom, a sulfur atom, a halogen atom, or the like), only an oxygen atom is preferable as the heteroatom.

One ketone-based solvent may be used alone, or two or more ketone-based solvents may be used.

<Ether-Based Solvent>

The second organic solvent may include an ether-based solvent.

Examples of the ether-based solvent include alkyl ethers such as diisopropyl ether, diisobutyl ether, and diisopentyl ether; glycol ethers such as propylene glycol dimethyl ether, propylene glycol diethyl ether, diethylene glycol dimethyl ether, and diethylene glycol diethyl ether; anisole, phenetole, dioxane, tetrahydrofuran, tetrahydropyrane, perfluoro-2-butyltetrahydrofuran, perfluorotetratetrahydrofuran, 1,4-dioxane, and isopropyl ether. Particularly, in view of further improving the effect of the present invention, the ether-based solvent preferably includes at least one compound selected from the group consisting of alkyl ether and glycol ether, and more preferably includes at least one compound selected from the group consisting of diisobutyl ether and diisopentyl ether.

The number of carbon atoms in the ether-based solvent is preferably 3 to 15, more preferably 5 to 12, and even more preferably 6 to 10.

The ether-based solvent may have a linear structure, a branched structure, or a cyclic structure.

The ether-based solvent may have a linear alkyl group or a branched alkyl group. Particularly, in view of further improving the effect of the present invention, the ether-based solvent preferably has a branched alkyl group.

In addition, the ether-based solvent may have one alkyl group described above or a plurality of alkyl groups described above. In a case where the ether-based solvent has a plurality of alkyl groups described above, the plurality of alkyl groups is preferably the same alkyl group.

On the other hand, in view of volatility and/or solubility, the number of oxygen atoms contained in the molecule of the ether-based solvent is preferably 1. The ether-based solvent is preferably composed of only a linear or branched alkyl group (preferably a branched alkyl group) and an ether bond. Furthermore, it is also preferable that the ether-based solvent do not have an aromatic ring group, an alkoxycarbonyl group, an oxo group, an amino group, and/or a carbamoyl group.

In a case where the ether-based solvent has a heteroatom (for example, an oxygen atom, a nitrogen atom, a sulfur atom, a halogen atom, or the like), only an oxygen atom is preferable as the heteroatom.

One ether-based solvent may be used alone, or two or more ether-based solvents may be used.

<Hydrocarbon-Based Solvent>

The second organic solvent may include a hydrocarbon-based solvent.

Examples of the hydrocarbon-based solvent include an aliphatic hydrocarbon-based solvent. In addition, the hydrocarbon-based solvent may be either an aromatic hydrocarbon-based solvent or an unsaturated hydrocarbon-based solvent.

The aromatic hydrocarbon-based solvent is a hydrocarbon-based solvent having an aromatic ring structure. The aromatic hydrocarbon-based solvent may have an aromatic ring structure and may further have an aliphatic hydrocarbon group.

Examples of the hydrocarbon-based solvent include aliphatic hydrocarbon-based solvents such as pentane, hexane, octane, nonane, decane, dodecane, undecane, hexadecane, 2,2,4-trimethylpentane, and 2,2,3-trimethylhexane; aromatic hydrocarbon-based solvents such as mesitylene, cumene, pseudocumene, 1,2,4,5-tetramethylbenzene, p-cymene, toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene; and unsaturated hydrocarbon-based solvents such as octene, nonene, decene, undecene, dodecene, and hexadecene.

Particularly, in view of further improving the effect of the present invention, the hydrocarbon-based solvent preferably includes at least one compound selected from the group consisting of an aliphatic hydrocarbon and an aromatic hydrocarbon-based solvent, more preferably includes at least one compound selected from the group consisting of octane, nonane, decane, dodecane, undecane, hexadecane, mesitylene, cumene, pseudocumene, 1,2,4,5-tetramethylbenzene, and p-cymene, and even more preferably includes at least one compound selected from the group consisting of decane, undecane, and mesitylene.

The number of carbon atoms in the hydrocarbon-based solvent is preferably 3 to 15, more preferably 5 to 12, and even more preferably 7 to 12.

The hydrocarbon-based solvent may have a linear structure, a branched structure, or a cyclic structure. Particularly, the hydrocarbon-based solvent preferably has a linear structure. The hydrocarbon-based solvent may have a linear or branched alkyl group.

Particularly, in view of further improving the effect of the present invention, the hydrocarbon-based solvent preferably has a linear alkyl group. In addition, the hydrocarbon-based solvent may have one alkyl group described above or a plurality of alkyl groups described above.

On the other hand, in view of volatility and/or solubility, the hydrocarbon-based solvent is preferably composed of only an aromatic ring and a linear or branched alkyl group (preferably a linear alkyl group) or composed of only a linear or branched alkyl group (preferably a linear alkyl group).

One hydrocarbon-based solvent may be used alone, or two or more hydrocarbon-based solvents may be used.

<Second Ester-Based Solvent Other than First Ester-Based Solvent>

The second organic solvent may include a second ester-based solvent other than the first ester-based solvent (hereinafter, also called "second ester-based solvent").

The second ester-based solvent is an ester-based solvent other than the first ester-based solvent described above.

That is, the second ester-based solvent may be an acetate. The second ester-based solvent also includes a carbonate.

Examples of the second ester-based solvent include butyl acetate, isobutyl acetate, tert-butyl acetate, pentyl formate, isopentyl formate, tert-pentyl formate, isopropyl propionate, hexyl propionate, ethyl butyrate, ethyl isobutyrate, butyl butyrate, isobutyl butyrate, butyl isobutyrate, isobutyl isobutyrate, diethyl carbonate, dibutyl carbonate, ethyl hexanoate, propyl hexanoate, isopropyl hexanoate, butyl hexanoate, and isobutyl hexanoate.

Particularly, in view of further improving the effect of the present invention, the second ester-based solvent preferably includes at least one compound selected from the group consisting of butyl acetate, isobutyl acetate, tert-butyl acetate, pentyl formate, isopentyl formate, tert-pentyl formate, isopropyl propionate, ethyl butyrate, and diethyl carbonate, and more preferably includes at least one compound selected from the group consisting of butyl acetate, isobutyl acetate, and isopropyl propionate.

The number of carbon atoms in the second ester-based solvent is preferably 3 to 10, more preferably 5 to 10, and even more preferably 5 to 7.

The second ester-based solvent may have a linear or branched alkyl group or a linear or branched alkenyl group. Particularly, in view of further improving the effect of the present invention, the second ester-based solvent preferably has a linear or branched alkyl group, and more preferably has a branched alkyl group. The second ester-based solvent may have one alkyl or alkenyl group described above or a plurality of alkyl or alkenyl groups described above.

The number of carbon atoms in the alkyl or alkenyl group described above is preferably 1 to 9, more preferably 1 to 6, and even more preferably 1 to 4.

On the other hand, in view of volatility and/or solubility, the number of oxygen atoms contained in the molecule of the second ester-based solvent is preferably 2 or 3, and more preferably 2. The second ester-based solvent is preferably composed of only a linear or branched alkyl group (preferably a branched alkyl group), an ester bond, and a hydrogen atom that can be bonded to the carbonyl carbon in the ester bond. Furthermore, it is also preferable that the second ester-based solvent do not have an aromatic ring group, an oxo group, an amino group, and/or a carbamoyl group.

In a case where the second ester-based solvent has a heteroatom (for example, an oxygen atom, a nitrogen atom, a sulfur atom, a halogen atom, or the like), only an oxygen atom is preferable as the heteroatom.

One second organic solvent may be used alone, or two or more second organic solvents may be used.

In a case where the rinsing liquid according to the embodiment of the present invention contains the second organic solvent, the content of the second organic solvent with respect to the total mass of the rinsing liquid is often 1% to 99% by mass, preferably 1% to 90% by mass, more preferably 10% to 90% by mass, even more preferably 20% to 80% by mass, particularly preferably 50% to 80% by mass, and most preferably 60% to 80% by mass.

The rinsing liquid may intentionally or inevitably contain a regioisomer of the first ester-based solvent or the second organic solvent contained in the rinsing liquid (for example, a regioisomer of the first ester-based solvent or the second organic solvent having a linear alkyl group or a branched alkyl group, or the like), together with the first ester-based solvent or the second organic solvent.

<Content of First Ester-Based Solvent with Respect to Content of Second Organic Solvent>

In a case where the rinsing liquid according to the embodiment of the present invention contains the second organic solvent, the mass ratio of the content of the first ester-based solvent to the content of the second organic solvent (content of first ester-based solvent/content of second organic solvent) is often 0.01 to 100, preferably 0.1 to 50, more preferably 0.2 to 10, even more preferably 0.2 to 4.0, particularly preferably 0.2 to 1.0, and most preferably 0.2 to 0.8.

The total content of the first ester-based solvent and the second organic solvent with respect to the total mass of the rinsing liquid is preferably 95.0% by mass or more, more preferably 98.0% by mass or more, even more preferably 99.0% by mass or more, particularly preferably 99.5% by mass or more, and most preferably 99.9% by mass or more. The upper limit of the total content is not particularly limited, but is preferably 100% by mass or less.

[Other Components]

The rinsing liquid according to the embodiment of the present invention may contain other components in addition to the components described above.

<Metal Component>

The rinsing liquid according to the embodiment of the present invention may contain a metal component.

Examples of the metal component include metal particles and metal ions.

The content of the metal component means the total content of metal particles and metal ions.

The rinsing liquid may contain either metal particles or metal ions, or may contain both of them.

Examples of metal atoms contained in the metal component include metal atoms selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one metal atom or two or more of metal atoms.

The metal particles may be a simple metal or an alloy, and may be in the form of particles in which a metal and an organic substance are aggregated.

The metal component may be a metal component which is inevitably incorporated into each component (raw material) of the rinsing liquid or a metal component inevitably incorporated into the rinsing liquid during the manufacturing, storage, and/or transfer of the rinsing liquid. Alternatively, the metal component may be intentionally added.

In a case where the rinsing liquid contains a metal component, the content of the metal component with respect to the total mass of the rinsing liquid is preferably more than 0 ppt by mass and 1 ppm by mass or less, more preferably more than 0 ppt by mass and 10 ppb by mass or less, and even more preferably more than 0 ppt by mass and 10 ppt by mass or less. The type and content of the metal component in the rinsing liquid can be measured by an inductively coupled plasma mass spectrometry (ICP-MS).

<Ionic Liquid>

The rinsing liquid according to the embodiment of the present invention may contain an ionic liquid.

In a case where the rinsing liquid contains an ionic liquid, the ionic liquid is not included in the first ester-based solvent and the second organic solvent described above.

The ionic liquid is preferably, for example, an ionic liquid having a cation such as an aromatic ion including a pyridinium ion, an imidazolium ion, or the like or an aliphatic amine-based ion including as a trimethylhexyl ammonium ion or the like; an ionic liquid based on an inorganic ion such as $NO_3^-$, $CH_3CO_2^-$, $BF_6^-$, or $PF_6^-$ or an ionic liquid having a fluorine-containing organic anion such as $(CF_3SO_2)_2N^-$, $CF_3CO_2^-$, or $CF_3SO_2^-$; or a quaternary ammonium salt-based ionic liquid.

Examples of commercially available products of the ionic liquid include quaternary ammonium salt-based ionic liquids such as IL-P14 and IL-A2 (manufactured by KOEI CHEMICAL CO., LTD.); ELEGAN SS-100 (manufactured by NOF CORPORATION), and the like.

One ionic liquid may be used alone, or two or more ionic liquids may be used in combination.

In a case where the rinsing liquid according to the embodiment of the present invention contains an ionic liquid, the content of the ionic liquid with respect to the total mass of the rinsing liquid is preferably 0.5% to 15% by mass, more preferably 1% to 10% by mass, and even more preferably 1% to 5% by mass.

<Surfactant>

The rinsing liquid according to the embodiment of the present invention may contain a surfactant.

In a case where the rinsing liquid contains a surfactant, the wettability of the rinsing liquid with respect to a resist film is improved, and either or both of development and rinsing proceed more effectively.

As the surfactant, the same surfactant as that contained in the resist composition that will be described later can be used.

One surfactant may be used alone, or two or more surfactants may be used in combination.

In a case where the rinsing liquid according to the embodiment of the present invention contains a surfactant, the content of the surfactant with respect to the total mass of the rinsing liquid is preferably 0.001% to 5% by mass, more preferably 0.005% to 2% by mass, and even more preferably 0.01% to 0.5% by mass.

<Antioxidant>

The rinsing liquid according to the embodiment of the present invention may contain an antioxidant.

As the antioxidant, an amine-based antioxidant or a phenol-based antioxidant is preferable:

One antioxidant may be used alone, or two or more antioxidants may be used in combination.

In a case where the rinsing liquid according to the embodiment of the present invention contains an antioxidant, the content of the antioxidant with respect to the total mass of the rinsing liquid is preferably 0.0001% to 1% by mass, more preferably 0.0001% to 0.1% by mass, and even more preferably 0.0001% to 0.01% by mass.

<Basic Compound>

The rinsing liquid according to the embodiment of the present invention may contain a basic compound.

Examples of the basic compound include an acid diffusion control agent contained in the resist composition that will be described later.

One basic compound may be used alone, or two or more basic compounds may be used in combination.

In a case where the rinsing liquid according to the embodiment of the present invention contains a basic compound, the content of the basic compound with respect to the total mass of the rinsing liquid is preferably 10% by mass or less, and more preferably 0:5% to 5% by mass. In the present invention, only one basic compound described above may be used, or two or more basic compounds described above having different chemical structures may be used in combination.

<Other Solvents>

The rinsing liquid according to the embodiment of the present invention may contain other solvents.

Those other solvents are not particularly limited, and examples thereof include solvents that do not correspond to any of the second organic solvent such as a hydrocarbon-based solvent, a ketone-based solvent, an ester-based solvent, an alcohol-based solvent, an amide-based solvent, or an ether-based solvent and the aforementioned first ester-based solvent.

<Organic Substance Having Boiling Point of 300° C. Or Higher>

In a case where a rinsing liquid containing an organic substance having a boiling point of 300° C. or higher is applied to a semiconductor device manufacturing process, sometimes the organic substance having a high boiling point remains without volatilizing, which causes a defect failure of a substrate.

As the organic substance having a boiling point of 300° C. or higher, for example, a resin component, a plasticizer, or the like contained in a plastic material (for example, an O-ring or the like) used in a member of a manufacturing apparatus can be considered. Presumably, the organic substance may be eluted in the liquid at any point in time in the manufacturing process.

In a case where the rinsing liquid contains an organic substance having a boiling point of 300° C. or higher, in view of suppressing the defect failure of a substrate in a case where the rinsing liquid is applied to a semiconductor device manufacturing process, the content of the organic substance having a boiling point of 300° C. or higher with respect to the total mass of the rinsing liquid is preferably 0.001 to 50 ppm by mass, more preferably 0.001 to 30 ppm by mass, even more preferably 0.001 to 15 ppm by mass, particularly preferably 0.001 to 10 ppm by mass, and most preferably 0.001 to 1 ppm by mass.

As the organic substance having a boiling point of 300° C. or higher, for example, a component such as dioctyl phthalate (DOP, boiling point 385° C.) eluted from an O-ring, diisononyl phthalate (DINP, boiling point 403° C.), dioctyl adipate (DOA, boiling point 335° C.), dibutyl phthalate (DBP, boiling point 340° C.), ethylene propylene rubber (EPDM, boiling point 300° C. to 450° C.), and the like have been confirmed.

Examples of a method for keeping the content of the organic substance having a boiling point of 300° C. or higher in the rinsing liquid within the aforementioned range include the methods exemplified in the purification step that will be described later.

[Pattern Forming Method]

The present invention also relates to a pattern forming method using a rinsing liquid.

The pattern forming method comprises, for example, (i) a resist film forming step of forming a resist film by using a resist composition, (ii) an exposure step of exposing the resist film, and (iii) a treatment step of treating the exposed resist film with the rinsing liquid described above.

Hereinafter, each step included in the pattern forming method will be described. In addition, as an example of the treatment step, a development step and a rinsing step will be described.

<(i) Resist Film Forming Step>

The resist film forming step is a step of forming a resist film by using a resist composition.

In forming the resist film by using the resist composition, for example, the components that will be described later are dissolved in a solvent to prepare a resist composition, the resist composition is filtered through a filter as necessary, and then the resist composition is applied onto a support (substrate) to form a resist film. The pore diameter of the filter is preferably 0.1 m or less, more preferably 0.05 μm or less, and even more preferably 0.03 m or less. The lower limit of the pore diameter is 0.01 μm or more in many cases. As a material of the filter, polytetrafluoroethylene, polyethylene, or nylon is preferable.

The resist composition is applied onto a support (substrate), for example, by an appropriate coating method such as a spinner. Then, the coating film (the coating film of the applied resist composition) is dried to form a resist film. As necessary, various undercoat films (an inorganic film, an organic film, and an antireflection film) may be formed as underlayers of the resist film.

The support on which the resist film is to be formed is not particularly limited. As the support, it is possible to use substrates generally used in the manufacturing process of semiconductors such as IC, the manufacturing process of circuit boards such as liquid crystals or thermal heads, and other lithography processes of photofabrication, and the like.

Specific examples of the support include inorganic substrates such as silicon, $SiO_2$, and SiN, and the like.

The aforementioned substrate also includes a semiconductor substrate consisting of a single layer and a semiconductor substrate consisting of multiple layers.

The material constituting the semiconductor substrate consisting of a single layer is not particularly limited.

Usually, the semiconductor substrate consisting of a single layer is preferably composed of a Group III-V compound such as silicon, silicon germanium, or GaAs, or any combination of these.

In the case of semiconductor substrate consisting of multiple layers, the composition thereof is not particularly limited. For example, the semiconductor substrate consisting of multiple layers may be composed of a semiconductor substrate such as silicon described above and an integrated circuit structure that is on the semiconductor substrate and has exposed interconnect features such as metal wires and dielectric materials. Examples of metals and alloys used in the interconnect features include aluminum, aluminum alloyed with copper, copper, titanium, tantalum, cobalt, silicon, titanium nitride, tantalum nitride, and tungsten. In addition, a layer such as an interlayer dielectric layer, silicon oxide, silicon nitride, silicon carbide, and/or carbon-doped silicon oxide may be provided on the semiconductor substrate.

As a drying method, a method of heating and drying is generally used.

The heating temperature is preferably 80° C. to 180° C., more preferably 80° C. to 150° C., even more preferably 80° C. to 140° C., and particularly preferably 80° C. to 130° C.

The heating time is preferably 30 to 1,000 seconds, more preferably 60 to 800 seconds, and even more preferably 60 to 600 seconds.

The film thickness of the resist film is generally 200 nm or less, and preferably 100 nm or less.

For example, in order to resolve a 1:1 line-and-space pattern having a size of 30 nm or less, the film thickness of the resist film is preferably 50 nm or less. In a case where the film thickness of the resist film is 50 nm or less, pattern collapse is unlikely to occur in a case where the resist film is applied to the development step that will be described later, and higher resolution performance can be obtained.

In view of further improving etching resistance and resolution, the film thickness of the resist film is preferably 15 to 70 nm, and more preferably 15 to 65 nm.

In addition, as necessary, a resist underlayer film (for example, spin on glass (SOG), spin on carbon (SOC), and/or an antireflection film) may be formed between the resist film and the support. As a material constituting the resist underlayer film, for example, a known organic or inorganic material can be appropriately used.

A protective film (topcoat) may be formed as an upper layer of the resist film. As the protective film, a known material can be appropriately used. For example, it is possible to suitably use the composition for forming a protective film disclosed in US2007/0178407A, US2008/0085466A, US2007/0275326A, US2016/0299432A, US2013/0244438A, and WO2016/157988A. The composition for forming a protective film preferably contains the acid diffusion control agent described above. In addition, for example, the upper layer film may be formed based on the description in paragraphs "0072" to "0082" of JP2014-059543A.

The film thickness of the protective film is preferably 10 to 200 nm, more preferably 20 to 100 nm, and even more preferably 40 to 80 nm.

<(ii) Exposure Step>

In the pattern forming method, the exposure method in (ii) exposure step may be immersion exposure.

The pattern forming method preferably includes (iv) preheating (PB: PreBake, hereinafter, also called "post-coating bake") step before (ii) exposure step.

The pattern forming method preferably includes (v) post-exposure heating (PEB: Post Exposure Bake, also called post-exposure bake) step after (ii) exposure step and before (iii) development step.

The pattern forming method may include (ii) exposure step performed a plurality of times.

The pattern forming method may include (iv) preheating step performed a plurality of times.

The pattern forming method may include (v) post-exposure heating step performed a plurality of times.

In the pattern forming method, (ii) exposure step can be performed by a generally known method.

In both of (iv) preheating step and (v) post-exposure heating step, the heating temperature is preferably 80° C. to 150° C., more preferably 80° C. to 140° C., and even more preferably 80° C. to 130° C.

In both of (iv) preheating step and (v) post-exposure heating step, the heating time is preferably 30 to 1,000 seconds, more preferably 60 to 800 seconds, and even more preferably 60 to 600 seconds.

The heating can be performed by a unit comprising an exposure device and a development device, or may be performed using a hot plate or the like.

The wavelength of a light source used in the exposure step is not limited, and examples thereof include infrared light, visible light, ultraviolet light, far ultraviolet rays, extreme ultraviolet (EUV light), X-rays, electron beams, and the like. Among these, far ultraviolet rays are preferable, and the wavelength thereof is preferably 250 nm or less, more preferably 220 nm or less, and even more preferably 1 to 200 nm.

Specific examples thereof include a KrF excimer laser (248 nm), an ArF excimer laser (193 nm), an $F_2$ excimer laser (157 nm), X-rays, EUV (13 nm), and electron beams, and the like. Among these, a KrF excimer laser, an ArF excimer laser, EUV, or electron beams are preferable, and EUV or electron beams are more preferable.

<(iii) Step of Treating Exposed Film>

(iii) Step of treating the exposed film usually includes (vi) development step of developing the film with a developer (development step) and (vii) rinsing step of rinsing the film with a rinsing liquid (rinsing step).

The rinsing liquid according to the embodiment of the present invention is preferably used as a rinsing liquid in the rinsing step.

(Development Step)

The development step is a step of developing the exposed resist film with a developer.

Examples of the development method include a method of immersing the substrate in a tank filled with a developer for a certain period of time (dipping method), a method of heaping up a developer on a surface of the substrate by surface tension and left the developer to stand for a certain period of time (puddle method), a method of spraying a developer on a surface of the substrate (spray method), a method of continuously jetting a developer onto a substrate rotating at a constant speed from a developer jetting nozzle while scanning the substrate at a constant speed with the developer jetting nozzle (dynamic dispensing method), and the like.

In addition, after the development step, a step of stopping the development while replacing the solvent with another solvent may be performed.

The development time is preferably 10 to 300 seconds, and more preferably 20 to 120 seconds.

The temperature of the developer is preferably 0° C. to 50° C., and more preferably 15° C. to 35° C.

<<Developer>>

Hereinafter, the developer will be described.

The vapor pressure of the solvent used as the developer (overall vapor pressure in a case where the solvent is a mixed solvent) is preferably 5 kPa or less, more preferably 3 kPa or less, and even more preferably 2 kPa or less at 20° C. In a case where the vapor pressure of the solvent is 5 kPa or less, evaporation of the developer on the substrate or in the development cup is suppressed, and the temperature uniformity within the substrate surface is improved. As a result, dimensional uniformity within the substrate surface is improved.

Examples of the solvent used as the developer include the ester-based solvent, ketone-based solvent, alcohol-based solvent, amide-based solvent, ether-based solvent, hydrocarbon-based solvent, and the like that will be described later.

Particularly, as the developer, at least one solvent selected from the group consisting of a ketone-based solvent, an ester-based solvent, an alcohol-based solvent, and an ether-based solvent is preferable, an ester-based solvent is more preferable, and butyl acetate is even more preferable.

Examples of the ester-based solvent include methyl acetate, ethyl acetate, butyl acetate, isobutyl acetate, pentyl acetate, propyl acetate, isopropyl acetate, isopentyl acetate, 3-methylbutyl acetate, 2-methylbutyl acetate, 1-methylbutyl acetate, hexyl acetate, isohexyl acetate, heptyl acetate, octyl acetate, methoxyethyl acetate, ethoxyethyl acetate, propylene glycol monomethyl ether acetate (PGMEA; also known as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, and the like.

Among them, butyl acetate, pentyl acetate, isopentyl acetate, 2-methylbutyl acetate, 1-methylbutyl acetate, hexyl acetate, pentyl propionate, hexyl propionate, heptyl propionate, or butyl butanoate is preferable, and butyl acetate or isopentyl acetate is more preferable, and butyl acetate is still more preferable.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and the like.

Among them, 2-heptanone is preferable as the ketone-based solvent.

Examples of the alcohol-based solvent include monohydric alcohols such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, and 3-methoxy-1-butanol; glycol-based solvents such as ethylene glycol, diethylene glycol, and triethylene glycol; hydroxyl group-containing glycol ether-based solvents such as ethylene glycol monomethyl ether, propylene glycol monomethyl ether (PGME; also known as 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether; and the like.

Among these, glycol ether-based solvents are preferable as the alcohol-based solvent.

Examples of the ether-based solvent include the aforementioned hydroxyl group-containing glycol ether-based solvents, glycol ether-based solvents not containing a hydroxyl group, such as propylene glycol dimethyl ether, propylene glycol diethyl ether, diethylene glycol dimethyl ether, and diethylene glycol diethyl ether; aromatic ether solvents such as anisole and phenetole; dioxane, tetrahydrofuran, tetrahydropyrane, perfluoro-2-butyltetrahydrofuran, perfluorotetratetrahydrofuran, 1,4-dioxane, isopropyl ether, and the like.

Among these, glycol ether-based solvents or aromatic ether solvents such as anisole are preferable as the ether-based solvent.

Examples of the amide-based solvent include N-methyl-2-pyrrolidone, N,N-dimethylacetamide, N,N-dimethylformamide, hexamethylphosphorictriamide, 1,3-dimethyl-2-imidazolidinone, and the like.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane; aromatic hydrocarbon-based solvents such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene; and the like.

The hydrocarbon-based solvent may be an unsaturated hydrocarbon-based solvent.

Examples of the unsaturated hydrocarbon-based solvent include—unsaturated hydrocarbon-based solvents such as octene, nonene, decene, undecene, dodecene, and hexadecene.

The number of double bonds or triple bonds that the unsaturated hydrocarbon-based solvent has is not particularly limited, and the double bonds or triple bonds may be located at any position in the hydrocarbon chain. In addition, in a case where the unsaturated hydrocarbon-based solvent has a double bond, there may be both the cis-isomer and trans-isomer.

The aliphatic hydrocarbon-based solvent, which is a hydrocarbon-based solvent, may be a mixture of compounds having the same number of carbon atoms and different structures. For example, in a case where decane is used as the aliphatic hydrocarbon-based solvent, the aliphatic hydrocarbon-based solvent may contain 2-methylnonane, 2,2-dimethyloctane, 4-ethyloctane, isooctane, and the like which are compounds having the same number of carbon atoms and different structures.

The aliphatic hydrocarbon-based solvent may contain only one kind of compounds having the same number of carbon atoms and different structures or two or more kinds of such compounds as described above.

As the developer, an ester-based solvent having 6 or more (preferably 6 to 14, more preferably 6 to 12, and even more preferably 6 to 10) carbon atoms and 2 or less heteroatoms is preferable, because such an ester-based solvent can further suppress the swelling of a resist film in a case where EUV light and electron beams are used in the aforementioned exposure step. The heteroatoms may be any atom other than a carbon atom and a hydrogen atom, and examples, thereof include an oxygen atom, a nitrogen atom, a sulfur atom, and the like. The number of heteroatoms is preferably 2 or less.

Specifically, as the ester-based solvent having 6 or more carbon atoms and 2 or less heteroatoms, for example, at least one compound selected from the group consisting of butyl acetate, pentyl acetate, isopentyl acetate, 2-methylbutyl acetate, 1-methylbutyl acetate, hexyl acetate, pentyl propionate, hexyl propionate, heptyl propionate, butyl butanoate, butyl isobutanoate, and isobutyl isobutanoate is preferable, and isopentyl acetate or butyl isobutanoate is more preferable.

As the developer, in view of further suppressing the swelling of a resist film in a case where EUV light and electron beams are used in the aforementioned exposure step, instead of the aforementioned ester-based solvent having 6 or more carbon atoms and 2 or less heteroatoms, a mixed solvent of an ester-based solvent and a hydrocarbon-based solvent or a mixed solvent of a ketone-based solvent and a hydrocarbon-based solvent may be used.

In the aforementioned mixed solvent, the content of the hydrocarbon-based solvent is not particularly limited because it depends on the solubility of the resist film in a solvent. The mixed solvent may be appropriately prepared to determine the content required.

In the mixed solvent of an ester-based solvent and a hydrocarbon-based solvent, isopentyl acetate is preferable as the ester-based solvent. As the hydrocarbon-based solvent, in view of making it easy to adjust the solubility of the resist film, a saturated hydrocarbon-based solvent (for example, octane, nonane, decane, dodecane, undecane, hexadecane, or the like) is preferable.

In the mixed solvent of a ketone-based solvent and a hydrocarbon-based solvent, examples of the ketone-based solvent include 1-octanone, 2-octanone, 1-nonanone, 2-nonanone, acetone, 2-heptanone (methyl pentyl ketone), 4-heptanone, 1-hexanone, 2-hexanone, diisobutyl ketone, 2,5-dimethyl-4-hexanone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and the like. As the ketone-based solvent, among these, diisobutylketone or 2,5-dimethyl-4-hexanone is preferable.

As the aforementioned hydrocarbon-based solvent, in view of making it easy to adjust the solubility of the resist film, a saturated hydrocarbon-based solvent (for example, octane, nonane, decane, dodecane, undecane, hexadecane, or the like) is preferable.

A plurality of the aforementioned solvents may be mixed together. Alternatively, the aforementioned solvent may be mixed with a solvent other than the above solvents or with water. The total moisture content of the developer is preferably less than 50% by mass, more preferably less than 20% by mass, and even more preferably less than 10% by mass. It is particularly preferable that the developer substantially do not contain water.

The content of the solvent with respect to the total mass of the organic developer is preferably 50% to 100% by mass, more preferably 80% to 100% by mass, even more preferably 90% to 100% by mass, and particularly preferably 95% to 100% by mass.

As necessary, the developer may contain an appropriate amount of a known surfactant.

The content of the surfactant with respect to the total mass of the developer is preferably 0.001% to 5% by mass, more preferably 0.005% to 2% by mass, and even more preferably 0.01% to 0.5% by mass.

The developer may contain a basic compound. Specific examples of the basic compound include an acid diffusion control agent contained in the resist composition that will be described later.

As the solvent used as the developer, in addition to the aforementioned ester-based solvent, a solvent represented by General Formula (S1) or General Formula (S2) is also preferable.

As the ester-based solvent, a solvent represented by General Formula (S1) is more preferable, alkyl acetate is even more preferable, and butyl acetate, pentyl acetate, or isopentyl acetate is particularly preferable.

$$R—C(=O)—O—R' \qquad \text{General Formula (S1)}$$

In General Formula (S1), R and R' each independently represent a hydrogen atom, an alkyl group, a cycloalkyl group, an alkoxyl group, an alkoxycarbonyl group, a carboxyl group, a hydroxyl group, a cyano group, or a halogen atom. R and R' may be bonded to each other to form a ring.

The alkyl group, alkoxyl group, and alkoxycarbonyl group represented by R and R' preferably has 1 to 15 carbon atoms, and the cycloalkyl group preferably has 3 to 15 carbon atoms.

The alkyl group, cycloalkyl group, alkoxyl group, and alkoxycarbonyl group represented by R and R' and the ring formed of R and R' bonded to each other may have a substituent. The substituent is not particularly limited, and examples thereof include a hydroxyl group, a carbonyl group-containing group (for example, an acyl group, an aldehyde group, an alkoxycarbonyl group, and the like), a cyano group, and the like.

As R and R', among the above, a hydrogen atom or an alkyl group is preferable.

Examples of the solvent represented by General Formula (S1) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, and the like.

As the solvent represented by General Formula (S1), among the above, alkyl acetate is preferable, butyl acetate, pentyl acetate, or isopentyl acetate is more preferable, and isopentyl acetate is even more preferable.

In a case where the developer contains a solvent represented by General Formula (S1), the developer may further contain one or more other solvents (hereinafter, also called "solvent for concurrent use"). The solvent for concurrent use is not particularly limited as long as it can be mixed with the solvent represented by General Formula (S1) without being separated. Examples of the solvent for concurrent use include at least one solvent that is other than the solvent represented by General Formula (S1) and selected from the group consisting of an ester-based solvent, a ketone-based solvent, an alcohol-based solvent, an amide-based solvent, an ether-based solvent, and a hydrocarbon-based solvent.

One solvent for concurrent use or two or more solvents for concurrent use may be used. In order to obtain stable performance, it is preferable to use one solvent for concurrent use.

In a case where the developer is a mixed solvent of the solvent represented by General Formula (S1) and one solvent for concurrent use, the mass ratio of the content of the solvent represented by General Formula (S1) to the solvent for concurrent use [mass of solvent represented by General Formula (S1) contained in developer/mass of solvent for concurrent use contained in developer] is usually 20/80 to 99/1, preferably 50/50 to 97/3, more preferably 60/40 to 95/5, and even more preferably 60/40 to 90/10.

As the solvent used as the developer, a solvent represented by General Formula (S2) is also preferable.

R''—C(=O)—O—R'''—O—R'''' General Formula (S2)

In General Formula (S2), R'' and R'''' each independently represent a hydrogen atom, an alkyl group, a cycloalkyl group, an alkoxyl group, an alkoxycarbonyl group, a carboxyl group, a hydroxyl group, a cyano group, or a halogen atom. R'' and R'''' may be bonded to each other to form a ring.

As R'' and R'''', a hydrogen atom or an alkyl group is preferable.

The alkyl group, alkoxyl group, and alkoxycarbonyl group represented by R'' and R'''' preferably has 1 to 15 carbon atoms, and the cycloalkyl group preferably has 3 to 15 carbon atoms.

R''' represents an alkylene group or a cycloalkylene group. R''' is preferably an alkylene group.

The number of carbon atoms in the alkylene group represented by R''' is preferably 1 to 10, and the number of carbon atoms in the cycloalkylene group represented by R''' is preferably 3 to 10.

The alkylene group represented by R''' may have an ether bond in an alkylene chain.

The alkyl group, cycloalkyl group, alkoxyl group, and alkoxycarbonyl group represented by R'' and R'''', the alkylene group and cycloalkylene group represented by R''', and the ring formed of R'' and R'''' bonded to each other may have a substituent. The substituent is not particularly limited, and examples thereof include a hydroxyl group, a carbonyl group-containing group (for example, an acyl group, an aldehyde group, an alkoxycarbonyl, and the like), a cyano group, and the like.

Examples of the solvent represented by General Formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, methoxyethyl acetate, ethoxyethyl acetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, and the like. As the solvent represented by General Formula (S2), among the above, propylene glycol monomethyl ether acetate is preferable.

The solvent represented by General Formula (S2) is preferable a compound in which R'' and R'''' are unsubstituted alkyl groups and R''' is an unsubstituted alkylene group, more preferably a compound in which R'' and R'''' are methyl groups or ethyl groups, and even more preferably a compound in which R'' and R'''' are methyl groups.

In a case where the developer contains a solvent represented by General Formula (S2), the developer may further contain one or more solvents for concurrent use. The solvent for concurrent use is not particularly limited as long as it can be mixed with the solvent represented by General Formula (S2) without being separated. Examples of the solvent for concurrent use include a solvent that is other than the solvent represented by General Formula (S2) and selected from the group consisting of an ester-based solvent, a ketone-based solvent, an alcohol-based solvent, an amide-based solvent, an ether-based solvent, and a hydrocarbon-based solvent.

One solvent for concurrent use or two or more solvents for concurrent use may be used. In order to obtain stable performance, it is preferable to use one solvent for concurrent use.

In a case where the developer is a mixed solvent of the solvent represented by General Formula (S2) and one solvent for concurrent use, the mass ratio of the content of the solvent represented by General Formula (S2) to the solvent for concurrent use [mass of solvent represented by General Formula (S2) contained in developer/mass of solvent for concurrent use contained in developer] is usually 20/80 to 99/1, preferably 50/50 to 97/3, more preferably 60/40 to 95/5, and even more preferably 60/40 to 90/10.

As the solvent used as the developer, an ether-based solvent containing one or more aromatic rings is also preferable, a solvent represented by General Formula (S3) is more preferable, and anisole is even more preferable.

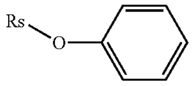

(S3)

In General Formula (S3), $R_s$ represents an alkyl group.

The alkyl group is preferably an alkyl group having 1 to 4 carbon atoms, more preferably a methyl group or an ethyl group, and even more preferably a methyl group.

As the developer, a water-based alkali developer may also be used.

(Rinsing Step)

The rinsing step is a step of performing rinsing with the rinsing liquid according to the embodiment of the present invention after the development step.

In the rinsing step, the developed substrate is rinsed using the rinsing liquid according to the embodiment of the present invention.

In view of further improving the effect of the present invention, it is preferable to perform development by using butyl acetate as a developer and then perform rinsing by using the rinsing liquid according to the embodiment of the present invention.

The method of rinsing treatment is not particularly limited. For example, it is possible to use a method of continuously jetting the rinsing liquid onto the substrate rotating at a constant speed (rotary jetting method), a method of immersing the substrate in a tank filled with the rinsing liquid for a certain period of time (dipping method), a method of spraying the rinsing liquid on the surface of the substrate (spray method), and the like.

Particularly, it is preferable to perform the rinsing treatment by the rotary jetting method and then rotate the rinsed substrate at a rotation speed of 2,000 to 4,000 rpm such that rinsing liquid is removed from the substrate.

The rinsing time is preferably 10 to 300 seconds, more preferably 10 to 180 seconds, and even more preferably 20 to 120 seconds.

The temperature of the rinsing liquid is preferably 0° C. to 50° C., and more preferably 15° C. to 35° C.

After the development treatment or the rinsing treatment, it is possible to perform a treatment of removing the developer or rinsing liquid having adhered to the pattern by using a supercritical fluid.

Furthermore, after the development treatment, the rinsing treatment, or the treatment with a supercritical fluid, a drying treatment may be performed to remove the solvent remaining in the pattern.

The drying temperature is preferably 40° C. to 160° C., more preferably 50° C. to 150° C., and even more preferably 50° C. to 110° C.

The drying time is preferably 15 to 300 seconds, and more preferably 15 to 180 seconds.

In the pattern forming method according to the embodiment of the present invention, the rinsing liquid according to the embodiment of the present invention is used as a rinsing liquid.

For example, in a case where an ester-based solvent is used as the developer in the development step and the rinsing liquid according to the embodiment of the present invention is used as the rinsing liquid in the rinsing step to form a pattern, it is preferable that the developer and the rinsing liquid be supplied at an interval of 1 second or longer to the exposed resist film. Supplying the developer and the rinsing liquid at least at a certain time interval makes it possible to suppress the deterioration of solubility of a non-exposed region of the exposed resist film and to suppress an increase in defects resulting from solvent shock.

Generally, after used, the developer and the rinsing liquid are stored in a common waste liquid tank through a pipe. In that instance, in a case where an ester-based solvent is used as the developer in the development step and the rinsing liquid according to the embodiment of the present invention is used as the rinsing liquid in the rinsing step, the resist dissolved in the developer is precipitated and adheres to the rear surface of the substrate, the lateral surface of the pipe, and the like, which leads to a concern that the device may be contaminated.

As a solution to the above problem, there is a method of passing the solvent, in which the resist dissolves, through the pipe again. Examples of the method of passing the solvent through the pipe include a method of washing down the, rear surface, lateral surface, and the like of the substrate rinsed with the rinsing liquid by using a solvent that dissolves the resist, and a method of letting a solvent that dissolves the resist to flow through the pipe without bringing the solvent into contact with the resist.

The solvent to be passed through the pipe is not particularly limited as long as it can dissolve the resist, and examples thereof include a solvent used as the developer described above. Specifically, examples of such a solvent include propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, acetone, and the like.

As the solvent to be passed through the pipe, among the above, PGMEA, PGME, or cyclohexanone is preferable.

Examples of other methods as solutions to the above problem include a method of adjusting the mass ratio between the developer and the rinsing liquid to flow in the pipe after use to a mass ratio that will not cause the precipitation of the resist, such that the resist is prevented from being precipitated in the waste liquid to flow into the waste liquid tank through the pipe after use, and a method of mixing the developer and the rinsing liquid to flow in the pipe after use with a solvent in which the resist exhibits high solubility.

It is preferable that the developer and the rinsing liquid be stored in separate waste liquid tanks after use.

For example, in a case where a pattern is formed using an ester-based solvent as the developer in the development step and using the rinsing liquid according to the embodiment of the present invention as the rinsing liquid in the rinsing step, and the developer and the rinsing liquid are stored in a common waste liquid tank through the pipe after use, the component of the resist composition, such as a resin, dissolved in the developer is precipitated (deposited as sediment or solidifies), which can cause contamination of the device.

Specifically, the precipitated component clogs the waste liquid pipe and contaminate the inside of the treatment chamber. In order to solve the above problems, it is preferable that the developer and the rinsing liquid be stored in separate waste liquid tanks after use by pipe switching or by treatment chamber switching.

[Resist Composition]

Next, the resist composition to be used in combination with the rinsing liquid according to the embodiment of the present invention may be, for example, a so-called chemically amplified resist composition that contains a resin, a photo acid generator, and/or an acid diffusion control agent or the like, a molecular resist composition that contains a low-molecular-weight phenol compound instead of a resin, a metal resist composition that contains a metal oxide-based compound, or a main chain cleavage-type resist composition that turns into a low-molecular-weight composition by the cleavage of a polymer main chain due to exposure.

The resist composition may be a negative tone resist composition or a positive tone resist composition.

Hereinafter, a chemically amplified resist composition, which is a form of resist composition that can be used in combination with the rinsing liquid according to the embodiment of the present invention, will be specifically described.

Hereinafter, the chemically amplified resist composition will be also simply called a resist composition.

<Resin (A)>

The resist composition contains a resin that experiences an increase in polarity by being decomposed due to the action of an acid (hereinafter, also called "acid-decomposable resin" or "resin (A)").

That is, in the pattern forming method, typically, a positive tone pattern is suitably formed in a case where an alkali developer is adopted as a developer, and a negative tone pattern is suitably formed in a case where an organic developer is adopted as a developer. The resin (A) usually contains a group that experiences an increase in polarity by being decomposed due to the action of an acid (hereinafter, also called "acid-decomposable group"). The resin (A) preferably contains a repeating unit having an acid-decomposable group.

<<Repeating Unit Having Acid-Decomposable Group>>

The acid-decomposable group refers to a group which is decomposed by the action of an acid and generates a polar group. The acid-decomposable group preferably has a structure in which a polar group is protected by a leaving group that is dissociated by the action of an acid. That is, the resin (A) has a repeating unit having a group that is decomposed by the action of an acid and generates a polar group. The polarity of the resin having such a repeating unit increases by the action of an acid, which increases the solubility of the resin in an alkali developer and decreases the solubility of the resin in a solvent.

As the polar group, an alkali-soluble group is preferable. Examples thereof include acidic groups such as a carboxyl group, a phenolic hydroxyl group, a fluorinated alcohol group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, an alcoholic hydroxyl group, and the like.

As the polar group, among these, a carboxyl group, a phenolic hydroxyl group, a fluorinated alcohol group (preferably a hexafluoroisopropanol group), or a sulfonic acid group is preferable.

Examples of the leaving group dissociated by the action of an acid include groups represented by formulae (Y1) to (Y4).

$-C(Rx_1)(Rx_2)(Rx_3)$ Formula (Y1):

$-C(=O)OC(Rx_1)(Rx_2)(Rx_3)$ Formula (Y2):

$-C(R_{36})(R_{37})(OR_{38})$ Formula (Y3):

$-C(Rn)(H)(Ar)$ Formula (Y4):

In Formula (Y1) and Formula (Y2), $Rx_1$ to $Rx_3$ each independently represent an alkyl group (linear or branched), a cycloalkyl group (monocyclic or polycyclic), an alkenyl group (linear or branched), or an aryl group (monocyclic or polycyclic). In a case where $Rx_1$ to $Rx_3$ all represent an alkyl group (linear or branched), at least two out of $Rx_1$ to $Rx_3$ preferably represent a methyl group.

Particularly, $Rx_1$ to $Rx_3$ preferably each independently represent a linear or branched alkyl group, and more preferably each independently represent a linear alkyl group.

Two out of $Rx_1$ to $Rx_3$ may be bonded to each other to form a monocyclic or polycyclic ring.

The alkyl group represented by $Rx_1$ to $Rx_3$ is preferably an alkyl group having 1 to 5 carbon atoms, such as a methyl group, an ethyl group, a n-propyl group, an isopropyl group, a n-butyl group, an isobutyl group, or a t-butyl group.

The cycloalkyl group represented by $Rx_1$ to $Rx_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The aryl group as $Rx_1$ to $Rx_3$ is preferably an aryl group having 6 to 10 carbon atoms, and examples thereof include a phenyl group, a naphthyl group, an anthryl group, and the like.

The alkenyl group as $Rx_1$ to $Rx_3$ is preferably a vinyl group.

A cycloalkyl group is preferable as a ring formed by the bonding of two out of $Rx_1$ to $Rx_3$. As the cycloalkyl group formed by the bonding of two out of $Rx_1$ to $Rx_3$, a monocyclic cycloalkyl group such as a cyclopentyl group or a cyclohexyl group and a polycyclic cycloalkyl group such as a norbornyl group, a tetracyclodecanyl group, a tetracyclododecanyl group, or an adamantyl group are preferable, and a monocyclic cycloalkyl group having 5 or 6 carbon atoms is more preferable.

In the cycloalkyl group formed by the bonding of two out of $Rx_1$ to $Rx_3$, for example, one methylene group constituting the ring may be substituted with a heteroatom such as an oxygen atom, a group having a heteroatom such as a carbonyl group, or a vinylidene group. In addition, in these cycloalkyl group, one or more of the ethylene groups constituting the cycloalkane ring may be substituted with a vinylene group.

As the group represented by Formula (Y1) or Formula (Y2), for example, an aspect is preferable in which-$Rx_1$ is a methyl group or an ethyl group, and $Rx_2$ and $Rx_3$ are bonded to each other to form the aforementioned cycloalkyl group.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, an alkenyl group, and the like. $R_{36}$ is preferably a hydrogen atom.

The alkyl group, cycloalkyl group, aryl group, and aralkyl group described above may contain a heteroatom such as an oxygen atom and/or a group having a heteroatom such as a carbonyl group. For example, in the alkyl group, cycloalkyl group, aryl group, and aralkyl group described above, for example, one or more methylene groups may be substituted with a heteroatom such as an oxygen atom and/or a group having a heteroatom such as a carbonyl group.

$R_{38}$ may be bonded to another substituent of the main chain of the repeating unit to form a ring. The group formed by the bonding of $R_{38}$ to another substituent of the main chain of the repeating unit is preferably an alkylene group such as a methylene group.

As Formula (Y3), a group represented by Formula (Y3-1) is preferable.

(Y3-1)

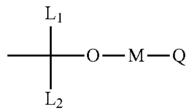

$L_1$ and $L_2$ each independently represent a hydrogen atom, an alkyl group, a cycloalkyl group, an aryl group, or a group consisting of a combination of these (for example, a group consisting of a combination of an alkyl group and an aryl group).

M represents a single bond or a divalent linking group.

Q represents an alkyl group which may contain a heteroatom, a cycloalkyl group which may contain a heteroatom, an aryl group which may contain a heteroatom, an amino group, an ammonium group, a mercapto group, a cyano group, an aldehyde group, or a group consisting of a combination of these (for example, a group consisting of a combination of an alkyl group and a cycloalkyl group).

In the alkyl group and the cycloalkyl group, for example, one methylene group may be substituted with a heteroatom such as an oxygen atom or with a group having a heteroatom such as a carbonyl group.

It is preferable that one of $L_1$ and $L_2$ be a hydrogen atom and the other be an alkyl group, a cycloalkyl group, an aryl group, or a group consisting of a combination of an alkylene group and an aryl group.

At least two out of Q, M, and $L_1$ may be bonded to each other to form a ring (preferably a 5- or 6-membered ring).

In view of pattern miniaturization, $L_2$ is preferably a secondary or tertiary alkyl group, and more preferably a tertiary alkyl group. Examples of the secondary alkyl group include an isopropyl group, a cyclohexyl group, and a norbornyl group. Examples of the tertiary alkyl group include a tert-butyl group and an adamantane group. In these aspects, glass transition temperature (Tg) and activation energy are increased. Therefore, film hardness is ensured, and fogging can be suppressed.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

In a leaving group protecting a polar group, in a case where a non-aromatic ring is directly bonded to the polar group (or a residue thereof), in view of allowing the repeating unit to excellently decompose by an acid, it is also preferable that a ring member atom adjacent to a ring member atom directly bonded to the polar group (or a residue thereof) in the non-aromatic ring do not have a halogen atom such as a fluorine atom as a substituent.

The leaving group that dissociates by the action of an acid may also be a 2-cyclopentenyl group having a substituent (an alkyl group or the like), such as a 3-methyl-2-cyclopentenyl group, and a cyclohexyl group having a substituent (an alkyl group or the like), such as a 1,1,4,4-tetramethylcyclohexyl group.

The repeating unit having an acid-decomposable group is also preferably a repeating unit represented by Formula (A).

(A)

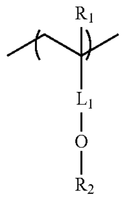

$L_1$ represents a divalent linking group which may have a fluorine atom or an iodine atom. $R_1$ represents a hydrogen atom, a fluorine atom, an iodine atom, an alkyl group which may have a fluorine atom or an iodine atom, or an aryl group which may have a fluorine atom or an iodine atom. $R_2$ represents leaving group which is dissociated by the action of an acid and may have a fluorine atom or an iodine atom. Here, at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, an arylene group, or the like), a linking group consisting of a plurality of these groups linked to each other, and the like. As $L_1$, among these, —CO— or -arylene group-alkylene group having a fluorine atom or an iodine atom is preferable.

As the arylene group, a phenylene group is preferable.

The alkylene group may be linear or branched. The number of carbon atoms in the alkylene group is not particularly limited, but is preferably 1 to 10 and more preferably 1 to 3. The total number of fluorine atoms and iodine atoms contained in the alkylene group having a fluorine atom or an iodine atom is not particularly limited, but is preferably 2 or more, more preferably 2 to 10, and even more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms in the alkyl group is not particularly limited, but is preferably 1 to 10 and more preferably 1 to 3.

The total number of fluorine atoms and iodine atoms contained in the alkyl group having a fluorine atom or an iodine atom is not particularly limited, but is preferably 1 or more, more preferably 1 to 5, and even more preferably 1 to 3.

The alkyl group may contain a heteroatom such as an oxygen atom other than halogen atoms.

$R_2$ represents a leaving group which is dissociated by the action of an acid and may have a fluorine atom or an iodine atom.

Examples of the leaving group include groups represented by formulae (Z1) to (Z4).

$-C(Rx_{11})(Rx_{12})(Rx_{13})$ Formula (Z1):

$-C(=O)OC(Rx_{11})(Rx_{12})(Rx_{13})$ Formula (Z2):

$-C(R_{136})(R_{137})(OR_{138})$ Formula (Z3):

$-C(Rn_1)(H)(Ar_1)$ Formula (Z4):

In formulae (Z1) and (Z2), $Rx_{11}$ to $Rx_{13}$ each independently represent an alkyl group (linear or branched) which may have a fluorine atom or an iodine atom, a cycloalkyl group (monocyclic or polycyclic) which may have a fluorine atom or an iodine atom, an alkenyl group (linear or branched) which may have a fluorine atom or an iodine atom, or an aryl group (monocyclic or polycyclic) which may have a fluorine atom or an iodine atom. In a case where $Rx_{11}$ to $Rx_{13}$ all represent an alkyl group (linear or branched), at least two out of $Rx_{11}$ to $Rx_{13}$ preferably represent a methyl group.

$Rx_{11}$ to $Rx_{13}$ are the same as $Rx_1$ to $Rx_3$ in Formula (Y1) and Formula (Y2) described above, except that $Rx_{11}$ to $Rx_{13}$ may have a fluorine atom or an iodine atom. The definitions and suitable ranges of the alkyl group, cycloalkyl group, alkenyl group, and aryl group represented by $Rx_{11}$ to $Rx_{13}$ are the same as those of the alkyl group, cycloalkyl group, alkenyl group, and aryl group represented by represented by $Rx_1$ to $Rx_3$.

In Formula (Z3), $R_{136}$ to $R_{138}$ each independently represent a hydrogen atom or a monovalent organic group which may have a fluorine atom or an iodine atom. $R_{137}$ and $R_{138}$ may be bonded to each other to form a ring. Examples of the monovalent of ganic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group consisting of a combination of these (for example, a group consisting of a combination of an alkyl group and a cycloalkyl group).

The alkyl group, cycloalkyl group, aryl group, and aralkyl group described above may contain a heteroatom such as an oxygen atom in addition to a fluorine atom and an iodine atom. That is, in the alkyl group, cycloalkyl group, aryl group, and aralkyl group described above, for example, one methylene group may be substituted with a heteroatom such as an oxygen atom or a group having a heteroatom such as a carbonyl group.

$R_{138}$ may be bonded to another substituent of the main chain of the repeating unit to form a ring. In this case, the group formed by the bonding of $R_{138}$ to another substituent of the main chain of the repeating unit is preferably an alkylene group such as a methylene group.

As Formula (Z3), a group represented by Formula (Z3-1) is preferable.

(Z3-1)

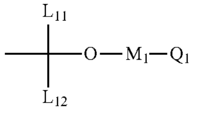

$L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group consisting of a combination of these (for example, a group consisting of a combination of an alkyl group and a cycloalkyl group which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; or a group consisting of a combination these (for example, a group consisting of a combination of an alkyl group and a cycloalkyl group which may have a heteroatom selected from the group consisting of a fluorine atom, an iodine atom, and an oxygen atom).

In Formula (Z4), Ar represents an aromatic ring group which may have a fluorine atom or an iodine atom. $Rn_1$ represents an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

The repeating unit having an acid-decomposable group is also preferably a repeating unit represented by General Formula (AI).

(AI)

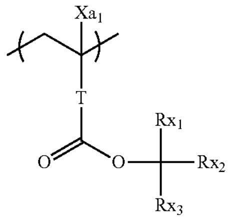

In General Formula (AI), $Xa_1$ represents a hydrogen atom or an alkyl group which may have a substituent.

T represents a single bond or a divalent linking group.

$Rx_1$ to $Rx_3$ each independently represent an alkyl group (linear or branched), a cycloalkyl group (monocyclic or polycyclic), an alkenyl group (linear or branched), or an aryl group (monocyclic or polycyclic). In a case where $Rx_1$ to $Rx_3$ all represent an alkyl group (linear or branched), at least two out of $Rx_1$ to $Rx_3$ preferably represent a methyl group.

Two out of $Rx_1$ to $Rx_3$ may be bonded to each other to form a monocyclic or polycyclic ring (such as a monocyclic or polycyclic cycloalkyl group).

Examples of the alkyl group which is represented by $Xa_{11}$ and may have a substituent include a methyl group and a group represented by $-CH_2-R_{11}$. $R_{11}$ represents a halogen atom (such as a fluorine atom), a hydroxyl group, or a monovalent organic group. Examples of $R_{11}$ include an alkyl group having 5 or less carbon atoms which may be substituted with a halogen atom, an acyl group having 5 or less carbon atoms which may be substituted with a halogen atom, and an alkoxy group having 5 or less carbon atoms which may be substituted with a halogen atom. Among these, an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group represented by T include an alkylene group, an aromatic ring group, a —COO-Rt- group, a —O-Rt- group, and the like. In the formulae, Rt represents an alkylene group or a cycloalkylene group.

T is preferably a single bond or a —COO-Rt- group. In a case where T represents a —COO-Rt- group, Rt is preferably an alkylene group having 1 to 5 carbon atoms, and more preferably a $—CH_2—$ group, a $—(CH_2)_2—$ group, or a $—(CH_2)_3—$ group.

The alkyl group represented by $Rx_1$ to $Rx_3$ is preferably an alkyl group having 1 to 4 carbon atoms, such as a methyl group, an ethyl group, a n-propyl group, an isopropyl group, a n-butyl group, an isobutyl group, or a t-butyl group.

The cycloalkyl group represented by $Rx_1$ to $Rx_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The aryl group as $Rx_1$ to $Rx_3$ is preferably an aryl group having 6 to 10 carbon atoms, and examples thereof include a phenyl group, a naphthyl group, an anthryl group, and the like.

The alkenyl group as $Rx_1$ to $Rx_3$ is preferably a vinyl group.

The cycloalkyl group formed by the bonding of two out of $Rx_1$ to $Rx_3$ is preferably a monocyclic cycloalkyl group such as a cyclopentyl group or a cyclohexyl group. In addition, a polycyclic cycloalkyl group such as a norbornyl group, a tetracyclodecanyl group, a tetracyclododecanyl group, or an adamantyl group is also preferable. Among these, a monocyclic cycloalkyl group having 5 or 6 carbon atoms is preferable.

In the cycloalkyl group formed by the bonding of two out of $Rx_1$ to $Rx_3$, for example, one methylene group constituting the ring may be substituted with a heteroatom such as an oxygen atom, a group having a heteroatom such as a carbonyl group, or a vinylidene group. In addition, in these cycloalkyl group, one or more of the ethylene groups constituting the cycloalkane ring may be substituted with a vinylene group.

As the repeating unit represented by General Formula (AI), for example, an aspect is preferable in which $Rx_1$ is a methyl group or an ethyl group, and $Rx_2$ and $Rx_3$ are bonded to each other to form the aforementioned cycloalkyl group.

In a case where each of the above groups has a substituent, examples of the substituent include an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and the like. The number of carbon atoms in the substituent is preferably 8 or less.

As the repeating unit represented by General Formula (AI), an acid-decomposable (meth)acrylic acid tertiary alkyl ester-based repeating unit is preferable (a repeating unit in which $Xa_1$ represents a hydrogen atom or a methyl group, and T represents a single bond).

The content of the repeating unit having an acid-decomposable group with respect to the total content of repeating units in the resin (A) is preferably 15 mol % or more, more preferably 20 mol % or more, even more preferably 25 mol % or more, and particularly preferably 30 mol % or more. The upper limit thereof is not particularly limited, but is preferably 90 mol % or less, more preferably 80 mol % or less, and even more preferably 70 mol %.

Specific examples of the repeating unit having an acid-decomposable group will be shown below, but the present invention is not limited thereto. In the formulae, $Xa_1$ represents any of H, $CH_3$, $CF_3$, or $CH_2OH$, and Rxa and Rxb each represent a linear or branched alkyl group having 1 to 5 carbon atoms.

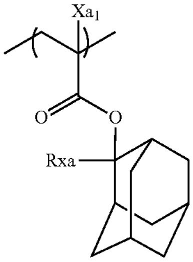

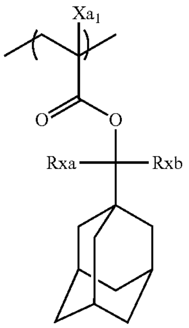

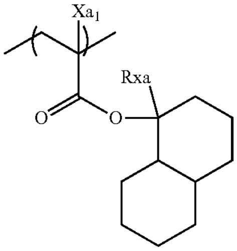

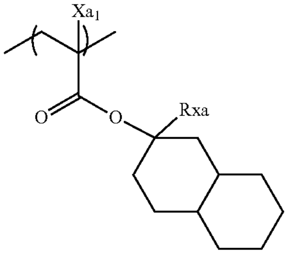

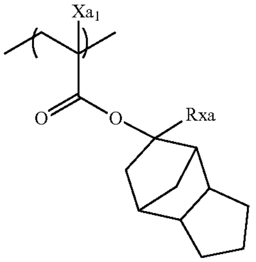

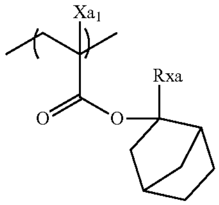

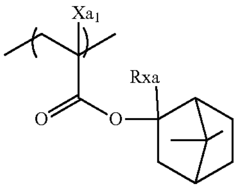

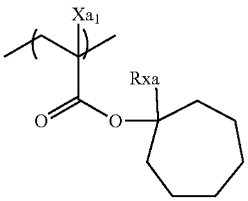

-continued
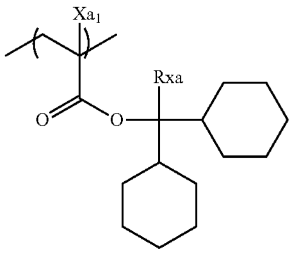
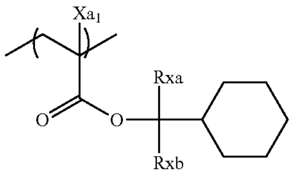
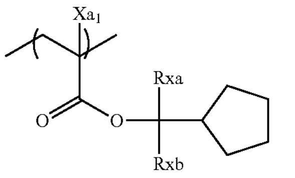
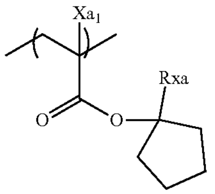
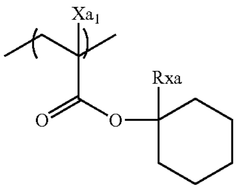
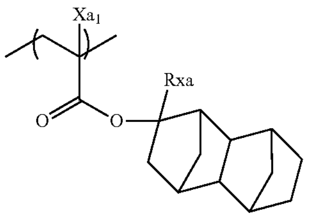
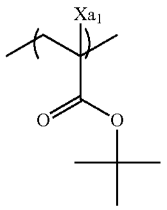
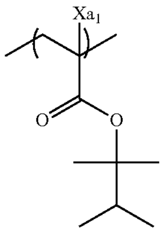
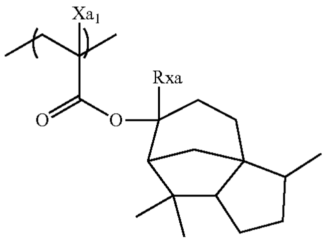
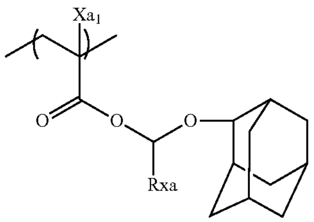
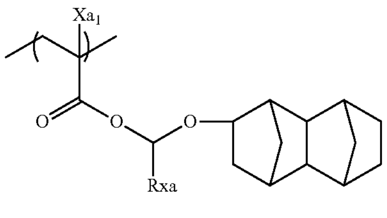
-continued
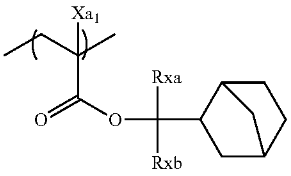
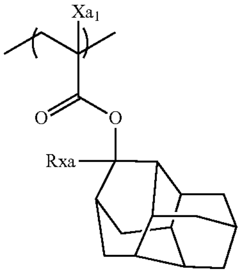
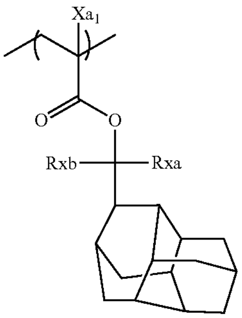
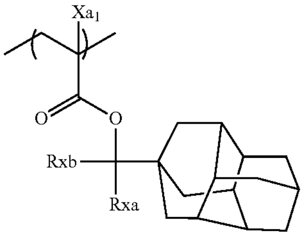
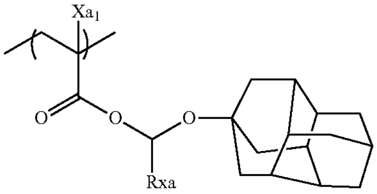
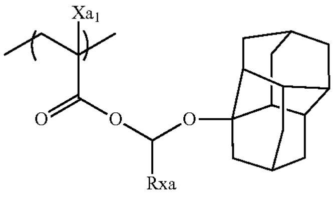
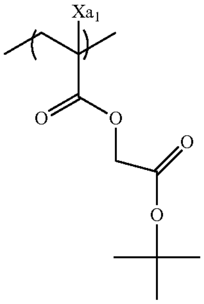
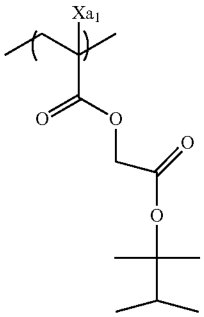

-continued
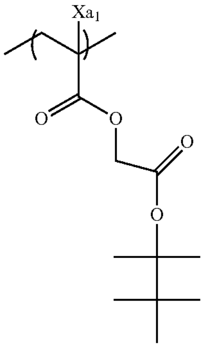
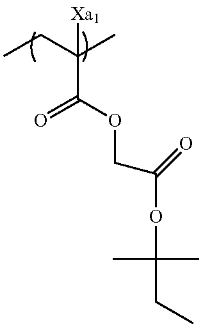
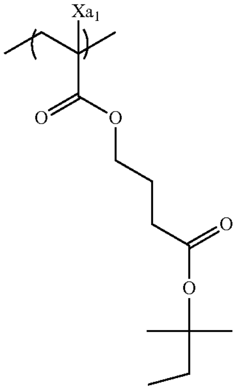
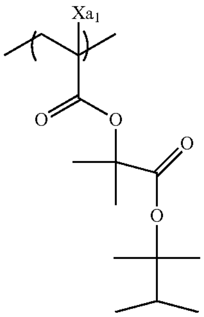
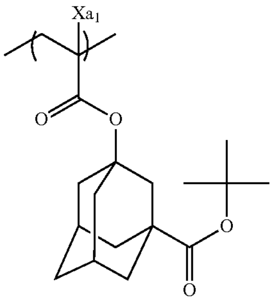
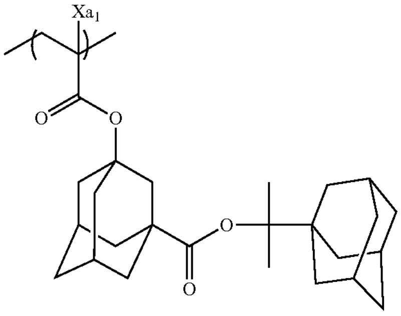
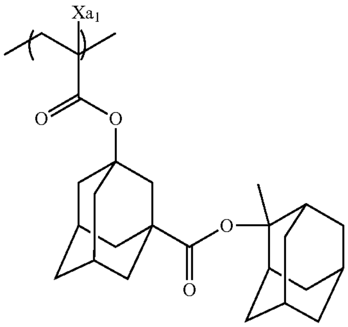
-continued
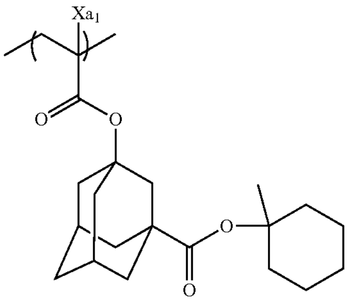
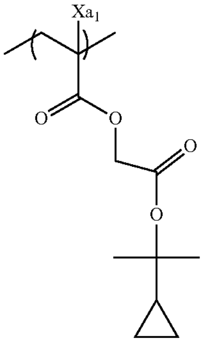
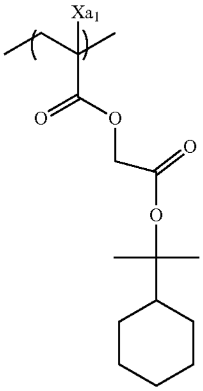
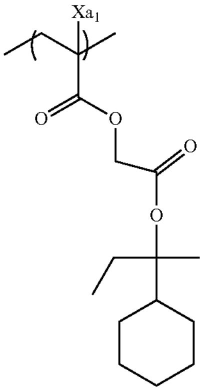
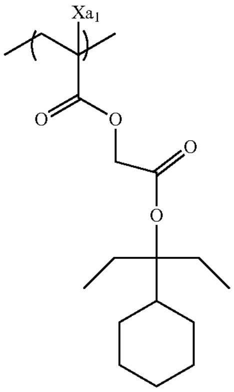
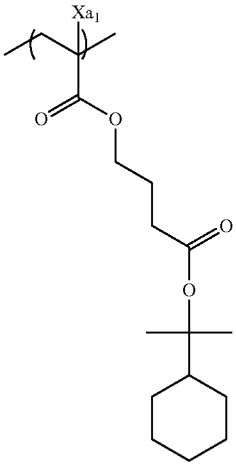
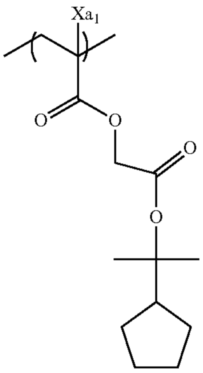

-continued
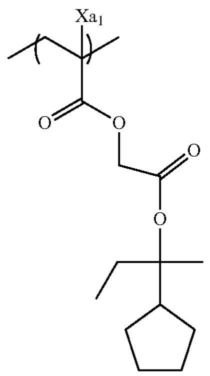
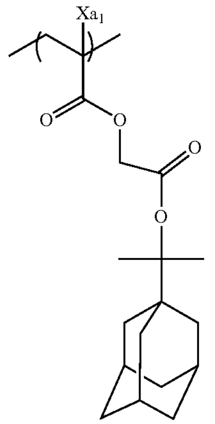
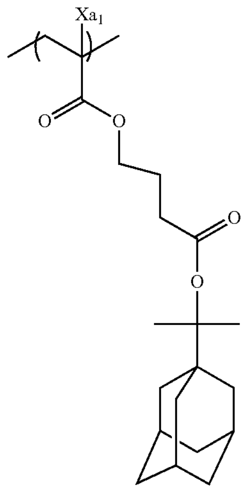
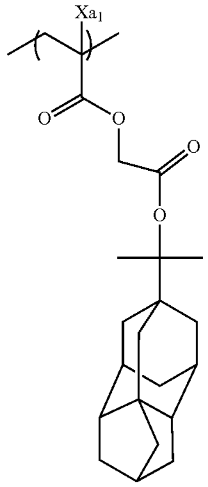
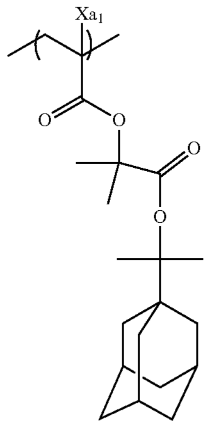
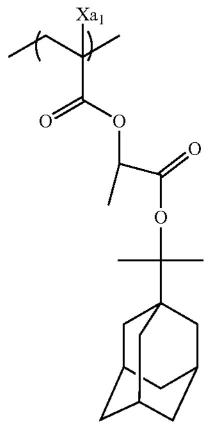
-continued
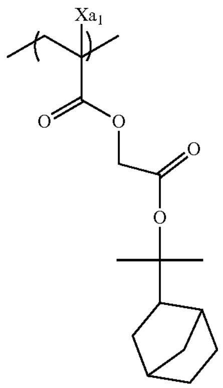
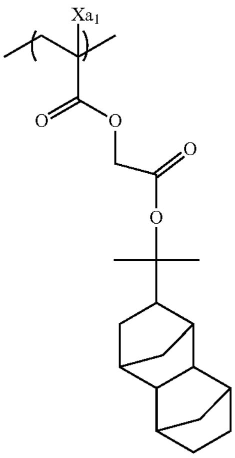
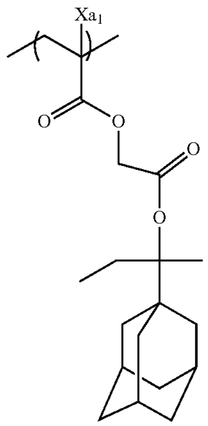
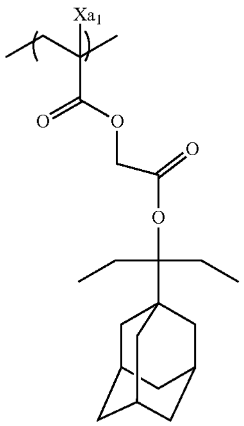
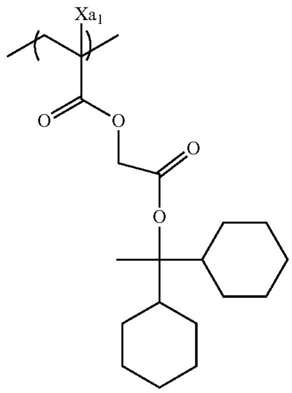
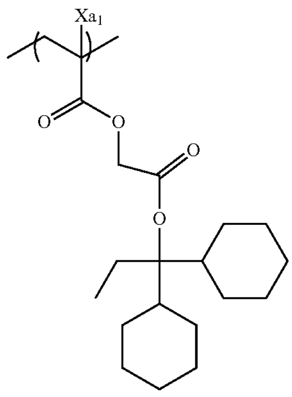

-continued
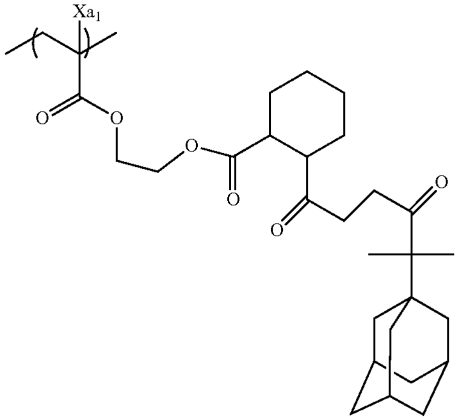
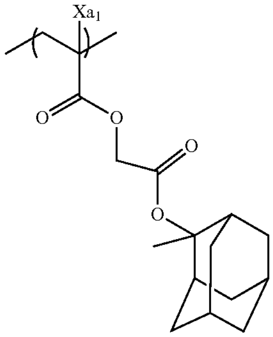
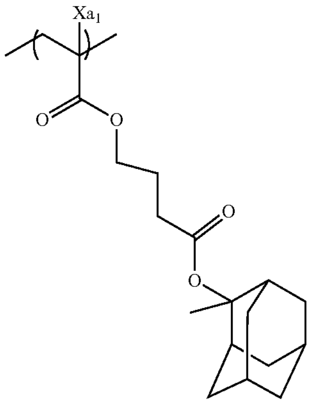
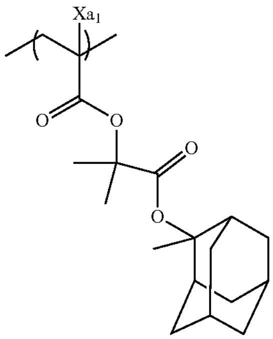
-continued
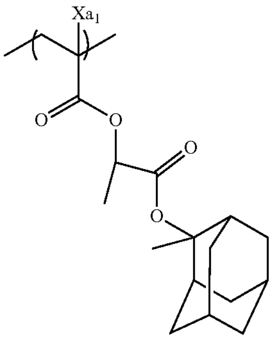
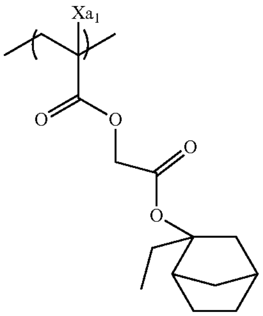
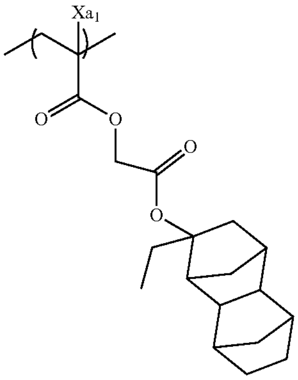
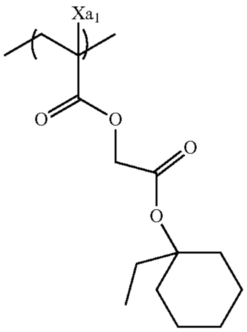
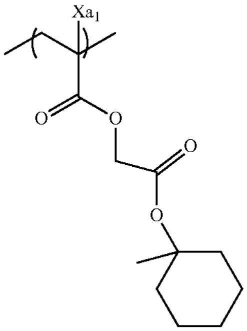
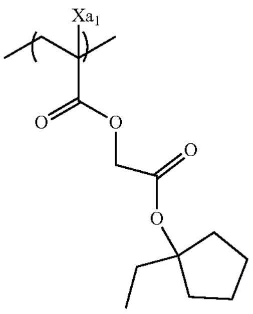
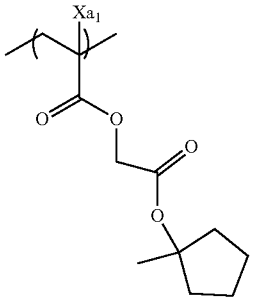

-continued
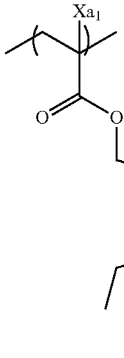
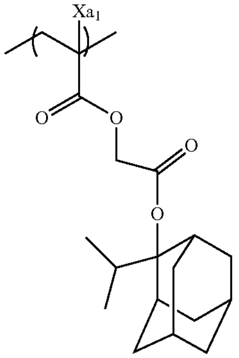
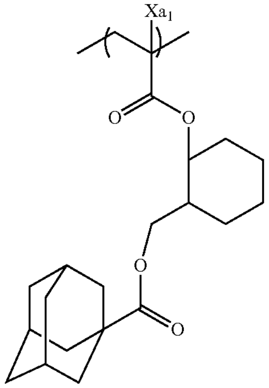
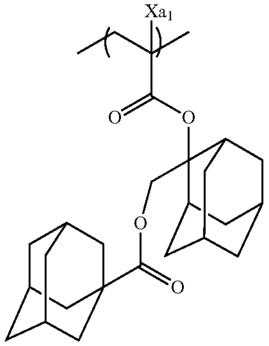
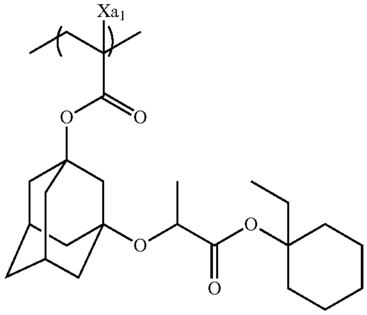
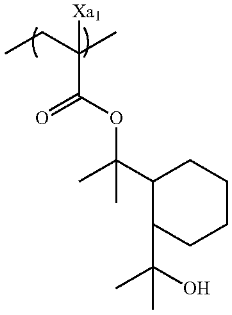
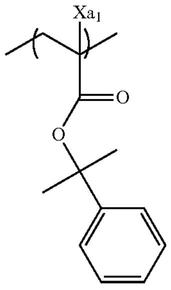
-continued
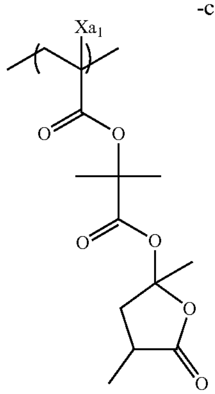
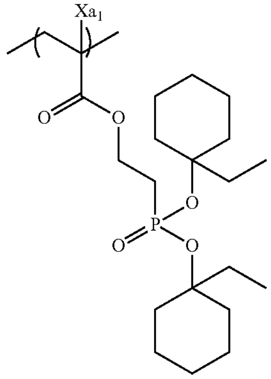
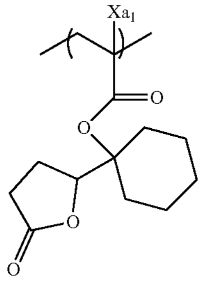
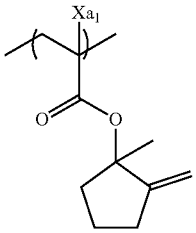
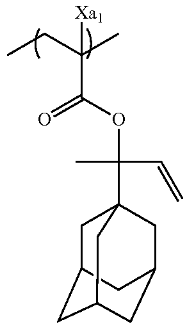
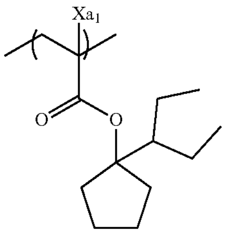
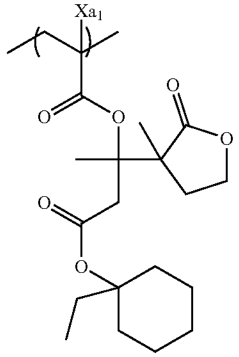
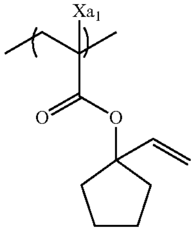

-continued

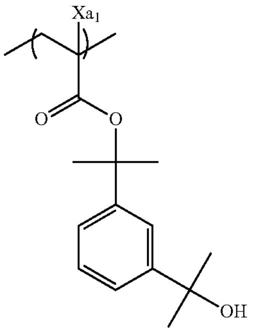

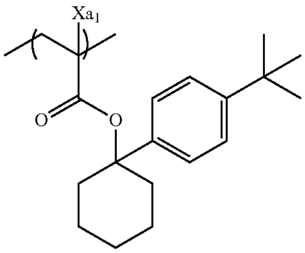

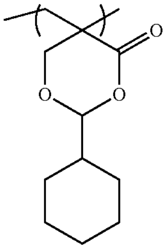

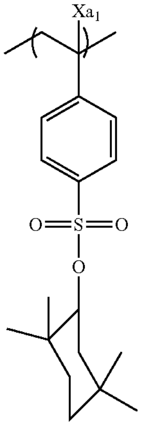

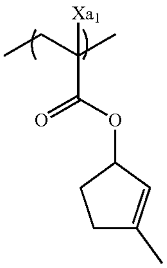

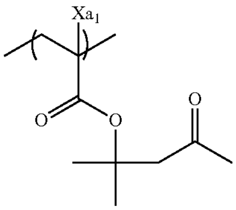

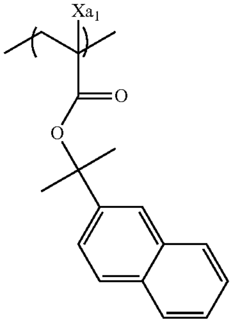

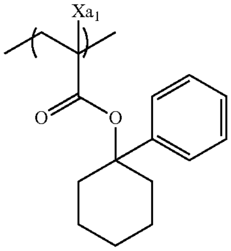

The resin (A) may contain a repeating unit other than the repeating unit described above.

For example, the resin (A) may contain at least one repeating unit selected from the group consisting of the following group A and/or at least one repeating unit selected from the group consisting of the following group B.

Group A: group consisting of the following repeating units (20) to (29)

(20) Repeating unit having acid group that will be described later

(21) Repeating unit having fluorine atom or iodine atom that will be described later

(22) Repeating unit having lactone group, sultone group, or carbonate group that will be described later

(23) Repeating unit having photoacid generating group that will be described later

(24) Repeating unit represented by General Formula (V-1) or General Formula (V-2) that will be described later

(25) Repeating unit represented by Formula (A) that will be described later.

(26) Repeating unit represented by Formula (B) that will be described later.

(27) Repeating unit represented by Formula (C) that will be described later.

(28) Repeating unit represented by Formula (D) that will be described later.

(29) Repeating unit represented by Formula (E) that will be described later.

Group B: group consisting of the following repeating units (30) to (32)

(30) Repeating unit having at least one group selected from lactone group, sultone group, carbonate group, hydroxyl group, cyano group, and alkali-soluble group that will be described later

(31) Repeating unit having alicyclic hydrocarbon structure and not exhibiting acid decomposability that will be described later

(32) Repeating unit represented by General Formula (III) having neither hydroxyl group nor cyano group that will be described later In a case where the resist composition is used for EUV exposure or electron beam exposure, it is preferable that the resin (A) have at least one repeating unit selected from the group A.

In addition, in a case where the resist composition is used for EUV exposure or electron beam exposure, it is also preferable that the resin (A) contain at least one of a fluorine atom or an iodine atom. In a case where the resin (A) contains both the fluorine atom and iodine atom, the resin (A) may have one repeating unit containing both the fluorine atom and iodine atom, or may have two repeating units, a repeating unit having a fluorine atom and a repeating unit having an iodine atom.

Furthermore, in a case where the resist composition is used for EUV exposure or electron beam exposure, it is also preferable that the resin (A) have a repeating unit having an aromatic group.

In a case where the resist composition is used for ArF exposure, it is preferable that the resin (A) have at least one repeating unit selected from the group B.

In addition, in a case where the resist composition is used for ArF exposure, it is preferable that the resin (A) do not contain a fluorine atom and a silicon atom.

Furthermore, in a case where the composition is used for ArF exposure, it is preferable that the resin (A) do not have an aromatic group.

<<Repeating Unit Having Acid Group>>

The resin (A) may have a repeating unit having an acid group.

As the acid group, an acid group having a pKa of 13 or less is preferable.

As the acid group, for example, a carboxyl group, a phenolic hydroxyl group, a fluorinated alcohol group (preferably a hexafluoroisopropanol group), a sulfonic acid group, a sulfonamide group, an isopropanol group, and the like are preferable.

In the hexafluoroisopropanol group, one or more (preferably one or two) fluorine atoms may be substituted with a group (such as an alkoxycarbonyl group) other than a fluorine atom.

$—C(CF_3)(OH)—CF_2—$ formed in this way is also preferable as an acid group. In addition, one or more fluorine atoms may be substituted with a group other than a fluorine atom such that a ring containing $—C(CF_3)(OH)—CF_2—$ is formed.

The repeating unit having an acid group is preferably a repeating unit having a structure in which a polar group is protected with the aforementioned leaving group dissociated by the action of an acid and a repeating unit different from a repeating unit having a lactone group, a sultone group, or a carbonate group that will be described later.

The repeating unit having an acid group may have a fluorine atom or an iodine atom.

The repeating unit having an acid group is preferably a repeating unit represented by Formula (B).

(B)

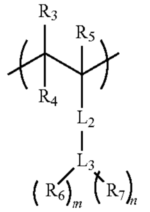

$R_3$ represents a hydrogen atom or a monovalent organic group which may have a fluorine atom or an iodine atom.

As the monovalent organic group which may have a fluorine atom or an iodine atom, a group represented by $-L_4-R_8$ is preferable. $L_4$ represents a single bond or an ester group. Examples of $R_s$ include an alkyl group which may have a fluorine atom or an iodine atom, a cycloalkyl group which may have a fluorine atom or an iodine atom, an aryl group which may have a fluorine atom or an iodine atom, and a group consisting of a combination of these.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be monocyclic or polycyclic, and examples thereof include a cycloalkyl ring group.

$R_6$ represents a hydroxyl group or a fluorinated alcohol group (preferably a hexafluoroisopropanol group). In a case where $R_6$ is a hydroxyl group, $L_3$ is preferably an (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3, and more preferably an integer of 1 or 2.

n represents 0 or an integer of 1 or more. n is preferably an integer of 1 to 4.

(n+m+1) is preferably an integer of 1 to 5.

The repeating unit having an acid group is also preferably a repeating unit represented by General Formula (I).

(I)

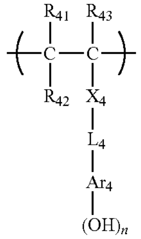

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. Here, $R_{42}$ and $Ar_4$ may be bonded to each other to form a ring. In this case, $R_{42}$ represents a single bond or an alkylene group.

$X_4$ represents a single bond, —COO—, or $—CONR_{64}—$, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, a n-butyl group, a sec-butyl group, a hexyl group, a 2-ethylhexyl group, an octyl group, or a dodecyl group is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. Among these, a monocyclic cycloalkyl group having 3 to 8 carbon atoms such as a cyclopropyl group, a cyclopentyl group, or a cyclohexyl group is preferable.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable. As the alkyl group contained in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the preferred substituent in each of the above groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like. The number of carbon atoms in the substituent is preferably 8 or less.

$Ar_4$ represents an (n+1)-valent aromatic ring group. A divalent aromatic ring group obtained in a case where n is 1 is preferably an arylene group having 6 to 18 carbon atoms such as a phenylene group, a tolylene group, a naphthylene group, or an anthracenylene group or a divalent aromatic ring group containing a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. The aromatic ring group may have a substituent.

Specific examples of the (n+1)-valent aromatic ring group obtained in a case where n is an integer of 2 or greater include groups obtained by removing (n−1) pieces of any hydrogen atoms from the specific examples of the divalent aromatic ring group described above.

The (n+1)-valent aromatic ring group may further have a substituent.

Examples of the substituent that the alkyl group, the cycloalkyl group, the alkoxycarbonyl group, the alkylene group, and the (n+1)-valent aromatic ring group described above can have include the alkyl group exemplified above as $R_{41}$, $R_{42}$, and $R_{43}$ in General Formula (I), an alkoxy group such as a methoxy group, an ethoxy group, a hydroxyethoxy group, a propoxy group, a hydroxypropoxy group, or a butoxy group; an aryl group such as a phenyl group; and the like.

Examples of the alkyl group represented by $R_{64}$ in —$CONR_{64}$— ($R_{64}$ represents a hydrogen atom or an alkyl group) represented by $X_4$ include an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group. Among these, an alkyl group having 8 or less carbon atoms is preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, or an octylene group.

$Ar_4$ is preferably an aromatic ring group having 6 to 18 carbon atoms, and more preferably a benzene ring group, a naphthalene ring group, or a biphenylene ring group.

It is preferable that the repeating unit represented by General Formula (I) comprise a hydroxystyrene structure. $Ar_4$ is preferably a benzene ring group.

As the repeating unit represented by General Formula (I), a repeating unit represented by General Formula (1) is preferable.

(1)

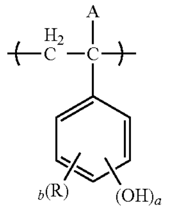

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group. In a case where there is a plurality of Rs, they may be the same or different from each other. In a case where the repeating unit has a plurality of Rs, they may be bonded to each other to form a ring. As R, a hydrogen atom is preferable.

a represents an integer of 1 to 3.

b represents an integer of 0 to (5−a).

Particularly, it is preferable that the resin contained in the resist composition have a hydroxystyrene-based repeating unit.

Examples of the hydroxystyrene-based repeating unit include a repeating unit represented by General Formula (1) in which A represents a hydrogen atom.

Examples of repeating units having an acid group will be shown below. In the formulae, a represents 1 or 2.

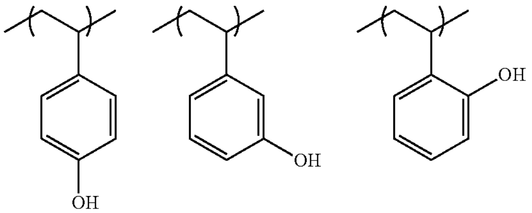

(B-1)

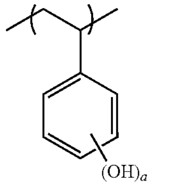

(B-2)

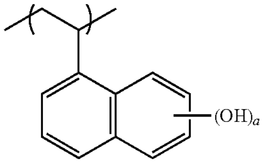

(B-3)

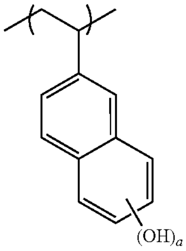

(B-4)

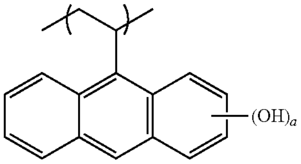

-continued
(B-5)
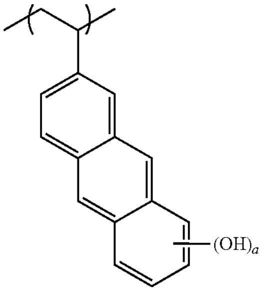
(B-6)
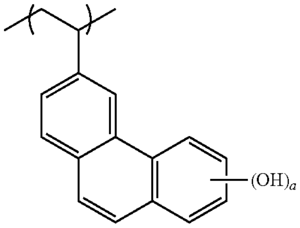
(B-7)
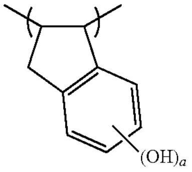
(B-8)
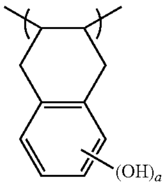
(B-9)
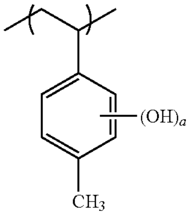
(B-10)
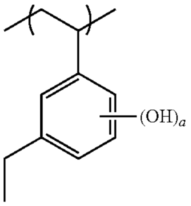
(B-11)
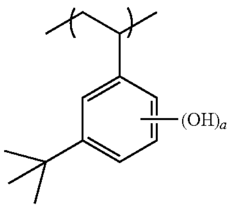
-continued
(B-12)
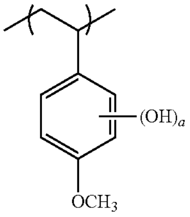
(B-13)
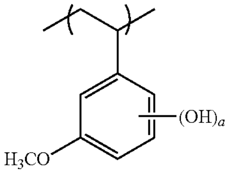
(B-14)
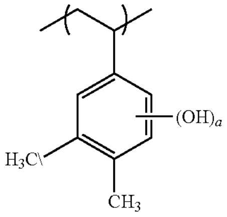
(B-15)
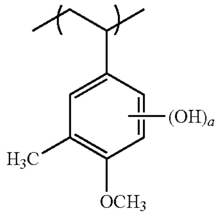
(B-16)
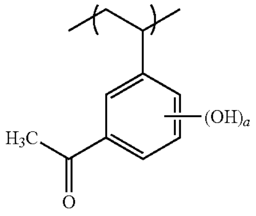
(B-17)
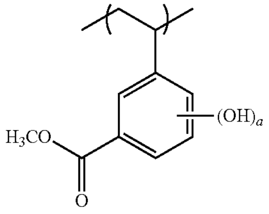
(B-18)
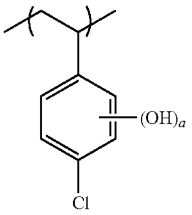

-continued
(B-19)
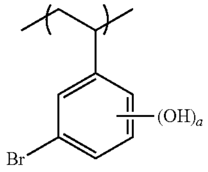
(B-20)
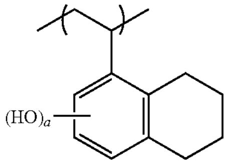
(B-21)
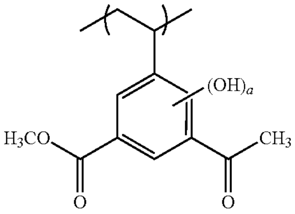
(B-22)
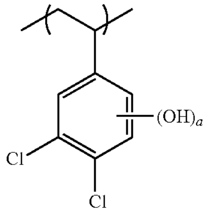
(B-23)
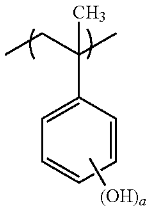
(B-24)
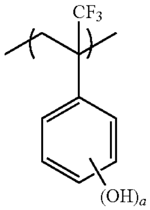
(B-25)
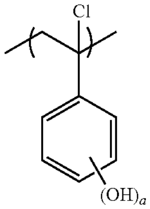
-continued
(B-26)
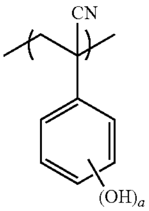
(B-27)
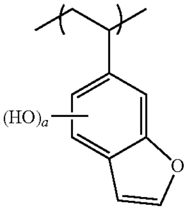
(B-28)
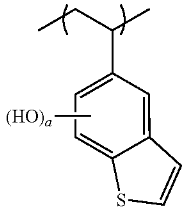
(B-29)
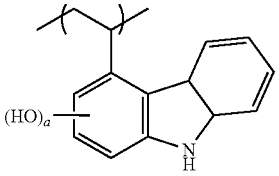
(B-30)
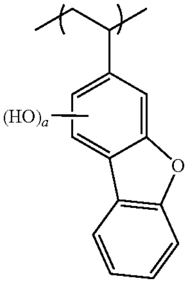
(B-31)
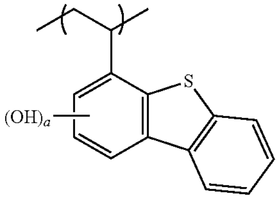
(B-32)
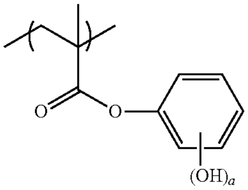

-continued
(B-33)
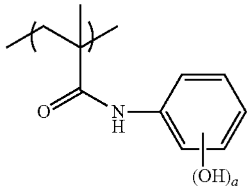
(B-34)
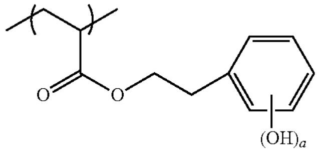
(B-35)
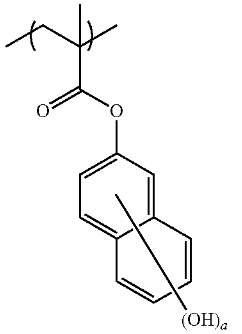
(B-36)
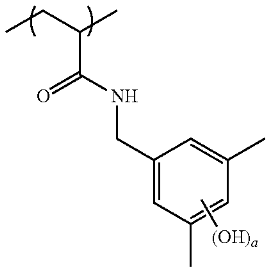
(B-37)
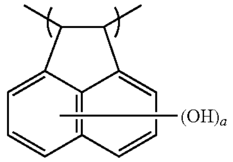
(B-38)
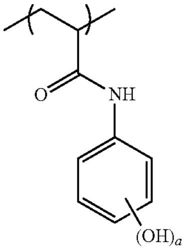
Among the above repeating units, the repeating units specifically described below are preferable. In the formulae, R represents a hydrogen atom or a methyl group, and a represents 2 or 3.
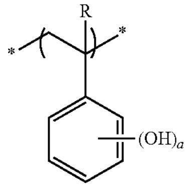
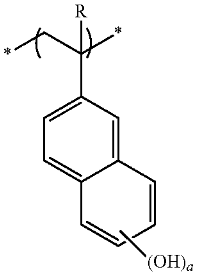
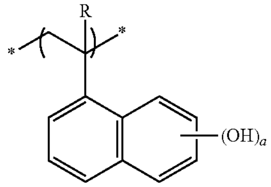
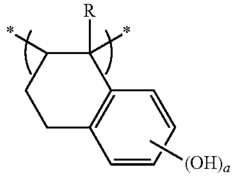
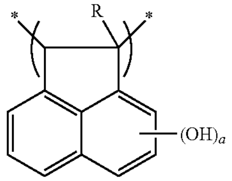
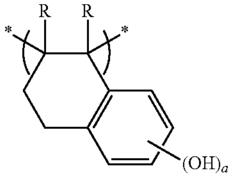
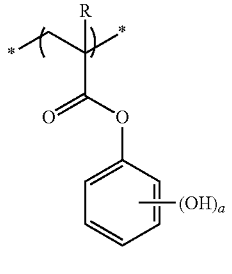
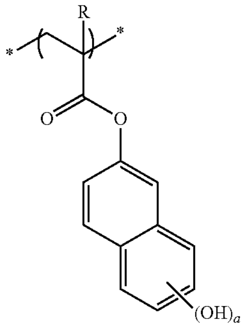
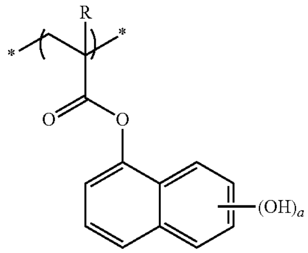
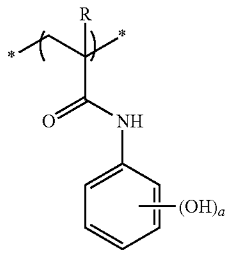
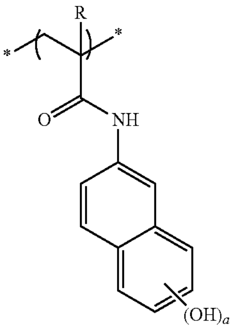

-continued
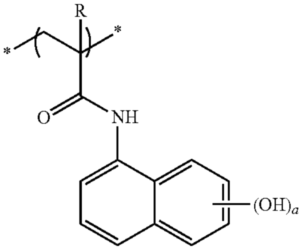
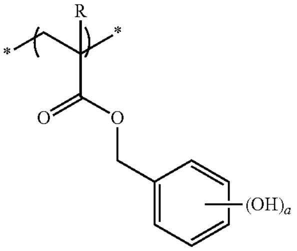
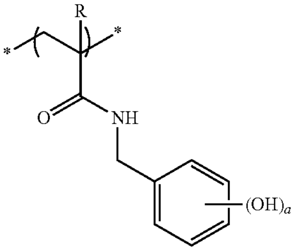
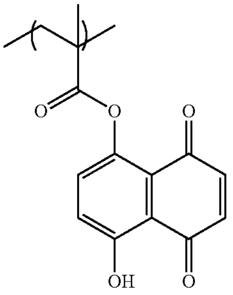
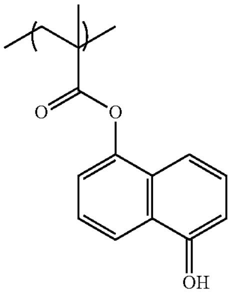
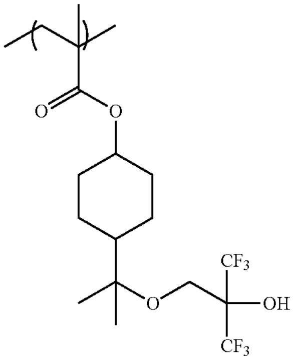
-continued
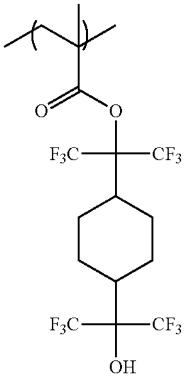
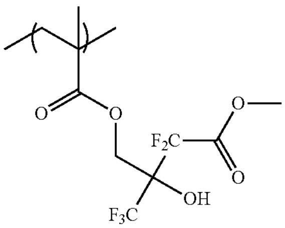
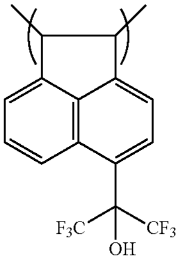
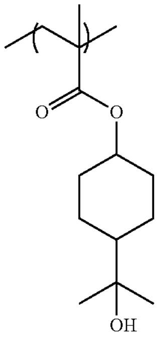
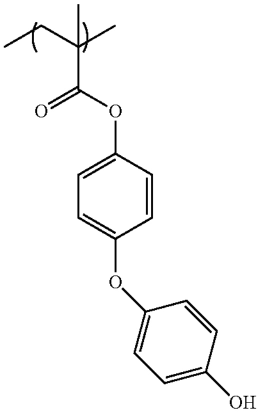
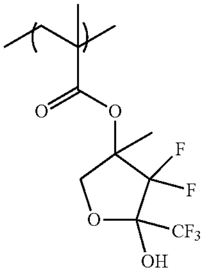
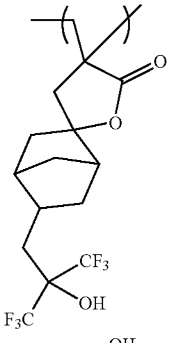
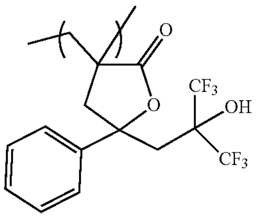
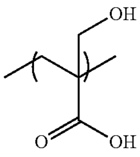
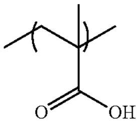
The content of the repeating unit having an acid group (preferably a hydroxystyrene-based repeating unit) with respect to the total content of repeating units in the resin (A) is preferably 5 mol % or more, and more preferably 10 mol % or more. The upper limit thereof is not particularly limited, but is preferably 50 mol % or less, more preferably 45 mol % or less, and even more preferably 40 mol %.

<<Repeating Unit Having Fluorine Atom or Iodine Atom>>

The resin (A) may have a repeating unit having a fluorine atom or an iodine atom, in addition to <<Repeating unit having acid-decomposable group>> and <<Repeating unit having acid group>> described above. <<Repeating unit having fluorine atom or iodine atom>> mentioned herein is preferably different from other types of repeating units, such as <<Repeating unit having lactone group, sultone group, or carbonate group>> and <<Repeating unit having photoacid generating group>> that will be described later, belonging to the group A.

As the repeating unit having a fluorine atom or an iodine atom, a repeating unit represented by Formula (C) is preferable.

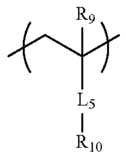

(C)

$L_5$ represents a single bond or an ester group.

$R_9$ represents a hydrogen atom or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group consisting of a combination of these.

Examples of the repeating unit having a fluorine atom or an iodine atom will be shown below.

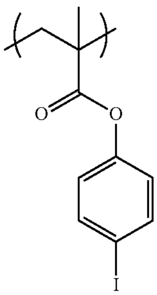
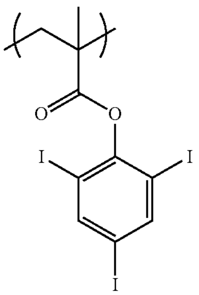
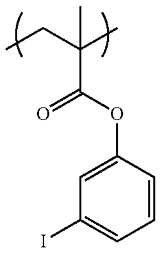
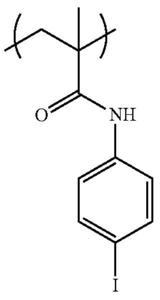
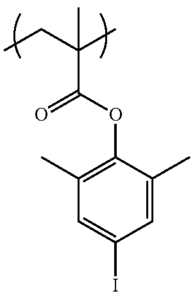
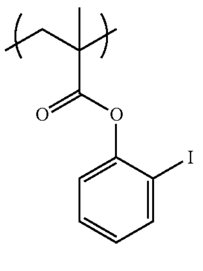

-continued

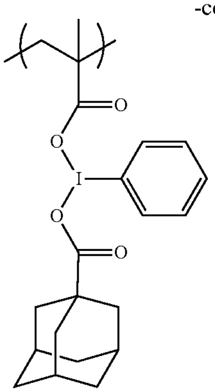
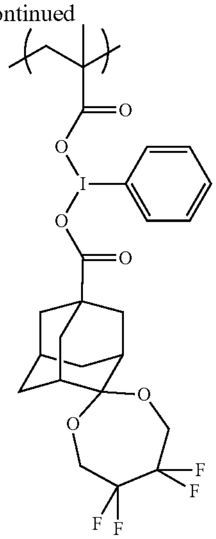
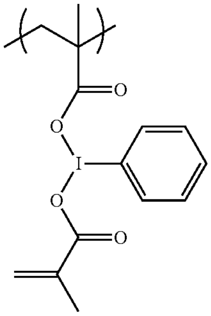

The content of the repeating unit having a fluorine atom or an iodine atom with respect to the total content of repeating units in the resin (A) is preferably 0 mol % or more, more preferably 5 mol % or more, and even more preferably 10 mol % or more. The upper limit thereof is preferably 50 mol % or less, more preferably 45 mol % or less, and even more preferably 40 mol %.

As described above, the repeating unit having a fluorine atom or the iodine atom does not include <<Repeating unit having acid-decomposable group>> and <<Repeating unit having acid group>>. Therefore, the content of the repeating unit having a fluorine atom or an iodine atom means the content of the repeating unit having a fluorine atom or an iodine atom excluding <<Repeating unit having acid-decomposable group>> and <<Repeating unit having acid group>>.

Among the repeating units of the resin (A), the total content of repeating units including at least one of a fluorine atom or an iodine atom with respect to the total content of repeating units in the resin (A) is preferably 20 mol % or more, more preferably 30 mol % or more, and even more preferably 40 mol % or more. The upper limit thereof is not particularly limited, and is 100 mol % or less, for example.

Examples of the repeating unit including at least one of a fluorine atom or an iodine atom include a repeating unit that has either a fluorine atom or an iodine atom and an acid-decomposable group, a repeating unit that has either a fluorine atom or an iodine atom and an acid group, and a repeating unit that has a fluorine atom or an iodine atom.

<<Repeating Unit Having Lactone Group, Sultone Group, or Carbonate Group>>

The resin (A) may have a repeating unit having at least one group selected from the group consisting of a lactone group, a sultone group, and a carbonate group (hereinafter, such repeating units-will be collectively called "repeating unit having a lactone group, a sultone group, or a carbonate group").

It is also preferable that the repeating unit having a lactone group, a sultone group, or a carbonate group do not have an acid group such as a hexafluoropropanol group.

The lactone group or the sultone group may have a lactone structure or a sultone structure. The lactone structure or the sultone structure is preferably a 5- to 7-membered ring lactone structure or a 5- to 7-membered ring sultone structure. Among these, a 5- to 7-membered ring lactone structure with which another ring structure is fused while forming a bicyclo structure or a spiro structure or a 5- to 7-membered ring sultone structure with which another ring structure is fused while forming a bicyclo structure or a spiro structure is more preferable.

It is preferable that the resin (A) have a repeating unit having a lactone group or a sultone group obtained by abstracting one or more hydrogen atoms from ring member atoms of a lactone structure represented by any of General formulae (LC1-1) to (LC1-21) or a sultone structure represented by any of General formulae (SL1-1) to (SL1-3).

Furthermore, the lactone group or the sultone group may be directly bonded to the main chain. For example, the ring member atoms of the lactone group or the sultone group may constitute the main chain of the resin (A).

LC1-1

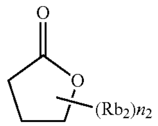

LC1-2

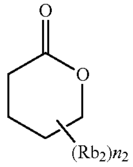

LC1-3

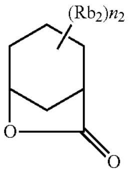

LC1-4

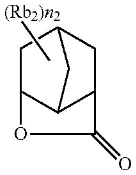

LC1-5

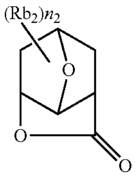

-continued

LC1-6

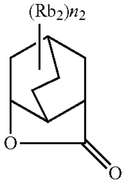

LC1-7

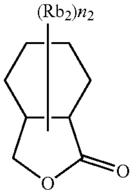

LC1-8

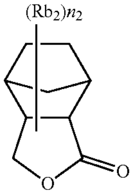

LC1-9

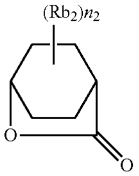

LC1-10

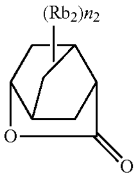

LC1-11

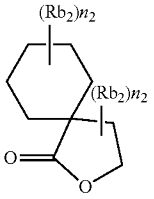

LC1-12

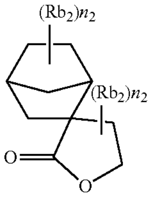

LC1-13

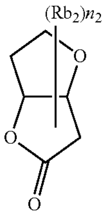

-continued

LC1-14

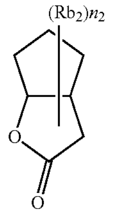

LC1-15

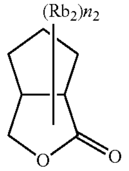

LC1-16

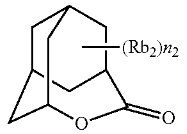

LC1-17

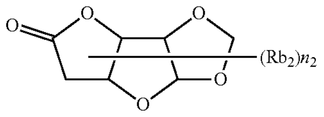

LC1-18

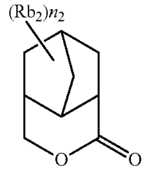

LC1-19

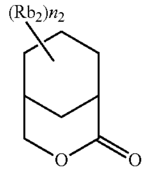

LC1-20

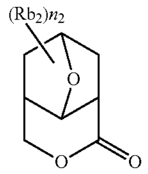

LC1-21

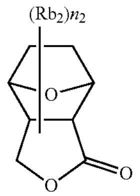

SL1-1

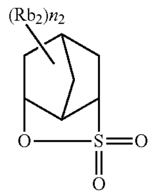

-continued

SL1-2

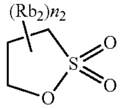

SL1-3

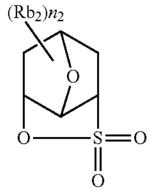

The portion of the lactone structure or sultone structure may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group, and the like are preferable. n2 represents an integer of 0 to 4. In a case where n2 is 2 or more, a plurality of $Rb_2$'s may be different from each other or may be bonded to each other to form a ring.

Examples of repeating units having a group having a lactone structure represented by any of General formulae (LC1-1) to (LC1-21) or a sultone structure represented by any of General formulae (SL1-1) to (SL1-3) include a repeating unit represented by General Formula (AI) and the like.

(AI)

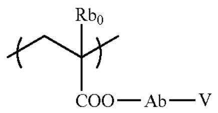

In General Formula (AI), $Rb_0$ represent a hydrogen atom, a halogen atom, or an alkyl group having 1 to 4 carbon atoms.

Examples of preferred substituents that the alkyl group represented by $Rb_0$ may have include a hydroxyl group and a halogen atom.

Examples of the halogen atom represented by $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group obtained by combining these. Among these, a single bond or a linking group represented by $-Ab_1-CO_2-$ is preferable. $Ab_1$ is a linear or branched alkylene group or a monocyclic or polycyclic cycloalkylene group, and is preferably a methylene group, an ethylene group, a cyclohexylene group, an adamantylene group, or a norbornylene group.

V represents a group formed by abstracting one hydrogen atom from ring member atoms of a lactone structure represented by any of General formulae (LC1-1) to (LC1-21), or a group formed by abstracting one hydrogen atom from ring member atoms of a sultone structure represented by any of General formulae (SL1-1) to (SL1-3).

In a case where there are optical isomers of the repeating unit having a lactone group or a sultone group, any of the optical isomers may be used. In addition, one optical isomer may be used alone, or a plurality of optical isomers may be mixed and used. In a case where one optical isomer is mainly used, the optical purity (ee) thereof is preferably 90 or more, and more preferably 95 or more.

The carbonate group is preferably a cyclic carbonate group.

The repeating unit having a cyclic carbonate group is preferably a repeating unit represented by General Formula (A-1).

(A-1)

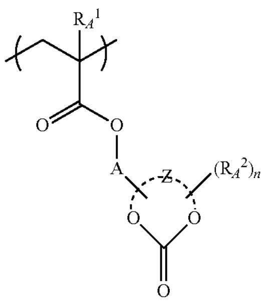

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, a plurality of $R_A^2$'S may be the same as or different from each other.

A represents a single bond or a divalent linking group. As the divalent linking group, an alkylene group, a divalent linking group having a monocyclic or polycyclic alicyclic hydrocarbon structure, an ether group, an ester group, a carbonyl group, a carboxyl group, or a divalent group obtained by combining these is preferable.

Z represents an atomic group forming a monocyclic or polycyclic ring together with a group represented by —O—CO—O— in the formula.

Examples of the repeating unit having a lactone group, a sultone group, or a carbonate group will be shown below.

(in the formulae, Rx represents H, $CH_3$, $CH_2OH$, or $CF_3$)

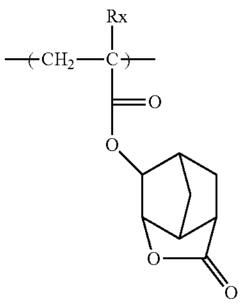

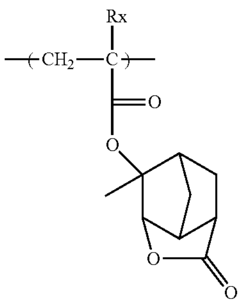

-continued

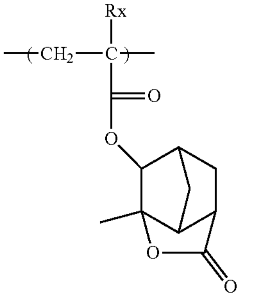

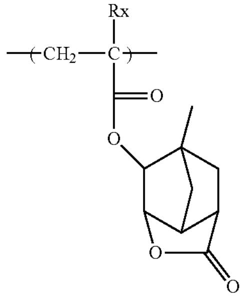

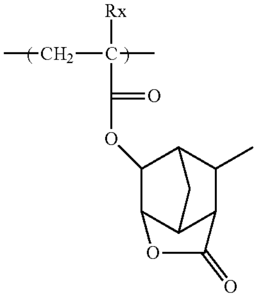

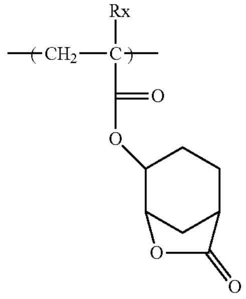

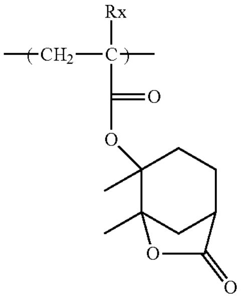

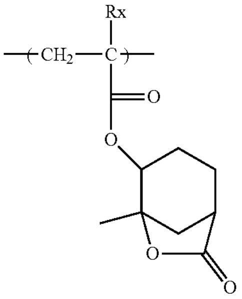

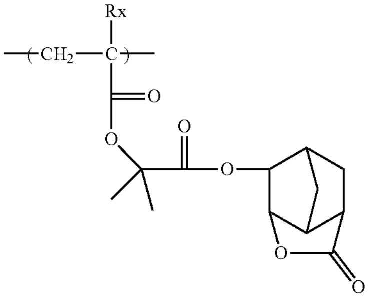

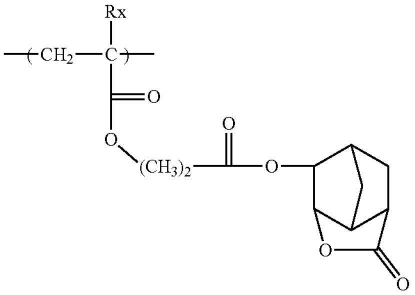

-continued
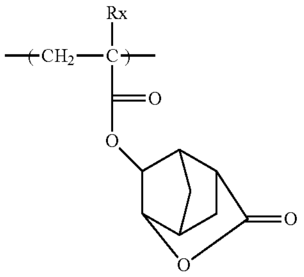
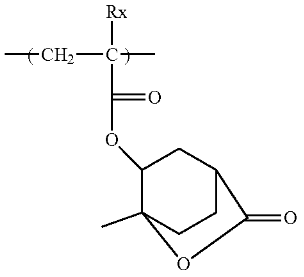
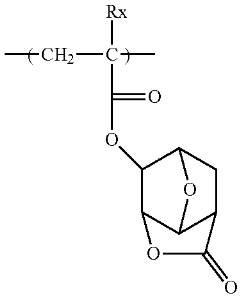
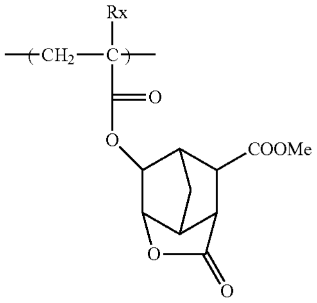
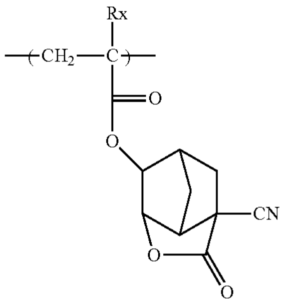
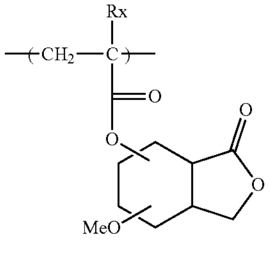
-continued
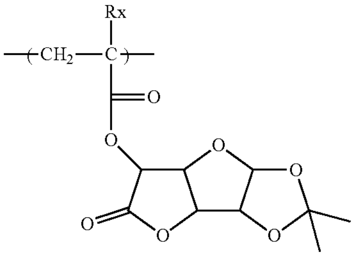
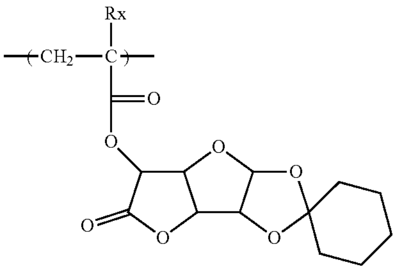
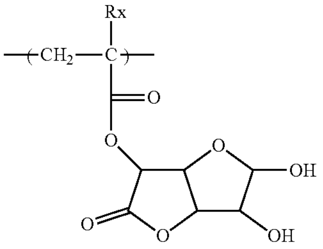
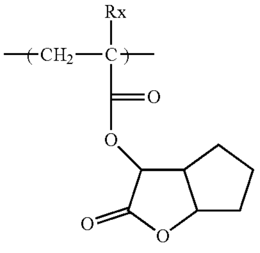
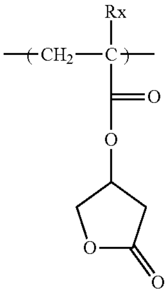
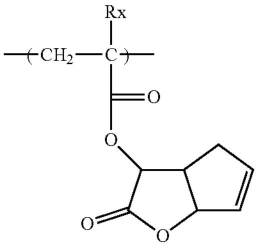
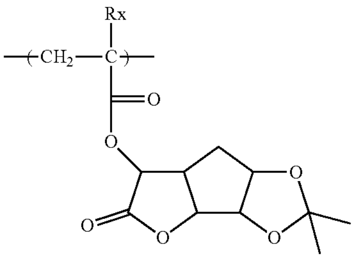

-continued
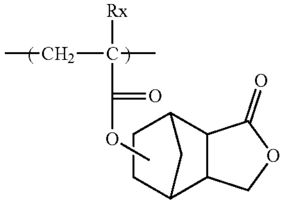
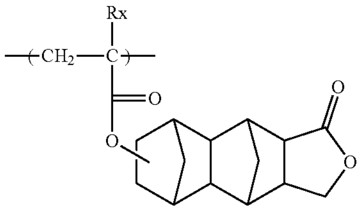
(In formulae, Rx is H, $CH_3$, $CH_2OH$, or $CF_3$)
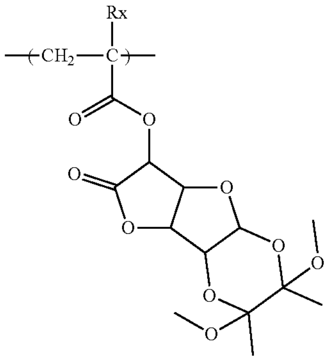
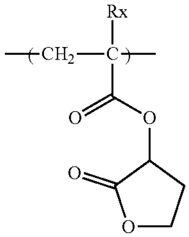
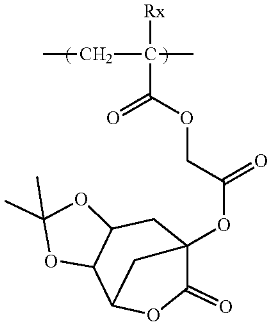
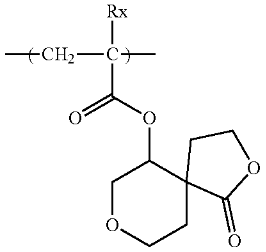
-continued
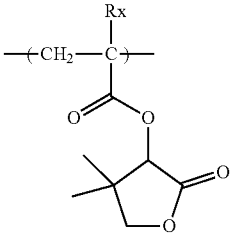
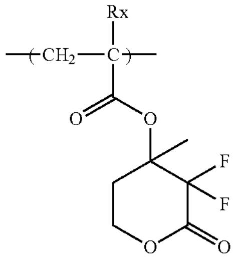
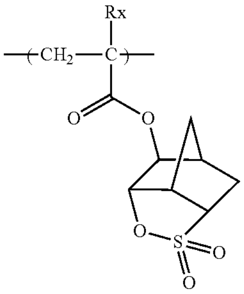
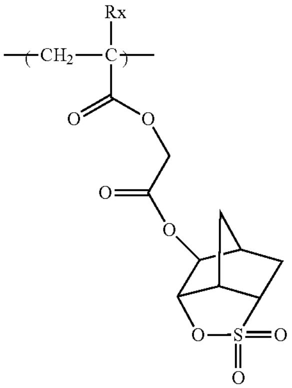
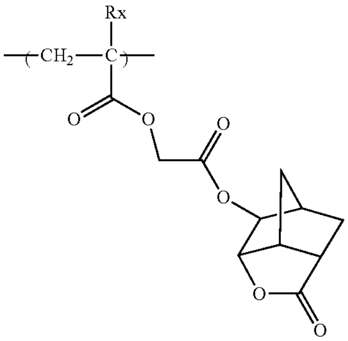
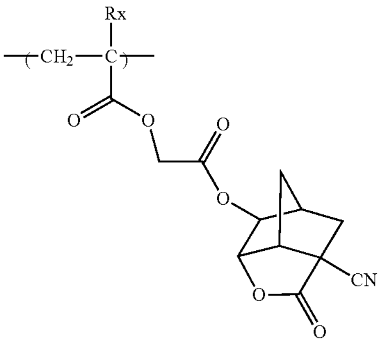

-continued

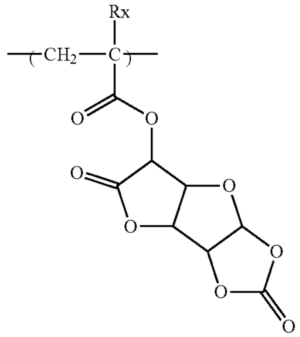

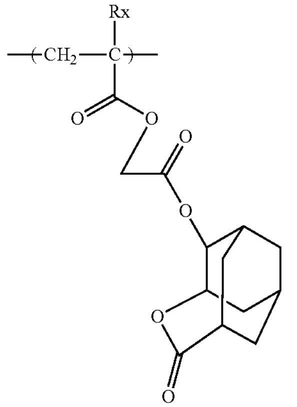

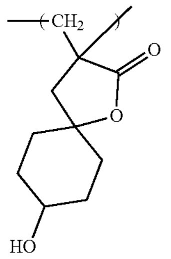

(In formulae, Rx is H, $CH_3$, $CH_2OH$, or $CF_3$)

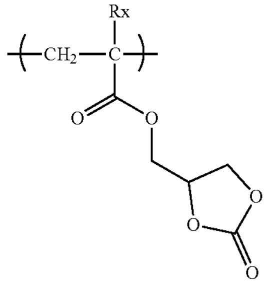

-continued

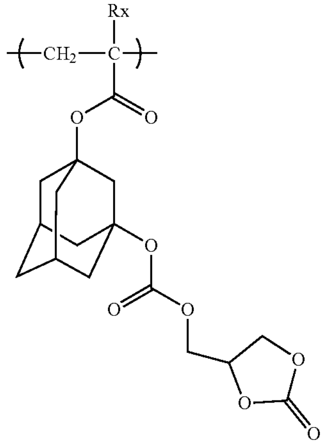

The content of the repeating unit having a lactone group, a sultone group, or a carbonate group with respect to the total content of repeating units in the resin (A) is preferably 1 mol % or more, and more preferably 5 mol % or more. The upper limit thereof is not particularly limited, but is preferably 65 mol % or less, more preferably 30 mol % or less, even more preferably 25 mol % or less, and particularly preferably 20 mol % or less.

<<Repeating Unit Having Photoacid Generating Group>>

The resin (A) may have, as a repeating unit other than the above ones, a repeating unit having a group that generates an acid by irradiation with an actinic ray or radiation (hereinafter, also called "photoacid generating group").

In this case, the repeating unit having a photoacid generating group can be regarded as corresponding to a compound that generates an acid by irradiation with an actinic ray or radiation that will be described later (hereinafter, also called "photo acid generator").

Examples of such a repeating unit include a repeating unit represented by General Formula (4).

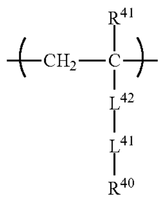

(4)

$R^{41}$ represents a hydrogen atom or a methyl group. $L^{41}$ represents a single bond or a divalent linking group. $L^{42}$ represents a divalent linking group. $R^{40}$ represents a structural moiety generating an acid on a side chain by being decomposed by the irradiation with actinic rays or radiation.

Examples of the repeating unit having a photoacid generating group will be shown below.

-continued
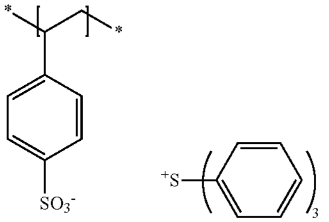
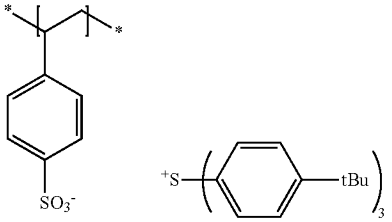
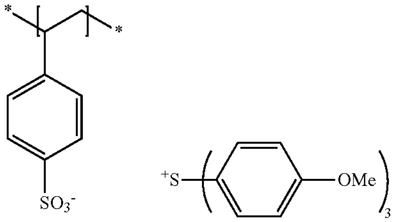
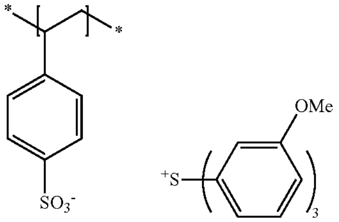
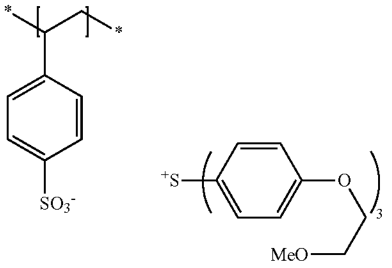
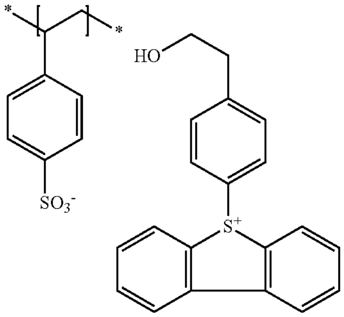
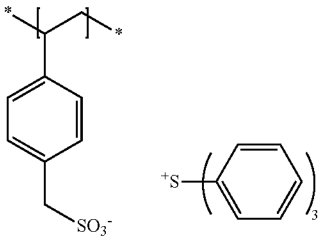
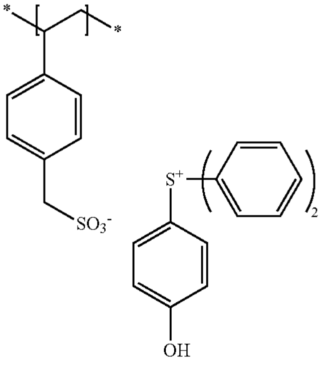
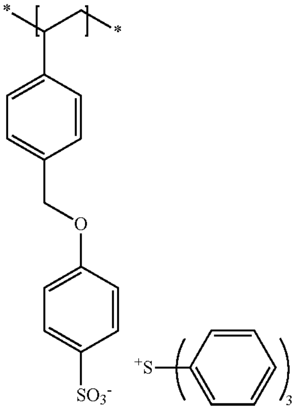
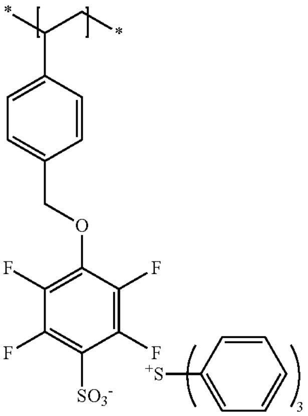
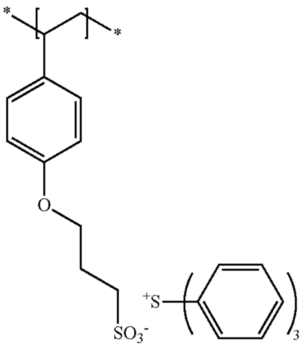

-continued

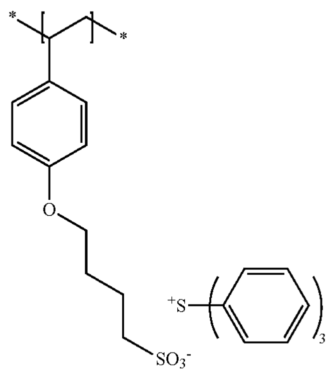

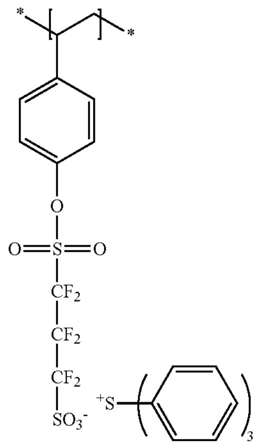

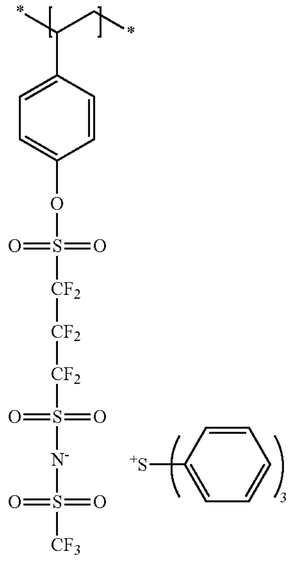

-continued

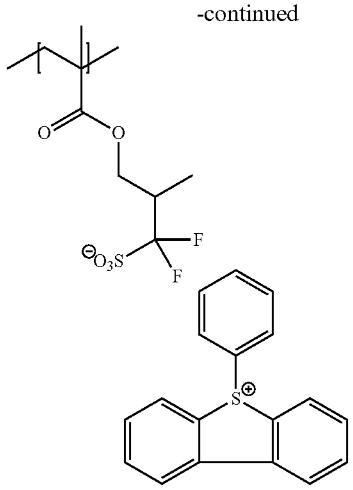

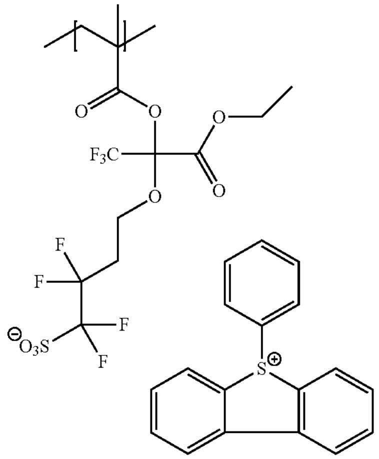

Examples of the repeating unit represented by General Formula (4) also include the repeating units described in paragraphs “0094” to “0105” in JP2014-041327A.

The content of the repeating unit having a photoacid generating group with respect to the total content of repeating units in the resin (A) is preferably 1 mol % or more, and more preferably 5 mol % or more. The upper limit thereof is preferably 40 mol % or less, more preferably 35 mol % or less, and even more preferably 30 mol % or less.

<<Repeating Unit Represented by General Formula (V-1) or General Formula (V-2)>>

The resin (A) may have a repeating unit represented by General Formula (V-1) or General Formula (V-2).

It is preferable that the repeating units represented by General Formula (V-1) and General Formula (V-2) be repeating units different from the repeating units described above.

(V-1)

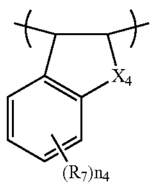

-continued (V-2)

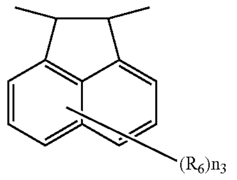

In the formulae, $R_6$ and $R_7$ each independently represent a hydrogen atom, a hydroxyl group, an alkyl group, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group. The alkyl group is preferably a linear, branched, or cyclic alkyl group having 1 to 10 carbon atoms.

$n_3$ represents an integer of 0 to 6.

$n_4$ represents an integer of 0 to 4.

$X^4$ is a methylene group, an oxygen atom, or a sulfur atom.

Examples of the repeating unit represented by General Formula (V-1) or (V-2) will be shown below.

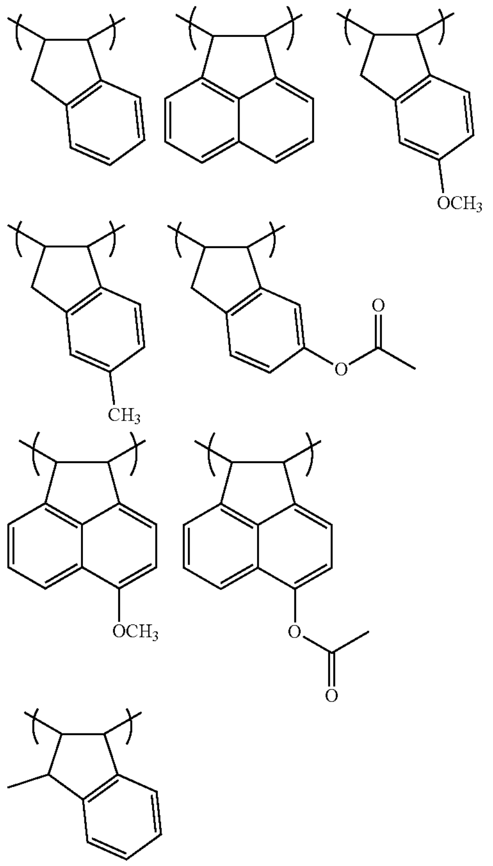

<<Repeating Unit for Reducing Mobility of Main Chain>>

From the viewpoint of making it possible to suppress excessive diffusion of the generated acid or suppress pattern collapse during development, it is preferable that the resin (A) have a high glass transition temperature (Tg). Tg is preferably higher than 90° C., more preferably higher than 100° C., even more preferably higher than 110° C., and particularly preferably higher than 125° C. Excessively high Tg leads to a decrease in a dissolution rate in a developer. Therefore, Tg is preferably 400° C. or lower, and more preferably 350° C. or lower.

In the present specification, the glass transition temperature (Tg) of a polymer such as the resin (A) is calculated by the following method. First, Tg of a homopolymer consisting of only each repeating unit contained in a polymer is calculated by the Bicerano method. Hereinafter, the calculated Tg will be called “Tg of a repeating unit”. Then, the mass ratio (%) of each repeating unit with respect to the total mass of repeating units in the polymer is calculated. Thereafter, Tg at each mass ratio is calculated using the Fox equation (described in Materials Letters 62 (2008) 3152 and the like), added up, and adopted as Tg (° C.) of the polymer.

The Bicerano method is described in the Prediction of polymer properties, Marcel Decker Inc, New York (1993), and the like. In addition, the calculation of Tg by the Bicerano method can also be performed by MDL Polymer (MDL Information Systems, Inc.), which is software for estimating physical properties of polymers.

In order to increase Tg of the resin (A) (preferably, in order to obtain Tg of higher than 90° C.), it is preferable to reduce the mobility of the main chain of the resin (A). Examples of the method of reducing the mobility of the main chain of the resin (A) include the following methods (a) to (e).

(a) Introducing bulky substituent into main chain (b) Introducing a plurality of substituents into main chain (c) Introducing substituent that induces an interaction between resins (A) in the vicinity of main chain (d) Forming main chain in cyclic structure (e) Linking cyclic structure to main chain The resin (A) preferably has a repeating unit in which Tg of a homopolymer is 130° C. or higher.

The type of repeating unit in which Tg of a homopolymer is 130° C. or higher is not particularly limited, and may be a repeating unit in which Tg of a homopolymer is 130° C. or higher that is calculated by the Bicerano method. Depending on the type of functional group in the repeating unit represented by Formulae (A) to (E) that will described later, a repeating unit in which Tg of a homopolymer is 130° C. or higher corresponds thereto.

(Repeating Unit Represented by Formula (A))

One of the specific examples of means for achieving the aforementioned (a) include a method of introducing a repeating unit represented by Formula (A) into the resin (A).

(A)

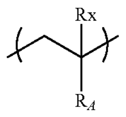

In Formula (A), $R_A$ represent a group having a polycyclic structure. Rx represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include the following repeating units.

(A-1)

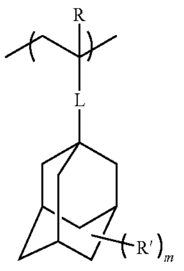

(A-2)

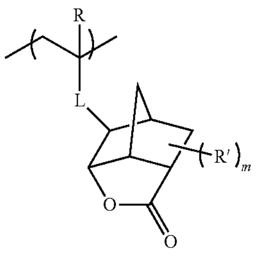

(A-3)

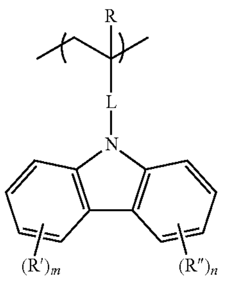

(A-4)

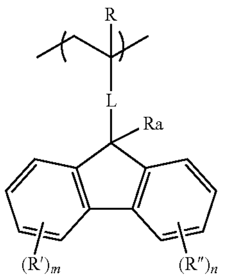

(A-5)

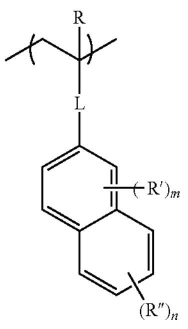

-continued (A-6)

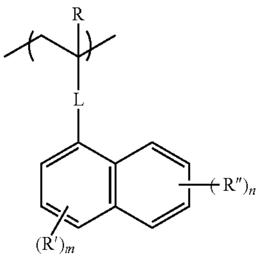

(A-7)

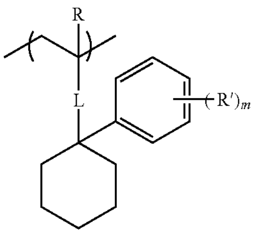

(A-8)

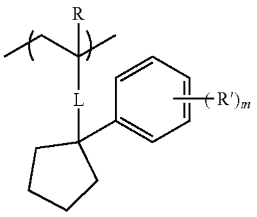

(A-9)

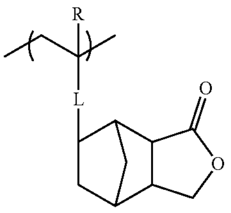

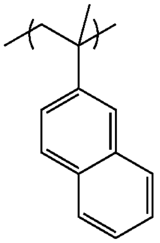

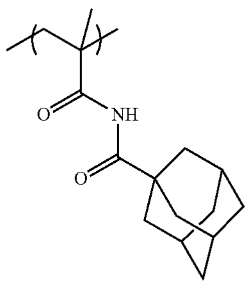

In the above formulae, R represents a hydrogen atom, a methyl group, or an ethyl group.

Ra represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR''' or —COOR''': R''' represents an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by Ra may be substituted with a fluorine atom or an iodine atom.

R' and R'' each independently represent an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR''' or —COOR''': R''' represents an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' and R'' may be substituted with a fluorine atom or an iodine atom.

L represents a single bond or a divalent linking group. Examples of the divalent linking group include —COO—, —CO—, —O—, —S—, —SO—, $—SO_2—$, an alkylene group, a cycloalkylene group, an alkenylene group, a linking group consisting of a plurality of these groups linked to each other, and the like.

m and n each independently represent an integer of 0 or more. The upper limit of m and n is not particularly limited, but is often an integer of 2 or less and more often an integer of 1 or less.

(Repeating Unit Represented by Formula (B))

One of the specific examples of means for achieving the aforementioned (b) include a method of introducing a repeating unit represented by Formula (B) into the resin (A).

(B)

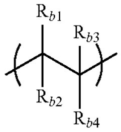

In Formula (B), $R_{b1}$ to $R_{b4}$ each independently represent a hydrogen atom or an organic group, and at least two or more out of $R_{b1}$ to $R_{b4}$ represent an organic group.

In a case whereat least one of the organic groups is a group in which a ring structure is directly linked to the main chain in the repeating unit, the type of other organic groups is not particularly limited.

In a case where none of the organic groups is a group in which a ring structure is directly linked to the main chain in the repeating unit, at least two or more organic groups are substituents having three or more constituent atoms excluding a hydrogen atom.

Specific examples of the repeating unit represented by Formula (B) include the following repeating units.

(B-1)

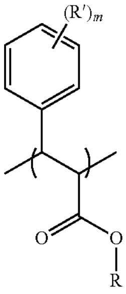

-continued (B-2)

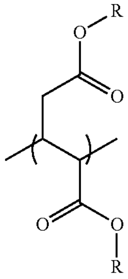

(B-3)

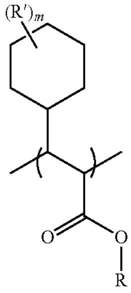

(B-4)

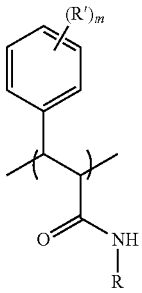

(B-5)

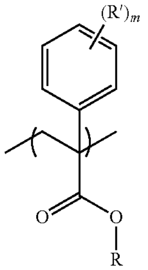

(B-6)

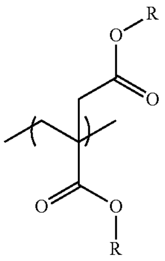

In the above formulae, R each independently represents a hydrogen atom or an organic group. Examples of the organic group include organic groups which may have a substitute, such as an alkyl group, a cycloalkyl group, an aryl group, an aralkyl group, and an alkenyl group.

R' each independently represents an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" represents an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' may be substituted with a fluorine atom or an iodine atom.

m represents an integer of 0 or more. The upper limit of m is not particularly limited, but is often an integer of 2 or less and more often an integer of 1 or less.

(Repeating Unit Represented by Formula (C))

One of the specific examples of means for achieving the aforementioned (c) include a method of introducing a repeating unit represented by Formula (C) into the resin (A).

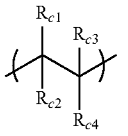
(C)

In Formula (C), $R_{c1}$ to $R_{c4}$ each independently represent a hydrogen atom or an organic group, and at least one of $R_{c1}$, $R_{c2}$, $R_{c3}$, or $R_{c4}$ is a group having a hydrogen-bonding hydrogen atom within 3 atoms from the main chain carbon. Particularly, in order to induce the interaction between the main chains of the resin (A), it is preferable that the group have a hydrogen-bonding hydrogen atom within 2 atoms (it is preferable that the hydrogen-bonding hydrogen atom be closer to the main chain).

Specific examples of the repeating unit represented by Formula (C) include the following repeating units.

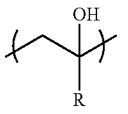
(C-1)

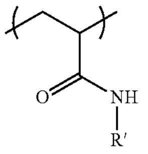
(C-2)

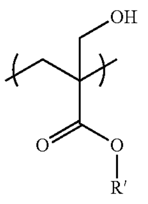
(C-3)

In the above formulae, R represents an organic group. Examples of the organic group include an alkyl group, a cycloalkyl group, an aryl group, an aralkyl group, an alkenyl group, an ester group (—OCOR or —COOR: R represents an alkyl group or fluorinated alkyl group having 1 to 20 carbon atoms), and the like which may have a substituent.

R' represents a hydrogen atom or an organic group. Examples of the organic group include an alkyl group, a cycloalkyl group, an aryl group, an aralkyl group, an alkenyl group, and the like. The hydrogen atom in the organic group may be substituted with a fluorine atom or an iodine atom.

(Repeating Unit Represented by Formula (D))

One of the specific examples of means for achieving the aforementioned (d) include a method of introducing a repeating unit represented by Formula (D) into the resin (A).

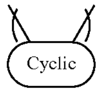
(D)

In Formula (D), "Cyclic" represents a group forming a main chain with a cyclic structure. The number of constituent atoms of the ring is not particularly limited.

Specific examples of the repeating unit represented by Formula (D) include the following repeating units.

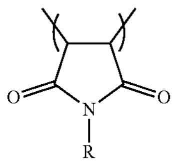
(D-1)

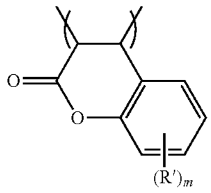
(D-2)

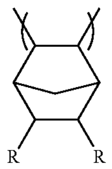
(D-3)

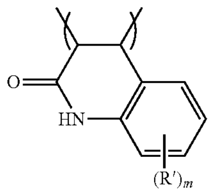
(D-4)

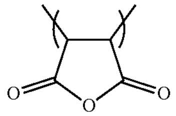
(D-5)

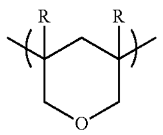
(D-6)

-continued (D-7)

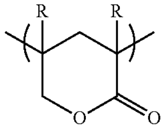

(D-8)

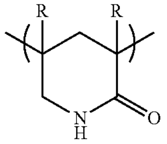

(D-9)

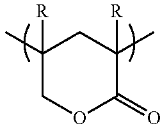

(D-10)

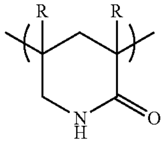

(D-11)

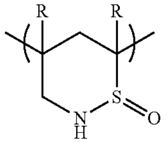

(D-12)

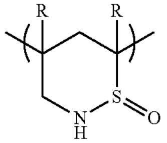

(D-13)

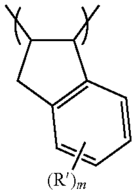

(D-14)

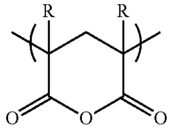

(D-15)

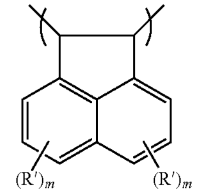

(D-16)

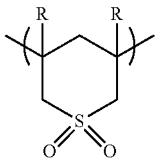

-continued (D-17)

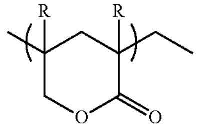

(D-18)

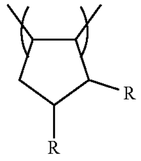

(D-19)

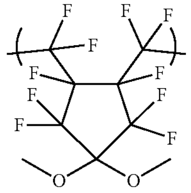

In the above formulae, R each independently represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' may be substituted with a fluorine atom or an iodine atom.

In the above formulae, R' each independently represents an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' may be substituted with a fluorine atom or an iodine atom.

m represents an integer of 0 or more. The upper limit of m is not particularly limited, but is often an integer of 2 or less and more often an integer of 1 or less.

(Repeating Unit Represented by Formula (E))

One of the specific examples of means for achieving the aforementioned (e) include a method of introducing a repeating unit represented by Formula (E) into the resin (A).

(E)

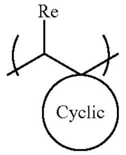

In Formula (E), Re each independently represents a hydrogen atom or an organic group. Examples of the organic group include an alkyl group, a cycloalkyl group, an aryl group, an aralkyl group, an alkenyl group, and the like which may have a substituent.

"Cyclic" is a cyclic group containing a carbon atom of the main chain. The number of atoms contained in the cyclic group is not particularly limited.

Specific examples of the repeating unit represented by Formula (E) include the following repeating units.

(E-1)

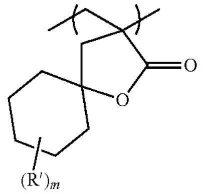

(E-2)

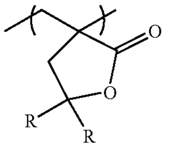

(E-3)

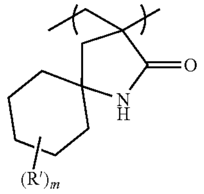

(E-4)

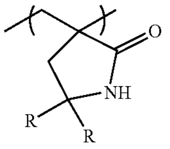

(E-5)

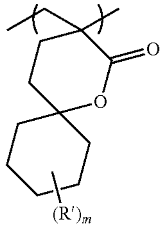

(E-6)

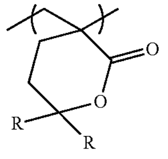

(E-7)

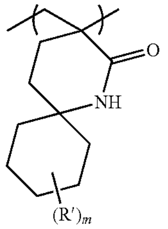

-continued (E-8)

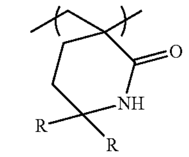

(E-9)

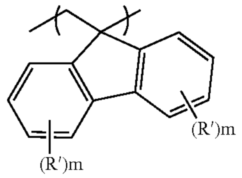

(E-10)

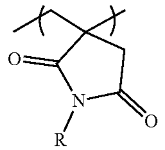

(E-11)

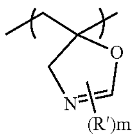

(E-12)

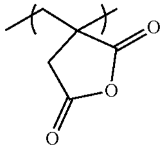

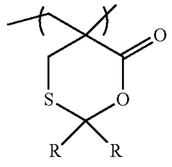

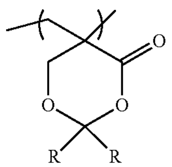

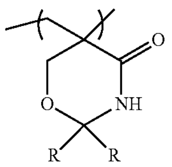

In the above formulae, R each independently represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' may be substituted with a fluorine atom or an iodine atom.

R' each independently represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or a fluorinated alkyl group having 1 to 20 carbon atoms), or a carboxyl group. Each of the alkyl group, cycloalkyl group, aryl group, aralkyl group, and alkenyl group described above may have a substituent. The hydrogen atom bonded to the carbon atom in the group represented by R' may be substituted with a fluorine atom or an iodine atom.

m represents an integer of 0 or more. The upper limit of m is not particularly limited, but is often an integer of 2 or less and more often an integer of 1 or less.

In Formula (E-2), Formula (E-4), Formula (E-6), and Formula (E-8), two Rs may be bonded to each other to form a ring.

The content of the repeating unit represented by Formula (E) with respect to the total content of repeating units in the resin (A) is preferably 5 mol % or more, and more preferably 10 mol % or more. The upper limit thereof is preferably 60 mol % or less, and more preferably 55 mol % or less.

<<Repeating Unit Having at Least One Group Selected from Lactone Group, Sultone Group, Carbonate Group, Hydroxyl Group, Cyano Group, and Alkali-Soluble Group>>

The resin (A) may have a repeating unit having at least one group selected from a lactone group, a sultone group, a carbonate group, a hydroxyl group, a cyano group, and an alkali-soluble group.

Examples of the repeating unit having a lactone group, a sultone group, or a carbonate group that the resin (A) has include the repeating units described above in <<Repeating unit having lactone group, sultone group, or carbonate group>>. The preferred content thereof is also as described above in <<Repeating unit having lactone group, sultone group, or carbonate group>>.

The resin (A) may have a repeating unit having a hydroxyl group or a cyano group. In a case where the resin (A) has such a repeating unit, the substrate adhesiveness and the affinity for a developer are improved.

The repeating unit having a hydroxyl group or a cyano group is preferably a repeating unit having an alicyclic hydrocarbon structure substituted with a hydroxyl group or a cyano group.

It is preferable that the repeating unit having a hydroxyl group or a cyano group do not have an acid-decomposable group. Examples of the repeating unit having a hydroxyl group or a cyano group include repeating units represented by General Formulae (AIIa) to (AIId).

(AIIa)

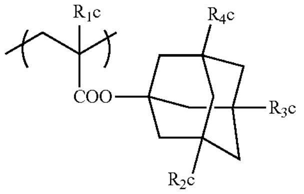

(AIIb)

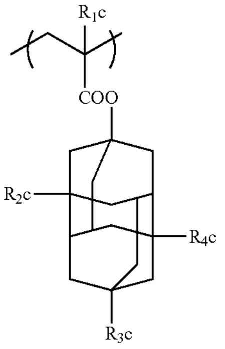

-continued (AIIc)

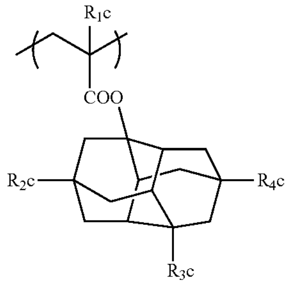

(AIId)

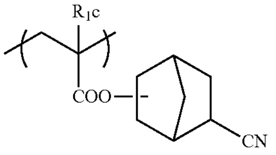

In General Formulae (AIIa) to (AIId), $R_{1c}$ represents a hydrogen atom, a methyl group, a trifluoromethyl group, or a hydroxymethyl group.

$R_{2c}$ to $R_{4c}$, each independently represent a hydrogen atom, a hydroxyl group, or a cyano group. Here, at least one of $R_{2c}$, $R_{3c}$, or $R_{4c}$ represents a hydroxyl group or a cyano group. It is preferable that one or two out of $R_{2c}$ to $R_{4c}$ be hydroxyl groups and the rest be a hydrogen atom. It is more preferable that two out of $R_{2c}$ to $R_{4c}$ be hydroxyl groups and the rest be a hydrogen atom.

The content of the repeating unit having a hydroxyl group or a cyano group with respect to the total content of repeating units in the resin (A) is preferably 5 mol % or more, and more preferably 10 mol % or more. The upper limit thereof is preferably 40 mol % or less, more preferably 35 mol % or less, and even more preferably 30 mol % or less.

Specific examples of the repeating unit having a hydroxyl group or a cyano group will be shown below, but the present invention is not limited thereto.

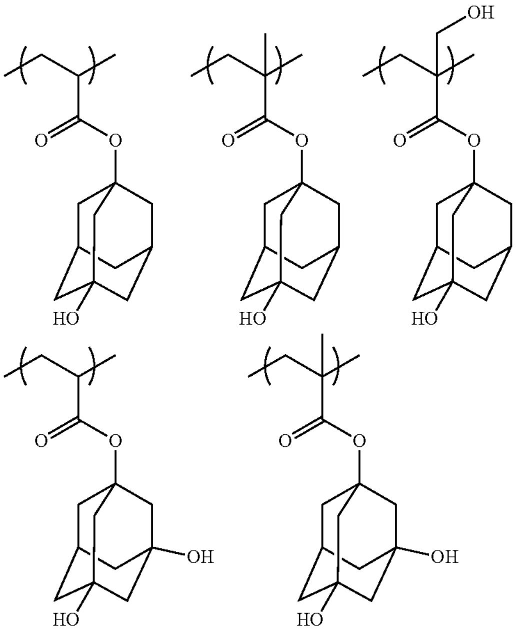

-continued

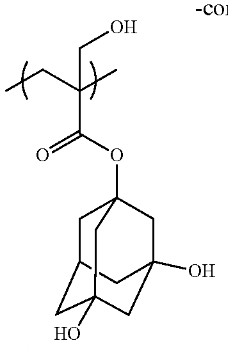
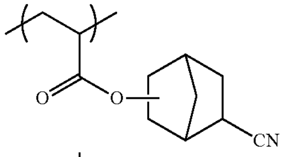
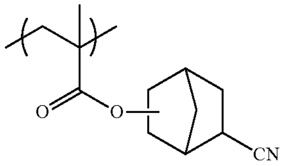
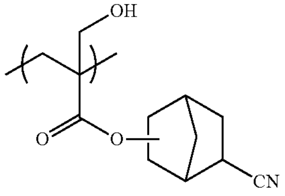
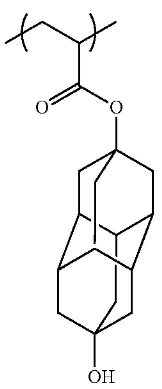
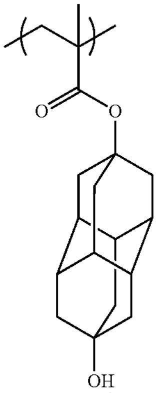
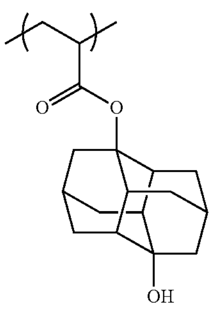
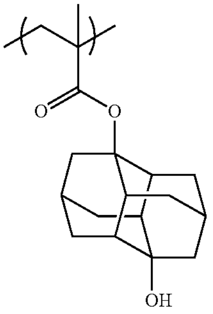

The resin (A) may have a repeating unit having an alkali-soluble group.

Examples of the alkali-soluble group include a carboxyl group, a sulfonamide group, a sulfonylimide group, a bis-sulfonylimide group, and an aliphatic alcohol in which the α-position is substituted with an electron-withdrawing group (for example, a hexafluoroisopropanol group). Among these, a carboxyl group is preferable. In a case where the resin (A) has a repeating unit having an alkali-soluble group, the resolution for contact holes is increased.

Examples of the repeating unit having an alkali-soluble group include a repeating unit having an alkali-soluble group that is directly bonded to the main chain of the resin, such as a repeating unit composed of an acrylic acid or a methacrylic acid, and a repeating unit having an alkali-soluble group that is bonded to the main chain of the resin through a linking group. The linking group may have a monocyclic or polycyclic hydrocarbon structure.

As the repeating unit having an alkali-soluble group, a repeating unit composed of an J acrylic acid or a methacrylic acid is preferable.

The content of the repeating unit having an alkali-soluble group with respect to the total content of repeating units in the resin (A) is preferably 0 mol % or more, more preferably 3 mol % or more, and even more preferably 5 mol % or more. The upper limit thereof is preferably 20 mol % or less, more preferably 15 mol % or less, and even more preferably 10 mol % or less.

Specific examples of the repeating unit having an alkali-soluble group will be shown below, but the present invention is not limited thereto. In the specific examples, Rx represents H, $CH_3$, $CH_2OH$, or $CF_3$.

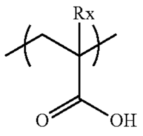
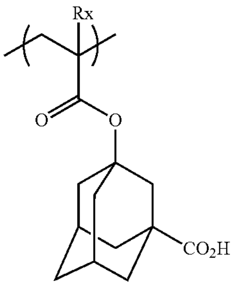
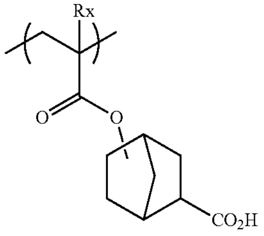
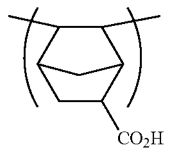
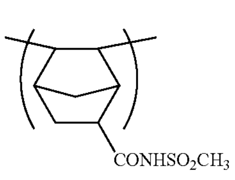
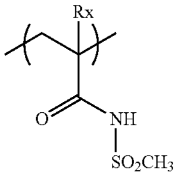
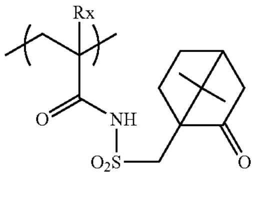
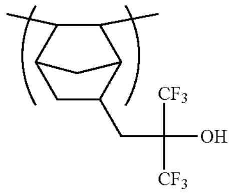

-continued

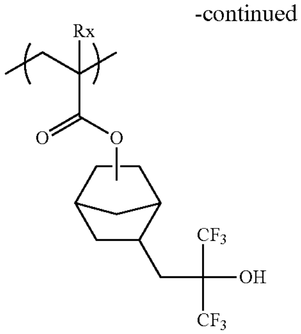

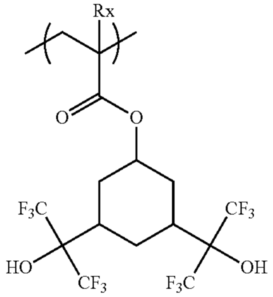

As the repeating unit having at least one group selected from a lactone group, a hydroxyl group, a cyano group, and an alkali-soluble group, a repeating unit having at least two groups selected from a lactone group, a hydroxyl group, a cyano group, and an alkali-soluble group is preferable, a repeating unit having a cyano group and a lactone group is more preferable, and a repeating unit having a structure in which a cyano group is substituted with a lactone structure represented by General Formula (LC1-4) is even more preferable.

<<Repeating Unit Having Alicyclic Hydrocarbon Structure and not Exhibiting Acid Decomposability>>

The resin (A) may have a repeating unit which has an alicyclic hydrocarbon structure and does not exhibit acid decomposability. In a case where the resin (A) has such a repeating unit, the elution of low-molecular-weight components to the immersion liquid from the resist film during immersion exposure can be reduced. Examples of such a repeating unit include a repeating unit derived from 1-adamantyl (meth)acrylate, diamantyl (meth)acrylate, tricyclodecanyl (meth)acrylate, or cyclohexyl (meth)acrylate.

<<Repeating Unit Represented by General Formula (III) Having Neither Hydroxyl Group Nor Cyano Group>>

The resin (A) may have a repeating unit represented by General Formula (III) that has neither a hydroxyl group nor a cyano group.

(III)

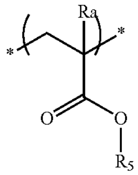

In General Formula (III), $R_5$ represents a hydrocarbon group that has at least one cyclic structure and has neither a hydroxyl group nor a cyano group.

Ra represents a hydrogen atom, an alkyl group, or a $—CH_2—O—Ra_2$ group. In the formula, $Ra_2$ represents a hydrogen atom, an alkyl group, or an acyl group.

The cyclic structure that $R_5$ has includes a monocyclic hydrocarbon group and a polycyclic hydrocarbon group. Examples of the monocyclic hydrocarbon group include a cycloalkyl group having 3 to 12 carbon atoms (more preferably 3 to 7 carbon atoms) and a cycloalkenyl group having 3 to 12 carbon atoms.

Examples of the polycyclic hydrocarbon group include a ring assembly hydrocarbon group and a crosslinked cyclic hydrocarbon group.

Examples of the crosslinked cyclic hydrocarbon ring include a bicyclic hydrocarbon ring, a tricyclic hydrocarbon ring, a tetracyclic hydrocarbon ring, and the like. The crosslinked cyclic hydrocarbon ring also includes a fused ring composed of a plurality of 5- to 8-membered cycloalkane rings fused together.

As the crosslinked cyclic hydrocarbon group, a norbornyl group, an adamantyl group, a bicyclooctanyl group, or a tricyclo[$5,2,1,0^{2,6}$]decanyl group is preferable, and a norbonyl group or an adamantyl group is more preferable.

The alicyclic hydrocarbon group may have a substituent. Examples of the substituent include a halogen atom, an alkyl group, a hydroxyl group protected with a protective group, and an amino group protected with a protective group.

The halogen atom is preferably a bromine atom, a chlorine atom, or a fluorine atom.

The alkyl group is preferably a methyl group, an ethyl group, a butyl group, or a t-butyl group.

The alkyl group may further have a substituent. Examples of the substituent include a halogen atom, an alkyl group, a hydroxyl group protected with a protective group, and an amino group protected with a protective group.

Examples of the protective group include an alkyl group, a cycloalkyl group, an aralkyl group, a substituted methyl group, a substituted ethyl group, an alkoxycarbonyl group, and an aralkyloxycarbonyl group.

The alkyl group is preferably an alkyl group having-1 to 4 carbon atoms.

As the substituted methyl group, a methoxymethyl group, a methoxythiomethyl group, a benzyloxymethyl group, a t-butoxymethyl group, or a 2-methoxyethoxymethyl group is preferable.

As the substituted ethyl group, a 1-ethoxyethyl group or a 1-methyl-1-methoxyethyl group is preferable.

As the acyl group, an aliphatic acyl group having 1 to 6 carbon atoms, such as a formyl group, an acetyl group, a propionyl group, a butyryl group, an isobutyryl group, a valeryl group, or a pivaloyl group, is preferable.

As the alkoxycarbonyl group, an alkoxycarbonyl group having 1 to 4 carbon atoms is preferable.

The content of the repeating unit represented by General Formula (III) that has neither a hydroxyl group nor a cyano group with respect to the total content of repeating units in the resin (A) is preferably 0 to 40 mol %, and more preferably 0 to 20 mol %.

Specific examples of the repeating unit represented by General Formula (III) will be shown below, but the present invention is not limited thereto. In the formulae, Ra represents H, $CH_3$, $CH_2OH$, or $CF_3$.

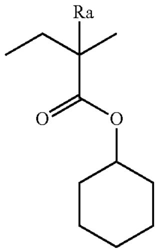
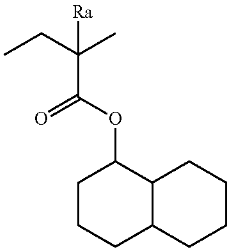
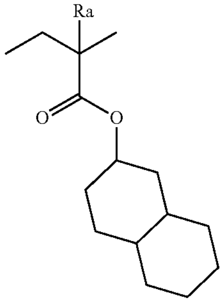
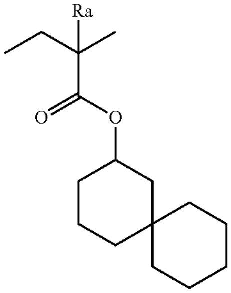
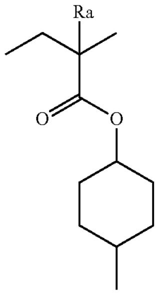
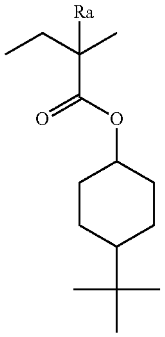
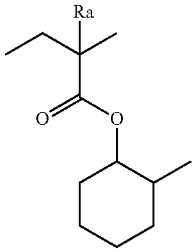
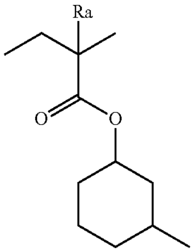
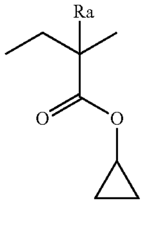
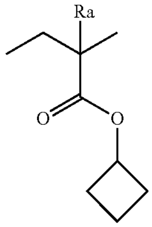
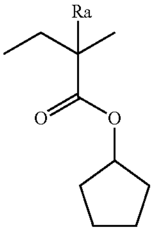
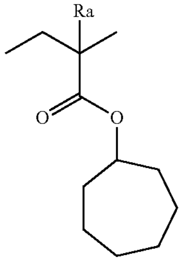
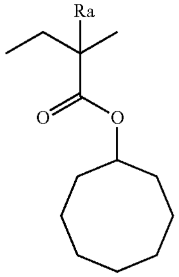

-continued

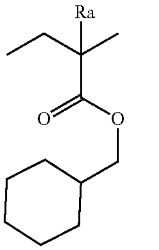
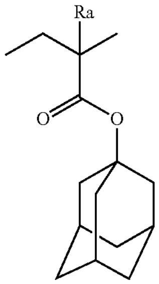
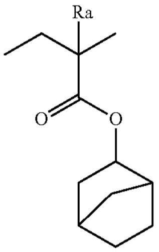
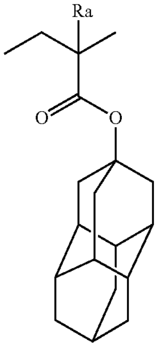
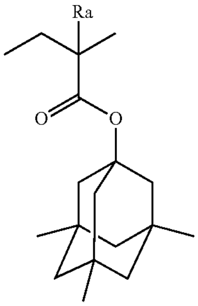
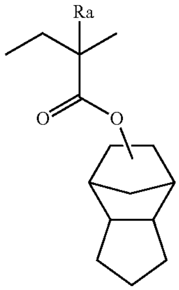

<<Other Repeating Units>>

The resin (A) may have repeating units other than the aforementioned repeating units.

For example, the resin (A) may have a repeating unit selected from the group consisting of a repeating unit having an oxathiane ring group, a repeating unit having an oxazolone ring group, a repeating unit having a dioxane ring group, and a repeating unit having a hydantoin ring group.

Examples of such a repeating unit will be shown below.

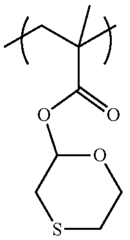
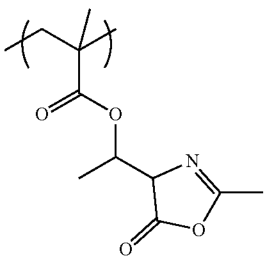

-continued

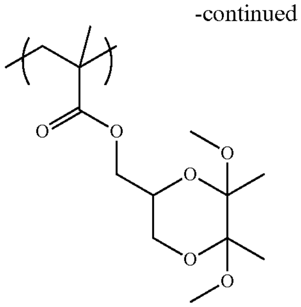

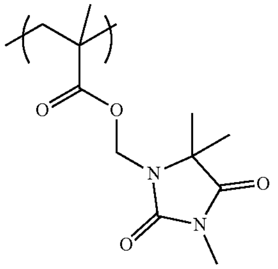

For the purpose of controlling dry etching resistance, suitability for a standard developer, substrate adhesiveness, resist profile, resolution, heat resistance, sensitivity, and the like, the resin (A) may have various repeating structural units in addition to the repeating structural units described above.

It is preferable that all the repeating units of the resin (A) be composed of (meth)acrylate-based repeating units (particularly, in a case where the composition is used for ArF exposure). In this case, it is possible to use all of the resin in which all of the repeating units are methacrylate-based repeating units, the resin in which all of the repeating units are acrylate-based repeating units, and a resin in which all of the repeating units are methacrylate-based repeating units and acrylate-based repeating units. The content of the acrylate-based repeating units is preferably 50 mol % or less with respect to the total content of repeating units.

The resin (A) can be synthesized according to a conventional method (for example, radical polymerization).

The polystyrene-equivalent weight-average molecular weight of the resin (A) that is determined by GPC method is preferably 1,000 to 200,000, more preferably 3,000 to 20,000, and even more preferably 5,000 to 15,000. In a case where the weight-average molecular weight of the resin (A) is 1,000 to 200,000, deterioration of heat resistance and dry etching resistance can be further suppressed. In addition, deterioration of developability and deterioration of film-forming properties resulting from an increase in viscosity can be further suppressed.

The dispersity (molecular weight distribution) of the resin (A) is generally 1 to 5, preferably 1 to 3, more preferably 1.2 to 3.0, and even more preferably 1.2 to 2.0. The smaller the dispersity, the better the resolution and resist shape, the smoother the side wall of the resist pattern, and the better the roughness.

In the resist composition, the content of the resin (A) with respect to the total solid content of the resist composition is preferably 50% to 99.9% by mass, and more preferably 60% to 99.0% by mass.

The solid content means components of the resist composition excluding a solvent. All the components of the resist composition other than a solvent are regarded as solid content even though the components are liquid components.

One resin (A) may be used, or a plurality of resins (A) may be used in combination.

<Compounds Generating Acid by Actinic Ray or Radiation (Photo Acid Generator)>

It is preferable that the chemically amplified resist composition contain a compound that generates an acid by an actinic ray or radiation (hereinafter, also called "photo acid generator (PAG)").

The photo acid generator may be in the form of a low-molecular-weight compound, or may be in the form of a compound incorporated into a part of a polymer. Furthermore, the photo acid generator in the form of a low-molecular-weight compound and the photo acid generator in the form of a compound incorporated into a part of a polymer may be used in combination.

In a case where the photo acid generator is in the form of a low-molecular-weight compound, the molecular weight of the photo acid generator is preferably 3,000 or less, more preferably 2,000 or less, and even more preferably 1,000 or less. The lower limit thereof is often 50 or more.

In a case where the photo acid generator is in the form of a compound incorporated into a part of a polymer, this compound may be incorporated into a part of the resin (A) or into a resin different from the resin (A).

In the present invention, the photo acid generator is preferably in the form of a low-molecular-weight compound.

The photo acid generator is not particularly limited as long as it is a known photo acid generator. The photo acid generator is preferably a compound that generates at least any organic acid, such as a sulfonic acid, bis(alkylsulfonyl) imide, or tris(alkylsulfonyl)methide, by the irradiation with an actinic ray or radiation, preferably by electron beams or extreme ultraviolet.

More preferred examples of the photo acid generator include compounds represented by General formulae (ZI), (ZII), and (ZIII).

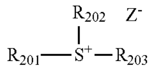

(ZI)

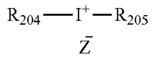

(ZII)

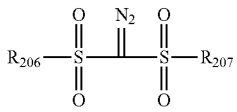

(ZIII)

In General Formula (ZI), $R_{201}$, $R_{202}$, and $R_{203}$ each independently represent an organic group.

The number of carbon atoms in the organic group as $R_{201}$, $R_{202}$, and $R_{203}$ is preferably 1 to 30, and more preferably 1 to 20.

Two out of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two out of $R_{201}$ to $R_{203}$ include an alkylene group (for example, a butylene group or a pentylene group).

$Z^-$ represents a non-nucleophilic anion (anion with a significantly low ability to induce a nucleophilic reaction).

Examples of the non-nucleophilic anion include a sulfonate anion (such as an aliphatic sulfonate anion, an aromatic sulfonate anion, or a camphorsulfonate anion), a carboxylate anion (such as an aliphatic carboxylate anion, an aromatic carboxylate anion, or an aralkylcarboxylate anion), a sulfonylimide anion, a bis(alkylsulfonyl)imide anion, a tris(alkylsulfonyl)methide anion, and the like.

The aliphatic moiety in the aliphatic sulfonate anion and the aliphatic carboxylate anion may be an alkyl group or a cycloalkyl group. As the aliphatic moiety, for example, a linear or branched alkyl group having 1 to 30 carbon atoms and a cycloalkyl group having 3 to 30 carbon atoms are preferable.

As the aromatic group in the aromatic sulfonate anion and the aromatic carboxylate anion, an aryl group having 6 to 14 carbon atoms is preferable. Examples thereof include a phenyl group, a tolyl group, a naphthyl group, and the like.

The alkyl group, cycloalkyl group, and aryl group described above may have a substituent. Specific examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms), and the like. Regarding the aryl group and the ring structure that each group has, examples of the substituent thereof include an alkyl group (preferably having 1 to 15 carbon atoms).

The aralkyl group in the aralkylcarboxylate anion is preferably an aralkyl group having 7 to 12 carbon atoms. Examples thereof include a benzyl group, a phenethyl group, a naphthylmethyl group, a naphthylethyl group, a naphthylbutyl group, and the like.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of substituents of these alkyl groups include a halogen atom, an alkyl group substituted with a halogen atom, an alkoxy group, an alkylthio group, an alkyloxysulfonyl group, an aryloxysulfonyl group, a cycloalkylaryloxysulfonyl group, and the like. Among these, a fluorine atom or an alkyl group substituted with a fluorine atom is preferable.

The alkyl groups in the bis(alkylsulfonyl)imide anion may be bonded to each other to form a ring structure. The formation of a ring structure increases acid strength.

Examples of other non-nucleophilic anions include fluorinated phosphorus (for example, $PF_6^-$), fluorinated boron (for example, $BF_4^-$), fluorinated antimony (for example, $SbF_6^-$), and the like.

As the non-nucleophilic anion, an aliphatic sulfonate anion in which at least the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. As the non-nucleophilic anion, a perfluoroaliphatic sulfonate anion (preferably having 4 to 8 carbon atoms) or benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is even more preferable.

From the viewpoint of acid strength or sensitivity, pKa of the generated acid is preferably −1 or less.

Examples of preferred aspects of the non-nucleophilic anion also include an anion represented by General Formula (AN1).

(AN1)

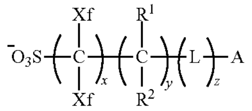

In the formula, Xf each independently represents a fluorine atom or an alkyl group substituted with at least one fluorine atom.

$R^1$ and $R^2$ each independently represent a hydrogen atom, a fluorine atom, or an alkyl group. In a case where there is a plurality of $R^1$'s and $R^2$'s, $R^1$'s may be the same or different from each other, and $R^2$'s may be the same or different from each other.

L represents a divalent linking group. In a case where there is a plurality of Ls in the formula, Ls may be the same or different from each other.

A represents a cyclic organic group.

x represents an integer of 1 to 20, y represents an integer of 0 to 10, and z represents an integer of 0 to 10.

General Formula (AN1) will be more specifically described.

The number of carbon atoms of the alkyl group in the alkyl group substituted with a fluorine atom represented by Xf is preferably 1 to 10, and more preferably 1 to 4. As the alkyl group substituted with a fluorine atom represented by Xf, a perfluoroalkyl group is preferable. As Xf, a fluorine atom or a perfluoroalkyl group having 1 to 4 carbon atoms is preferable. Specific examples of Xf include fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable.

It is particularly preferable that Xf on both sides represent a fluorine atom.

The alkyl group represented by $R^1$ and $R^2$ may have a substituent (preferably a fluorine atom) preferably having 1 to 4 carbon atoms. Particularly, the alkyl group represented by $R^1$ and $R^2$ is preferably a perfluoroalkyl group having 1 to 4 carbon atoms. Specific examples of alkyl group having a substituent represented by $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

As $R^1$ and $R^2$, a fluorine atom or $CF_3$ is preferable.

x is preferably 1 to 10, and more preferably 1 to 5.

y is preferably 0 to 4, and more preferably 0.

z is preferably 0 to 5, and more preferably 0 to 3.

The divalent linking group represented by L is not particularly limited. Examples thereof include —COO—, —OCO—, —CO—, —O—, —S—, —SO—, —$SO_2$—, an alkylene group, a cycloalkylene group, an alkenylene group, a linking group consisting of a plurality of these groups linked to each other, and the like. Among these, a linking group having 12 or less carbon atoms in total is preferable. Furthermore, —COO—, —OCO—, —CO—, or —O— is preferable, and —COO— or —OCO— is more preferable.

In General Formula (AN1), as a combination of partial structures other than A, $SO_3^-$—$CF_2$—$CH_2$—OCO—, $SO_3^-$—$C_{F2}$—CHF—$CH_{22}$—OCO—, $SO_3$—$CF_2$—COO—, $SO_3^-$—$CF_2$—$CF_2$—$CH_2$—, and $SO_3^-$—$CF_2$—$CH(CF_3)$—OCO— are preferable.

The cyclic organic group represented by A is not particularly limited as long as it has a cyclic structure. Examples thereof include an alicyclic group, an aryl group, a heterocyclic group (not only an aromatic heterocyclic group but also an non-aromatic heterocyclic group), and the like.

The alicyclic group may be monocyclic or polycyclic, and is preferably a monocyclic cycloalkyl group such as a cyclopentyl group, a cyclohexyl group, or a cyclooctyl group and a polycyclic cycloalkyl group such as a norbornyl group, a tricyclodecanyl group, a tetracyclodecanyl group, a tetracyclododecanyl group, or an adamantyl group. Among these, alicyclic groups having a bulky structure having 7 or more carbon atoms, such as a norbornyl group, a tricyclodecanyl group, a tetracyclodecanyl group, a tetracyclododecanyl group, and an adamantyl group, are preferable, because these can suppress diffusion in a film during the post-exposure heating step and improve mask error enhancement factor (MEEF).

Examples of the aryl group include a benzene ring, a naphthalene ring, a phenanthrene ring, and an anthracene ring.

Examples of the heterocyclic group include heterocyclic groups, derived from a furan ring, a thiophene ring, a benzofuran ring, a benzothiophene ring, a dibenzofuran ring, a dibenzothiophene ring, and a pyridine ring. Among these, heterocyclic groups derived from a furan ring, a thiophene ring, or a pyridine ring are preferable.

Examples of the cyclic organic group also include a lactone structure. Specific examples thereof include lactone structures represented by General formulae (LC1-1) to (LC1-17).

LC1-1

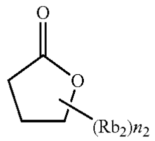

LC1-2

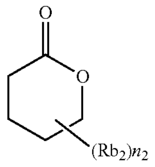

LC1-3

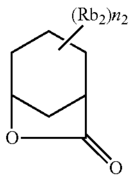

-continued

LC1-4

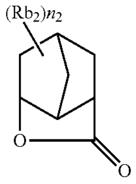

LC1-5

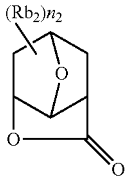

LC1-6

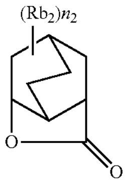

LC1-7

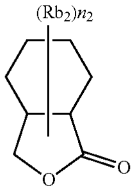

LC1-8

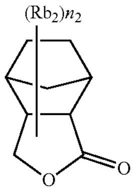

LC1-9

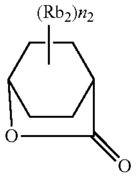

LC1-10

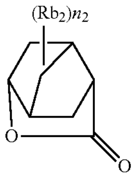

LC1-11

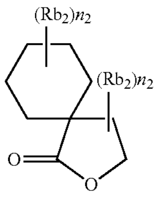

-continued

LC1-12

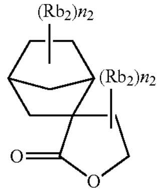

LC1-13

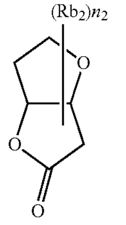

LC1-14

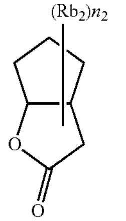

LC1-15

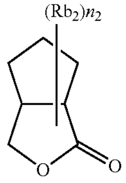

LC1-16

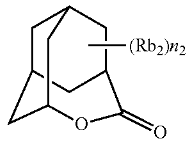

LC1-17

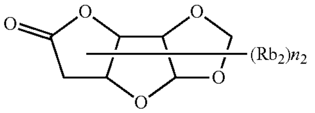

The cyclic organic group may have a substituent. Examples of the substituent include an alkyl group (the alkyl group may be any of a linear, branched, or cyclic alkyl group preferably having 1 to 12 carbon atoms), a cycloalkyl group (the cycloalkyl group may be any of a monocyclic ring, a polycyclic ring, or a spiro ring preferably having 3 to 20 carbon atoms), an aryl group (preferably having 6 to 14 carbon atoms), a hydroxy group, an alkoxy group, an ester group, an amide group, a urethane group, a ureide group, a thioether group, a sulfonamide group, a sulfonate group, and the like. The carbon constituting the cyclic organic group (carbon that contributes to ring formation) may be carbonyl carbon.

The aforementioned substituent corresponds to $Rb_2$ in (LC1-1) to (LC1-17) described above. In (LC1-1) to (LC1-17), n2 represents an integer of 0 to 4. In a case where n2 is an integer of 2 or more, a plurality of $Rb_2$'s may be different from each other or may be bonded to each other to form a ring.

Examples of the organic group represented by $R_{201}$, $R_{202}$, and $R_{203}$ in General Formula (ZI) include an aryl group, an alkyl group, a cycloalkyl group, and the like.

It is preferable that at least one out of $R_{201}$, $R_{202}$, or $R_{203}$ be an aryl group. It is more preferable that all three of these be aryl groups. As the aryl group, in addition to a phenyl group, a naphthyl group, and the like, a heteroaryl group such as an indole residue and a pyrrole residue can also be adopted. As the alkyl group and the cycloalkyl group represented by $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an isopropyl group, a n-butyl group, and the like are preferable. As the cycloalkyl group, a cyclopropyl group, a cyclobutyl group, a cyclopentyl group, a cyclohexyl group, or a cycloheptyl group is preferable. These groups may further have a substituent. Examples of substituents that these groups may further have include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), and the like. However, the substituents are not limited to these.

Next, General formulae (ZII) and (ZIII) will be described.

In General formulae (ZII) and (ZIII), $R_{204}$ to $R_{207}$ each independently represent an aryl group, an alkyl group, or a cycloalkyl group.

The aryl group represented by $R_{204}$ to $R_{207}$ is preferably a phenyl group or a naphthyl group, and more preferably a phenyl group. The aryl group represented by $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, benzothiophene, and the like. As the alkyl group and cycloalkyl group represented by $R_{204}$ to $R_{207}$ include a linear or branched alkyl group having 1 to 10 carbon atoms (for example, a methyl group, an ethyl group, a propyl group, a butyl group, or a pentyl group) or a cycloalkyl group having 3 to 10 carbon atoms (a cyclopentyl group, a cyclohexyl group, or a norbornyl group) is preferable.

The aryl group, alkyl group, and cycloalkyl group represented by $R_{204}$ to $R_{207}$ may have a substituent. Examples of the substituent that the aryl group, alkyl group, and cycloalkyl group represented by $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, a phenylthio group, and the like.

In addition, in General Formula (ZII), $Z^-$ represents a non-nucleophilic anion. Specifically, $Z^-$ in General Formula (ZII) is the same as $Z^-$ in General Formula (ZI), and preferred forms thereof are also the same.

Specific examples of General formulae (ZI) to (ZIII) will be shown below, but the present invention is not limited thereto.

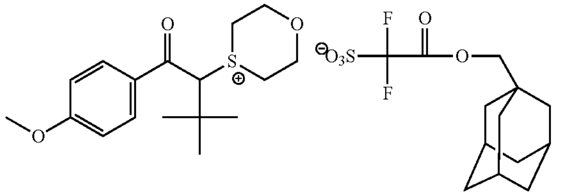

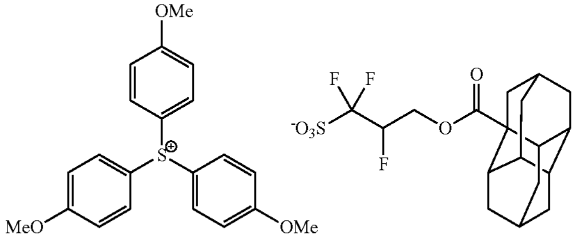

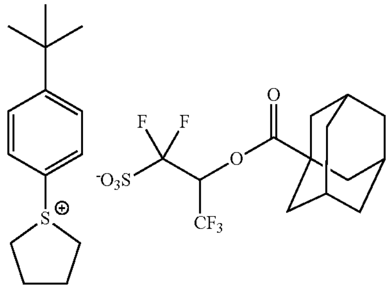

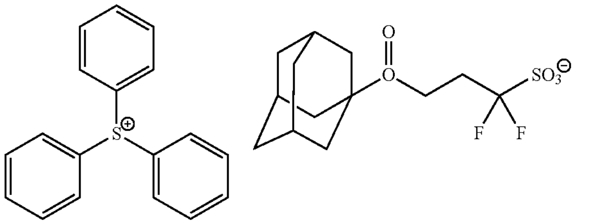

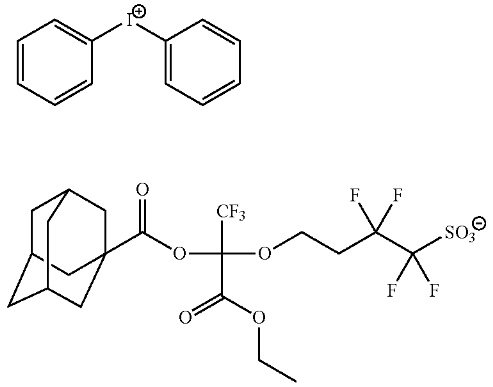

In the present invention, from the viewpoint of suppressing the diffusion of an acid generated by exposure to the non-exposed portion and improving resolution, the aforementioned photo acid generator is a compound that generates an acid (more preferably sulfonic acid) having a volume of 130 Å$^3$ or more by irradiation with an electron beams or extremely ultraviolet rays, more preferably a compound that generates an acid (more preferably sulfonic acid) having a volume of 190 Å$^3$ or more by irradiation with an electron beams or extremely ultraviolet rays, even more preferably a compound that generates an acid (more preferably sulfonic acid) having a volume of 270 Å$^3$ or more by irradiation with an electron beams or extreme ultraviolet rays, and particularly preferably a compound that generates an acid (more preferably sulfonic acid) having a volume of 400 Å$^3$ or more by irradiation with an electron beams or extremely ultraviolet rays. Here, from the viewpoint of sensitivity and solubility in a coating solvent, the volume is preferably 2,000 Å$^3$ or less, and more preferably 1,500 Å$^3$ or less. The above values of volume are determined using "WinMOPAC" manufactured by Fujitsu Limited. First, the chemical structure of the acid relating to each case is input, and then a molecular force field is calculated using the MM3 method by using the aforementioned structure as the initial structure so as to determine the most stable steric conformation of each acid. Thereafter, for the most stable steric conformation, a molecular orbital is calculated using the PM3 method, which makes it possible to calculate "accessible volume" of each acid. Note that 1 Å means 0.1 nm.

In the present invention, a photo acid generator that generates the acids exemplified below by irradiation with actinic rays or radiation is preferable. The calculated values of volume are added to some of the examples (unit: Å$^3$). The calculated values mentioned herein are volumes of acids in which a proton is bonded to an anionic moiety.

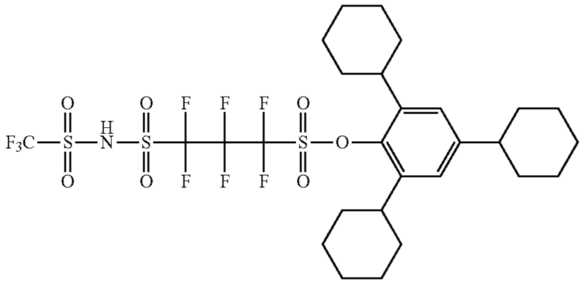

585Å$^3$

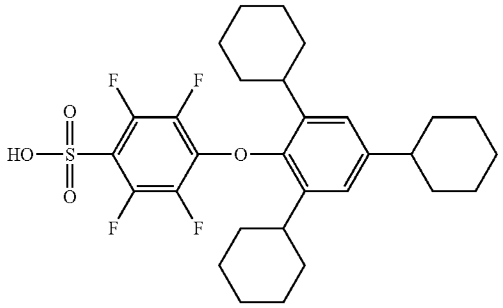

585Å$^3$

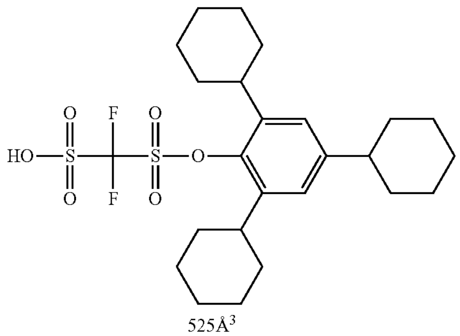

525Å$^3$

-continued
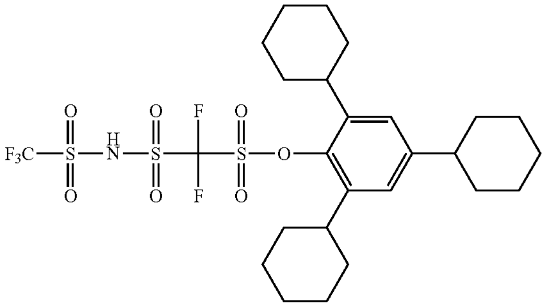
554Å$^3$
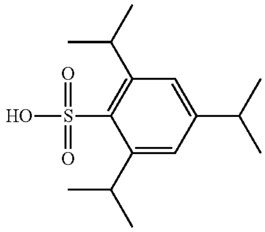
303Å$^3$
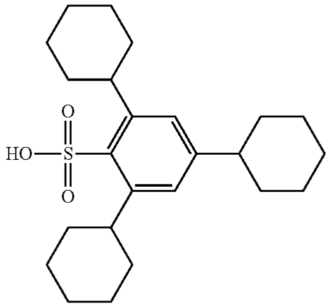
437Å$^3$
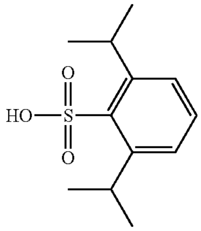
244Å$^3$
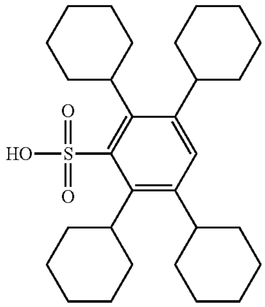
529Å$^3$
-continued
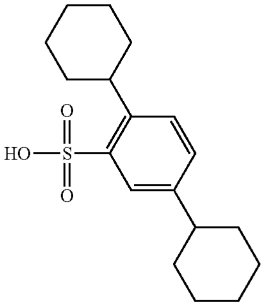
336Å$^3$
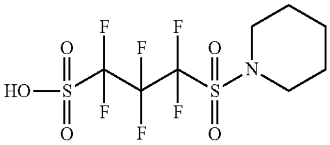
244Å$^3$
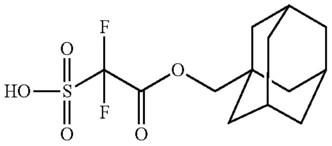
271Å$^3$
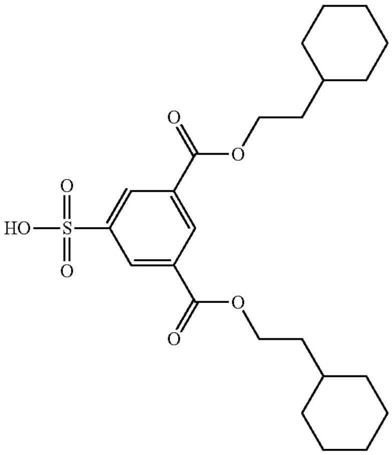
457Å$^3$
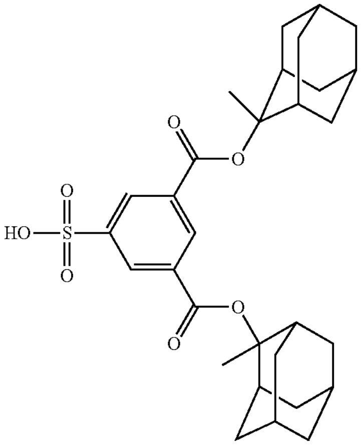
511Å$^3$ -continued
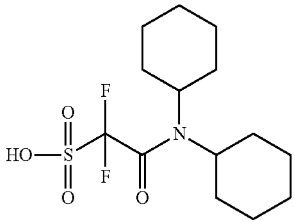
311Å$^3$
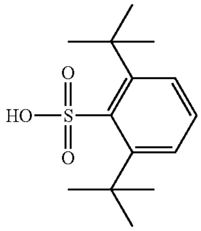
280Å$^3$
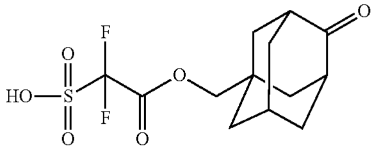
266Å$^3$
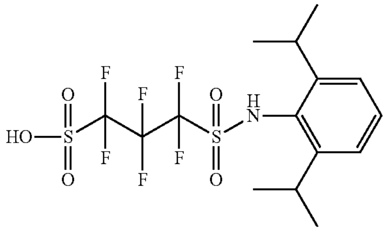
339Å$^3$
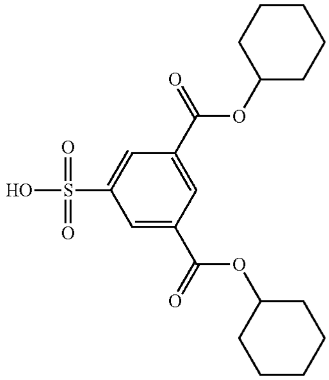
380Å$^3$
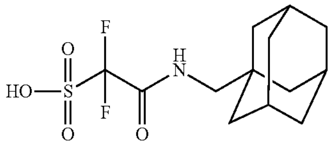
277Å$^3$
-continued
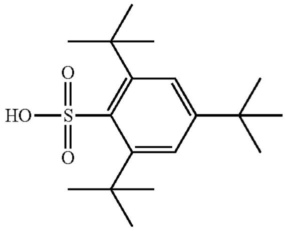
357Å$^3$
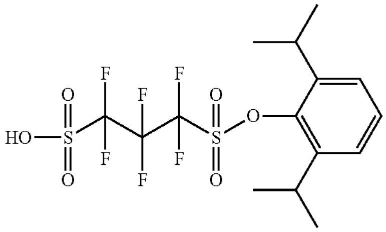
347Å$^3$
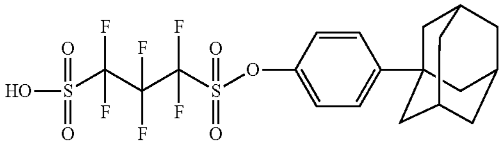
380Å$^3$
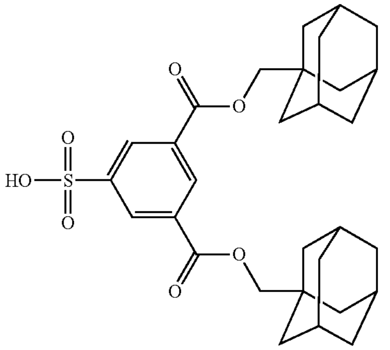
519Å$^3$
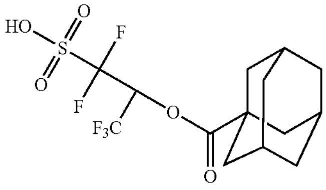
291Å$^3$
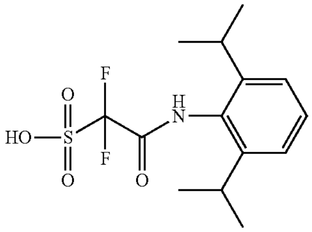
297Å$^3$ -continued

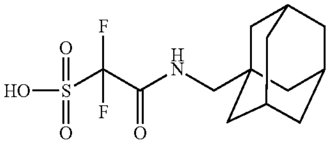

277Å$^3$

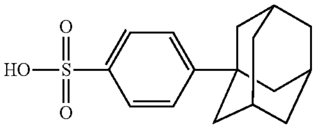

281Å$^3$

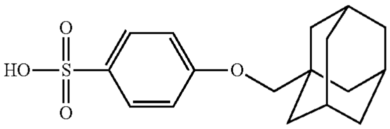

310Å$^3$

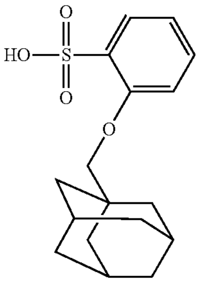

309Å$^3$

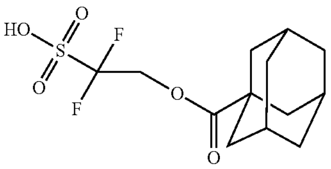

270Å$^3$

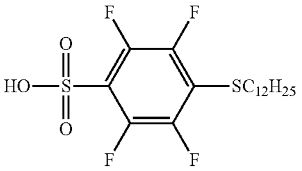

393Å$^3$

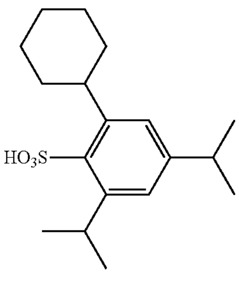

350Å$^3$

-continued

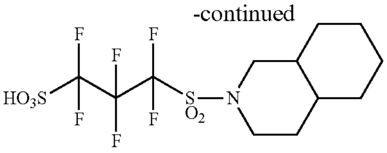

311Å$^3$

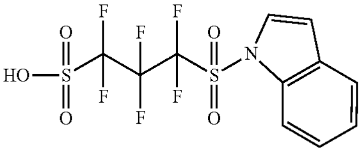

250Å$^3$

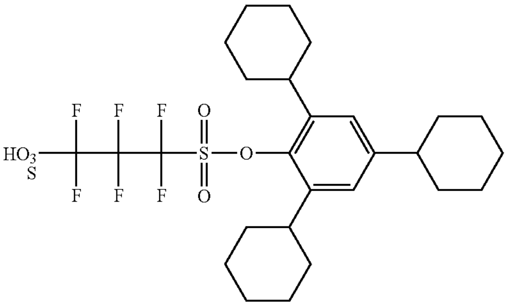

535Å$^3$

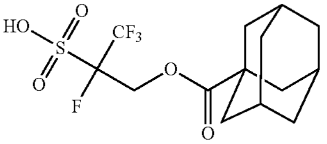

290Å$^3$

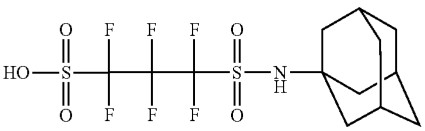

315Å$^3$

Examples of the photo acid generator include those described in paragraphs "0368" to "0377" of JP2014-41328A and paragraphs "0240" to "0262" of JP2013-228681A (paragraph "0339" of US2015/004533A as the corresponding specification). What are described in these documents are incorporated into the present specification. Specifically, for example, the following compounds are also preferable, but the present invention is not limited thereto.

(z1)
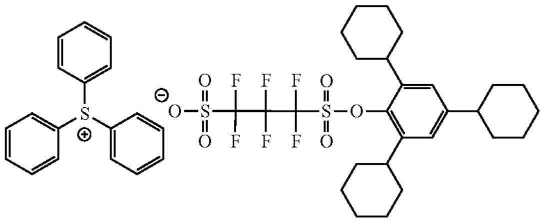
(z2)
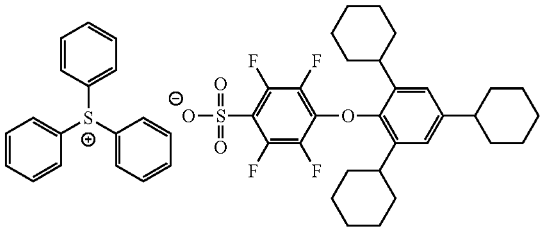
(z3)
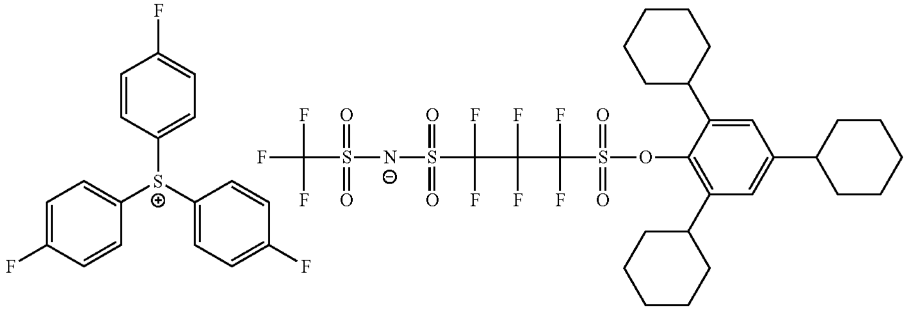
(z4)
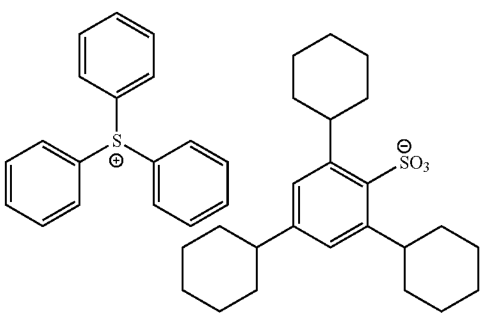
(z5)
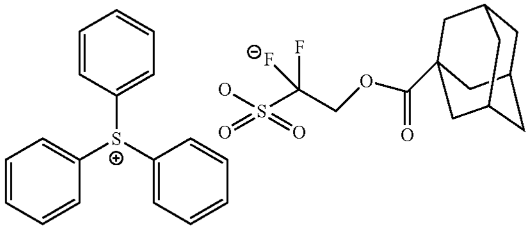
(z6)
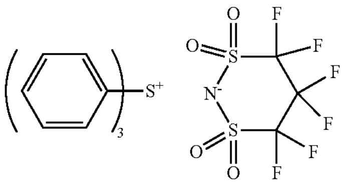
(z7)
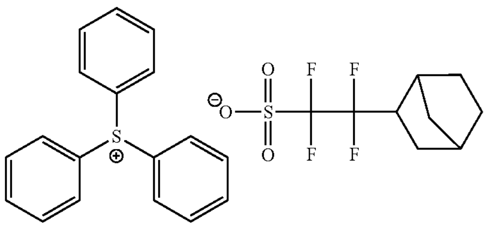
(z8)
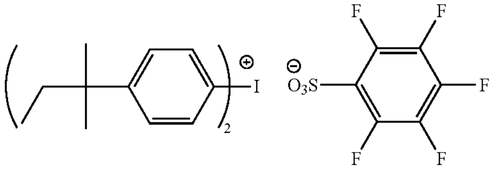
(z9)
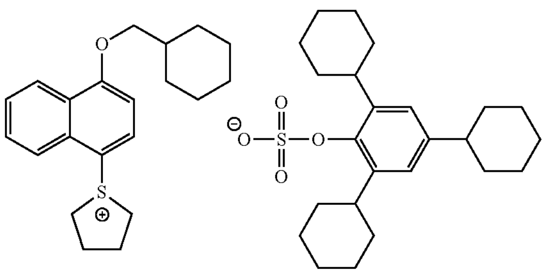

-continued
(z10)
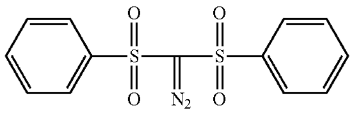
(z11)
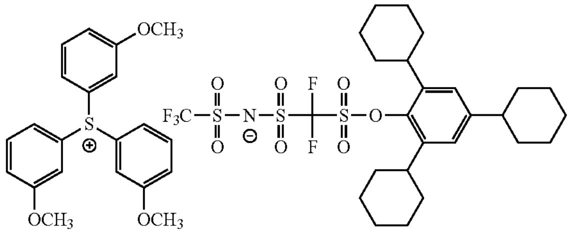
(z12)
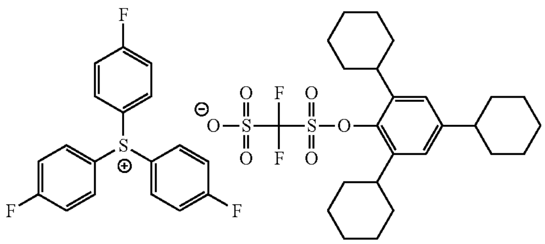
(z13)
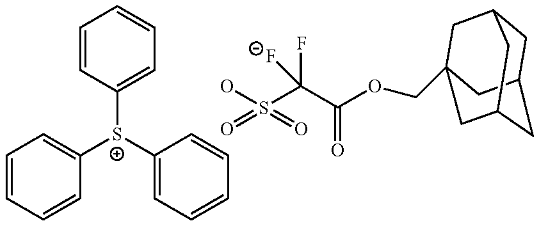
(z14)
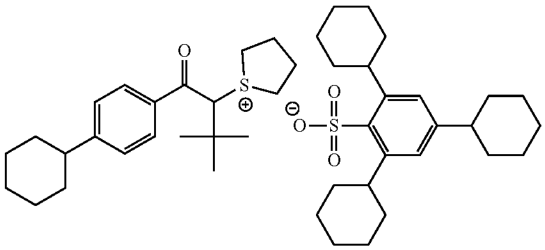
(z15)
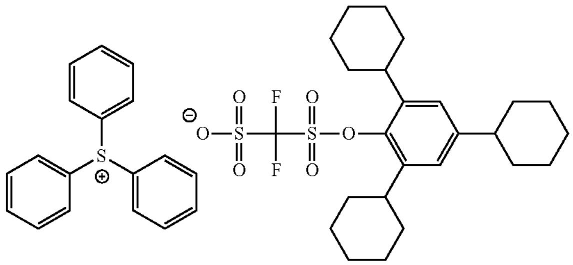
(z16)
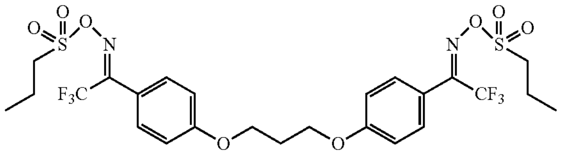
(z17)
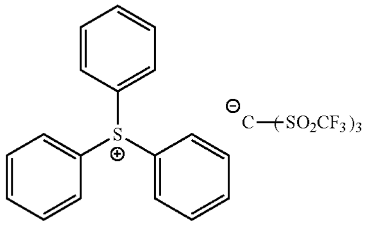
(z18)
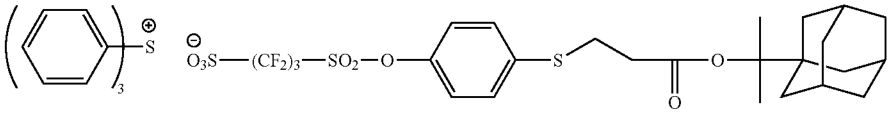
(z19)
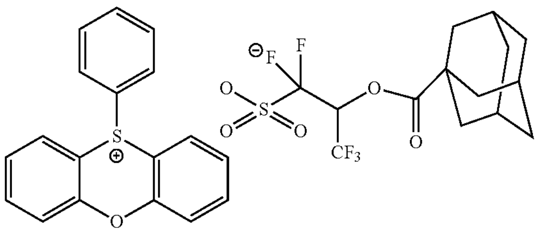
(z20)
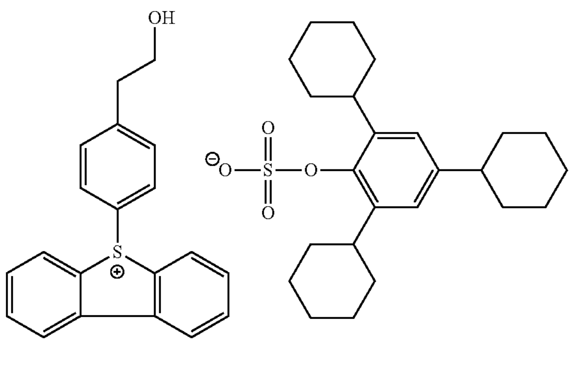

-continued
(z21)
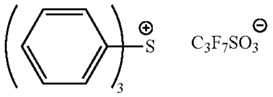
(z22)
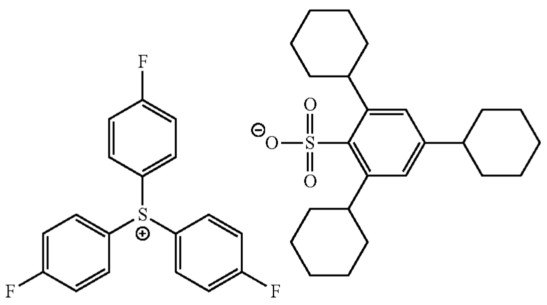
(z23)
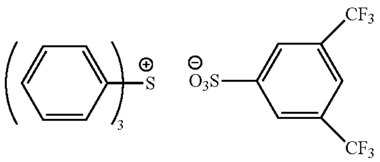
(z24)
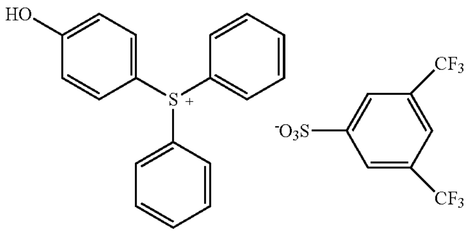
(z25)
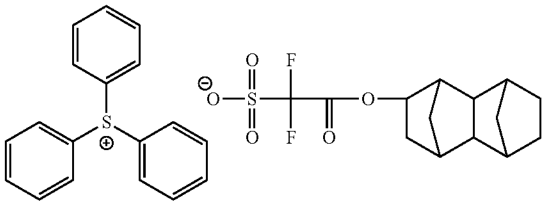
(z26)
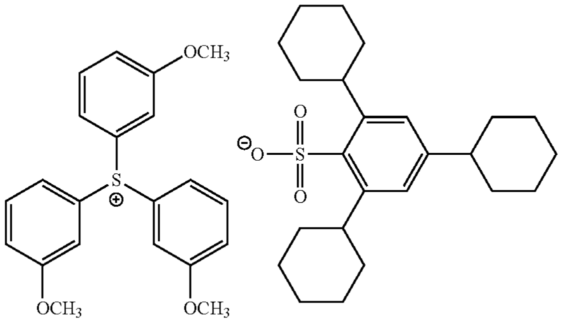
(z27)
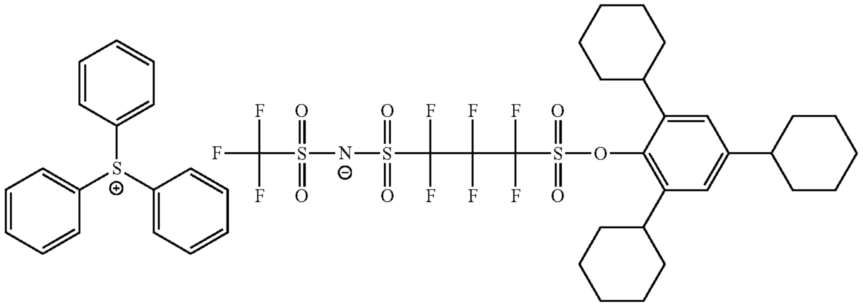
(z28)
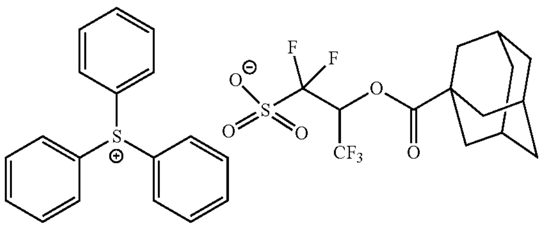
(z29)
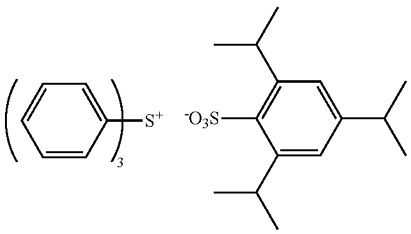

-continued
(z30)
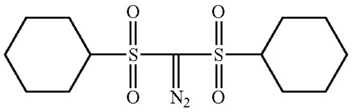
B-1
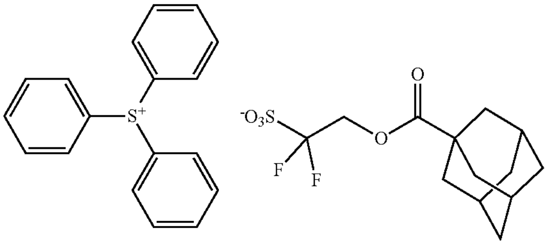
B-2
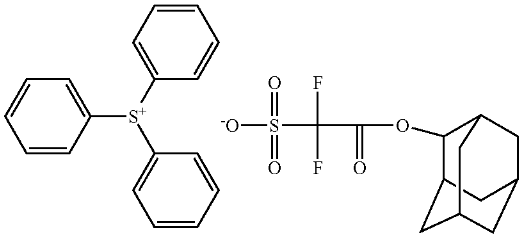
B-3
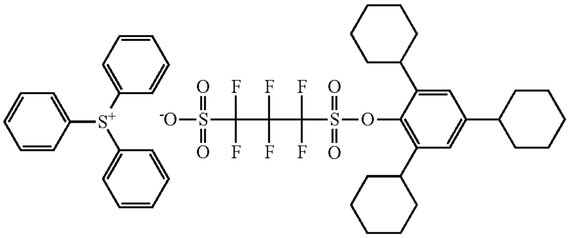
B-4
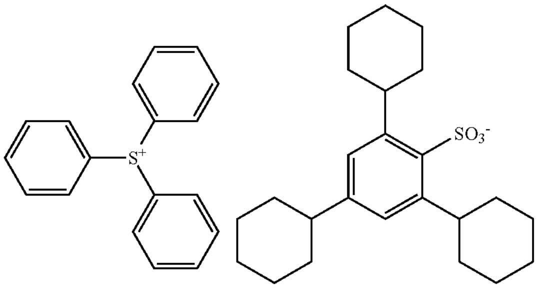
B-5
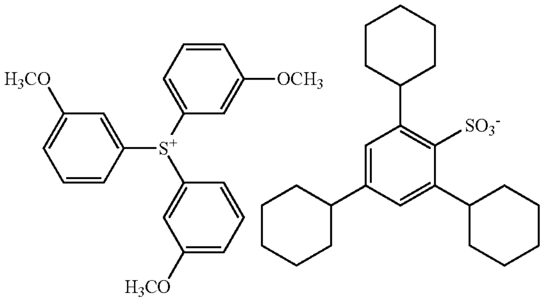
B-6
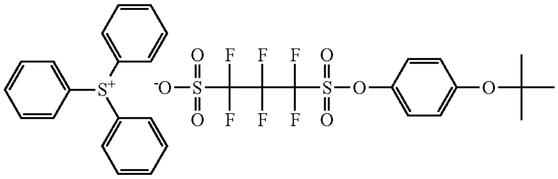
B-7
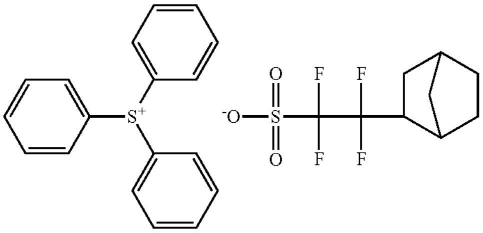
B-8
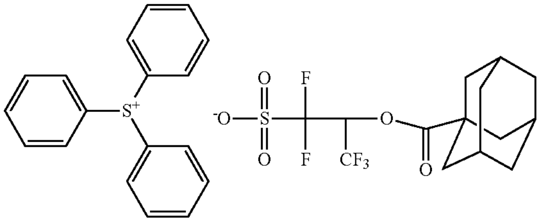
B-9
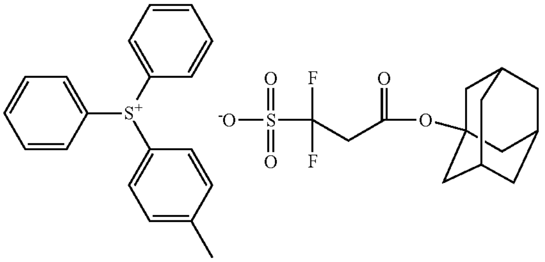

-continued

B-10

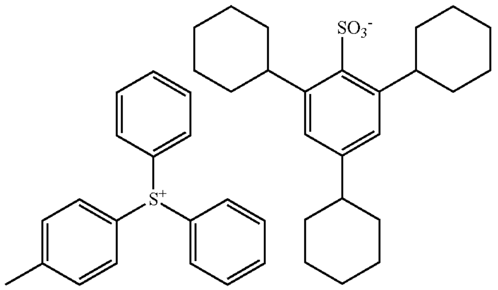

B-11

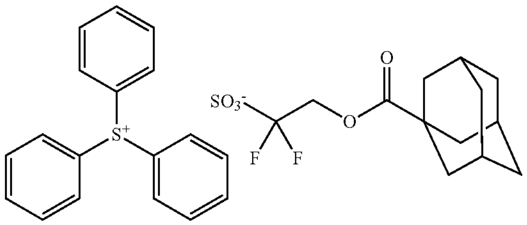

B-12

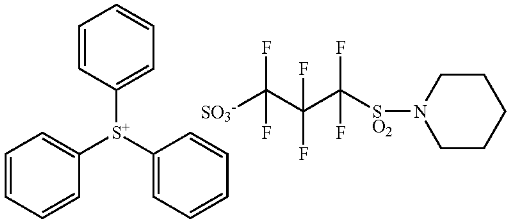

B-13

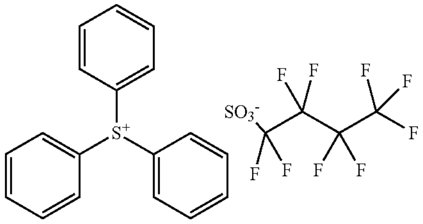

One photo acid generator can be used alone, or two or more photo acid generators can be used in combination.

The content of the photo acid generator in the resist composition with respect to the total solid content of the resist composition is preferably 0.1% to 50% by mass, more preferably 5% to 50% by mass, and even more preferably 8% to 40% by mass. Particularly, in order to achieve both the high sensitivity and high resolution in the case of exposure to electron beams or extreme ultraviolet, it is preferable that the content of the photo acid generator be high. From the viewpoint described above, the content of the photo acid generator is preferably 10% to 40% by mass, and more preferably 10% to 35% by mass.

<Solvent>

In preparing the resist composition by dissolving the components described above, a solvent can be used. Examples of the solvent that can be used include solvents such as alkylene glycol monoalkyl ether carboxylate, alkylene glycol monoalkyl ether, a alkyl lactate, alkyl alkoxypropionate, cyclic lactone having 4 to 10 carbon atoms, a monoketone compound having 4 to 10 carbon atoms that may have a ring, alkylene carbonate, alkoxyalkyl acetate, and alkyl pyruvate.

Examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Examples of the alkyl lactate include methyl lactate, ethyl lactate, propyl lactate, and butyl lactate.

Examples of the alkyl alkoxypropionate include ethyl 3-ethoxypropionate, methyl 3-methoxypropionate, methyl 3-ethoxypropionate, and ethyl 3-methoxypropionate.

Examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Examples of the monoketone compound having 4 to 10 carbon atoms that may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Examples of the alkylene carbonate include propylene carbonate, vinylene carbonate, ethylene carbonate, and butylene carbonate.

Examples of the alkoxyalkyl acetate include acetic acid-2-methoxyethyl, acetic acid-2-ethoxyethyl, acetic acid-2-(2-ethoxyethoxy)ethyl, acetic acid-3-methoxy-3-methylbutyl, and acetic acid-1-methoxy-2-propyl.

Examples of the alkyl pyruvate include methyl pyruvate, ethyl pyruvate, and propyl pyruvate.

Among these solvents, a solvent having a boiling point of 130° C. or higher at normal temperature and normal pressure is preferable. Specifically, examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid-2-ethoxyethyl, acetic acid-2-(2-ethoxyethoxy)ethyl, and propylene carbonate.

Each of the above solvents may be used alone, or two or more of the above solvents may be used.

In the present invention, as a solvent, a mixed solvent obtained by mixing a solvent that contains a hydroxyl group in the structure and a solvent that does not contain a hydroxyl group may be used.

Examples of the solvent that contains a hydroxyl group include ethylene glycol, ethylene glycol monomethyl ether, ethylene glycol monoethyl ether, propylene glycol, propylene glycol monomethyl ether, propylene glycol monoethyl ether, ethyl lactate, and the like. Among these, propylene glycol monomethyl ether or ethyl lactate is preferable.

Examples of the solvent that does not contain a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, dimethyl sulfoxide, and the like. Among these, propylene glycol monomethyl ether acetate, ethyl ethoxypropionate, 2-heptanone, γ-butyrolactone, cyclohexanone, or butyl acetate is preferable, and propylene glycol monomethyl ether acetate, ethyl ethoxypropionate, or 2-heptanone is more preferable.

The mass ratio of the content of the solvent that contains a hydroxyl group to the solvent that does not contain a hydroxyl group [mass of solvent containing hydroxyl group that is contained in mixed solvent/mass of the solvent not containing hydroxyl group that is contained in mixed solvent] is preferably 1/99 to 99/1, more preferably 10/90 to 90/10, and even more preferably 20/80 to 60/40. In view of coating uniformity, the mass of the solvent that does not contain a hydroxyl group is preferably 50% by mass or more in the mixed solvent.

The aforementioned solvent is preferably a mixed solvent of two or more solvents including propylene glycol monomethyl ether acetate, and more preferably a combination of γ-butyl lactone and butyl acetate.

As the solvent, for example, the solvents described in paragraphs "0013" to "0029" of JP2014-219664A can also be used.

<Acid Diffusion Control Agent>

In order to reduce a performance change that may occur with the passage of time from exposure to heating, it is preferable that the resist composition contain an acid diffusion control agent.

Examples of the acid diffusion control agent include basic compounds.

Examples of the basic compound include compounds having structures represented by formulae (A1) to (E1).

(A1)

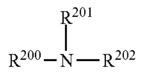

(B1)

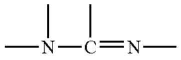

(C1)

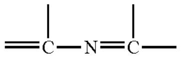

(D1)

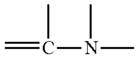

(E1)

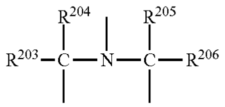

$R^{200}$, $R^{201}$, and $R^{202}$ in General formulae (A1) and (E1) may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms). $R^{201}$ and $R^{202}$ may be bonded to each other to form a ring.

The aforementioned alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same as or different from each other, and each represent an alkyl group having 1 to 20 carbon atoms.

The alkyl group in General formulae (A1) and (E1) is preferably unsubstituted.

Examples of the compound having a structure represented by General formulae (A1) to (E1) include guanidine, aminopyrrolidine, pyrazole, pyrazoline, piperazine, aminomorpholine, aminoalkylmorpholine, piperidine, a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, an aniline derivative having a hydroxyl group and/or an ether bond, and the like.

Examples of the compound having an imidazole structure include imidazole, 2,4,5-triphenylimidazole, benzimidazole, and the like. Examples of the compound having a diazabicyclo structure include 1,4-diazabicyclo[2,2,2]octane, 1,5-diazabicyclo[4,3,0]non-5-ene, 1,8-diazabicyclo[5, 4,0]undec-7-ene, and the like. Examples of the compound having an onium hydroxide structure include triarylsulfonium hydroxide, phenacylsulfonium hydroxide, and sulfonium hydroxide having a 2-oxoalkyl group. Specifically, examples thereof include triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide, and the like.

The compound having an onium carboxylate structure is a compound having an onium hydroxide structure in which an anionic moiety is carboxylated. Examples thereof include acetate, adamantane-1-carboxylate, perfluoroalkylcarboxylate, and the like. Examples of the compound having a trialkylamine structure include tri(n-butyl)amine and tri(n-octyl)amine.

Examples of the aniline compound include 2,6-diisopropylaniline, N,N-dimethylaniline, N,N-dibutylaniline, N,N-dihexylaniline, and the like.

Examples of the alkylamine derivative having a hydroxyl group and/or an ether bond include ethanolamine, diethanolamine, triethanolamine, tris(methoxyethoxyethyl)amine, and the like.

Examples of the aniline derivative having a hydroxyl group and/or an ether bond include N,N-bis(hydroxyethyl)aniline and the like.

Examples of the basic compound also include an amine compound having a phenoxy group and an ammonium salt compound having a phenoxy group.

As the amine compound, primary, secondary, or tertiary amine compounds can be used. Among these, an amine compound in which at least one alkyl group is bonded to a nitrogen atom is preferable. The amine compound is more preferably a tertiary amine compound. In the amine compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably having 6 to 12 carbon atoms) may be bonded to a nitrogen atom.

Furthermore, it is preferable that the amine compound have an oxygen atom in the alkyl chain to form an oxyalkylene group. The number of oxyalkylene groups in the molecule is 1 or more, preferably 3 to 9, and more preferably 4 to 6.

Particularly, as the oxyalkylene group, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

As the ammonium salt compound, a primary, secondary, tertiary, or quaternary ammonium salt compound can be used. Among these, an ammonium salt compound in which at least one alkyl group is bonded to a nitrogen atom is preferable. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably having 6 to 12 carbon atoms) may be bonded to a nitrogen atom.

Furthermore, it is preferable that the ammonium salt compound have an oxygen atom in the alkyl chain to form an oxyalkylene group. The number of oxyalkylene groups in the molecule is 1 or more, preferably 3 to 9, and more preferably 4 to 6. Particularly, as the oxyalkylene group, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

Examples of the anion of the ammonium salt compound include a halogen atom, sulfonate, borate, phosphate, and the like. Among these, a halogen atom or sulfonate is preferable. As the halogen atom, chloride, bromide, and iodide are preferable. As the sulfonate, organic sulfonate having 1 to 20 carbon atoms is preferable. As the organic sulfonate, alkyl sulfonate having 1 to 20 carbon atoms and aryl sulfonate are preferable. The alkyl group of the alkyl sulfonate may have a substituent, and examples of the substituent include fluorine, chlorine, bromine, an alkoxy group, an acyl group, an aryl group, and the like. Examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate, and the like. Examples of the aryl group of the aryl sulfonate include a benzene ring, a naphthalene ring, and an anthracene ring. The benzene ring, the naphthalene ring, and the anthracene ring may have a substituent, and the substituent is preferably a linear or branched alkyl group having 1 to 6 carbon atoms or a cycloalkyl group having 3 to 6 carbon atoms, Specific examples of the linear or branched alkyl group and the cycloalkyl group include a methyl group, an ethyl group, a n-propyl group, an isopropyl group, a n-butyl group, an isobutyl group, a t-butyl group, a n-hexyl group, a cyclohexyl group, and the like. Examples of other substituents include an alkoxy group having 1 to 6 carbon atoms, a halogen atom, a cyano group, a nitro group, an acyl group, an acyloxy group, and the like.

The amine compound having a phenoxy group or the ammonium salt compound having a phenoxy group is a compound having a phenoxy group at a terminal opposite to the nitrogen atom of an alkyl group of an amine compound or an ammonium salt compound. The phenoxy group may have a substituent. Examples of the substituent of the phenoxy group include an alkyl group, an alkoxy group, a halogen atom, a cyano group, a nitro group, a carboxyl group, a carboxylate group, a sulfonate group, an aryl group, an aralkyl group, an acyloxy group, an aryloxy group, and the like. The substitution position of the substituent may be any of 2- to 6-position. The number of substituents may be in a range of 1 to 5.

It is preferable that there may be at least one oxyalkylene group between the phenoxy group and the nitrogen atom. The number of oxyalkylene groups in the molecule is 1 or more, preferably 3 to 9, and more preferably 4 to 6. Particularly, as the oxyalkylene group, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

The amine compound having a phenoxy group is obtained by heating and reacting a primary or secondary amine having a phenoxy group with haloalkyl ether, then adding an aqueous solution of strong, base, such as sodium hydroxide, potassium hydroxide, or tetraalkylammonium, and then performing extraction with a solvent such as ethyl acetate and chloroform. Alternatively, the amine compound having a phenoxy group is obtained by heating and reacting a primary or secondary amine with haloalkyl ether having a phenoxy group at a terminal, then adding an aqueous solution of a strong base, such as sodium hydroxide, potassium hydroxide, or tetraalkylammonium, and then performing extraction with a solvent such as ethyl acetate and chloroform.

(Compound (PA) Having Proton-Accepting Functional Group and Generating Compound that Experiences Deterioration or Loss of Proton-Accepting Properties or Change into Acidic Compound from Proton-Accepting Compound by being Decomposed Due to Irradiation with Actinic Rays or Radiation)

The composition according to the embodiment of the present invention may further contain, as an acid diffusion control agent, a compound [hereinafter, also called compound (PA)] having a proton-accepting functional group and generating a compound that experiences the deterioration or loss of proton-accepting properties or a change into an acidic compound from a proton-accepting compound by being decomposed due to irradiation with actinic rays or radiation.

The proton-accepting functional group is a group capable of electrostatically interacting with a proton or a functional group having an electron. For example, the proton-accepting functional group means a functional group having a macrocyclic structure such as a cyclic polyether or a functional group having a nitrogen atom having an unshared electron pair that does not contribute to 7n-conjugation. The nitrogen atom having an unshared electron pair that does not contribute to n-conjugation is, for example, a nitrogen atom having a partial structure represented by the following general formula.

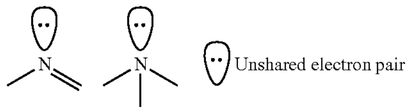

Preferred examples of the partial structures of the proton-accepting functional group include a crown ether, an azacrown ether, a primary to tertiary amine, pyridine, imidazole, a pyrazine structure, and the like.

The compound (PA) generates a compound that experiences deterioration or loss of proton-accepting properties or change into an acidic compound from a proton-accepting compound by being decomposed due to irradiation with actinic rays or radiation. The deterioration or loss of proton-accepting properties or the change into an acidic compound from a proton-accepting compound is a change of proton-accepting properties resulting from the addition of a proton to the proton-accepting functional group, which specifically means a phenomenon where an equilibrium constant of chemical equilibrium between the compound (PA) having a proton-accepting functional group and a proton is reduced when a proton adduct is generated from the compound (PA) and the proton.

Specific examples of the compound (PA) include the following compounds. Furthermore, as specific examples of the compound (PA), for example, it is possible to adopt the compounds described in paragraphs "0421" to "0428" of JP2014-041328A and paragraphs "0108" to "0116" of JP2014-134686A. What are described in these paragraphs are incorporated into the present specification.

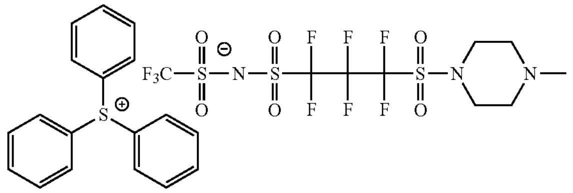

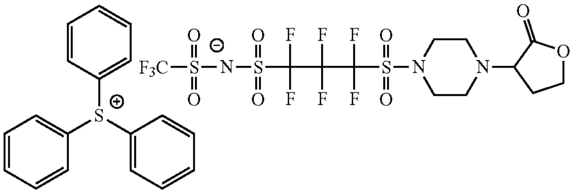

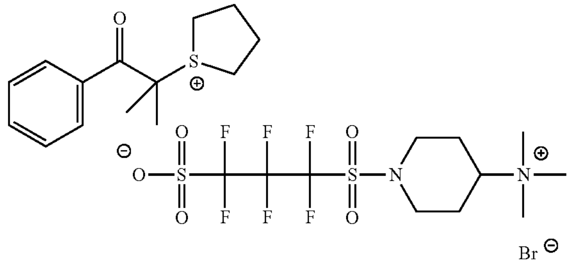

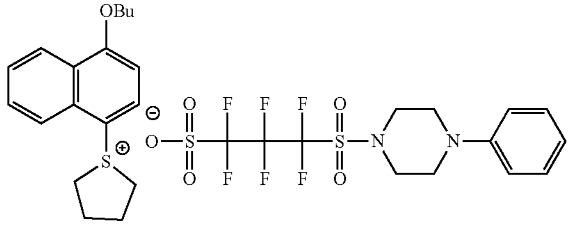

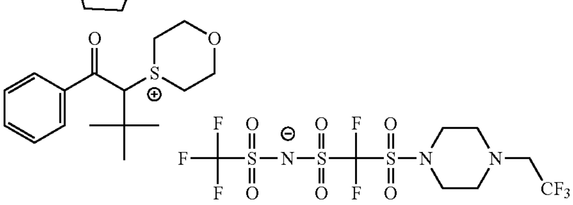

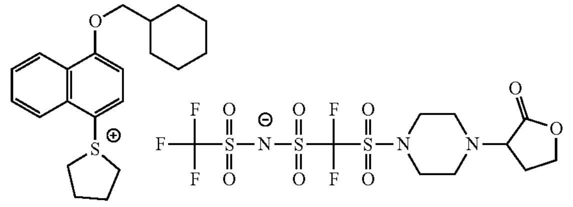

-continued

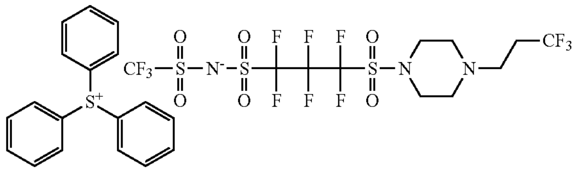

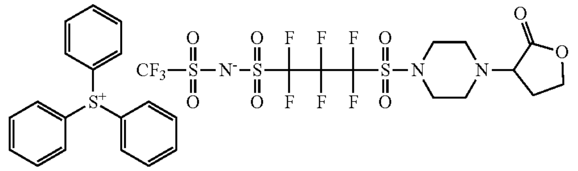

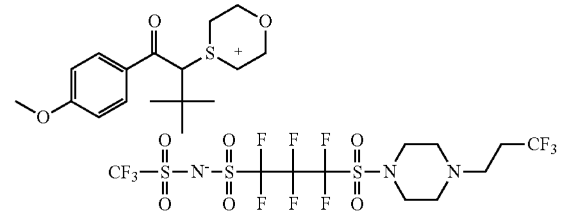

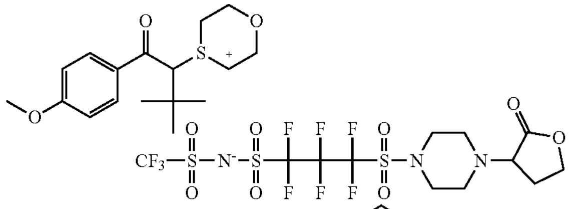

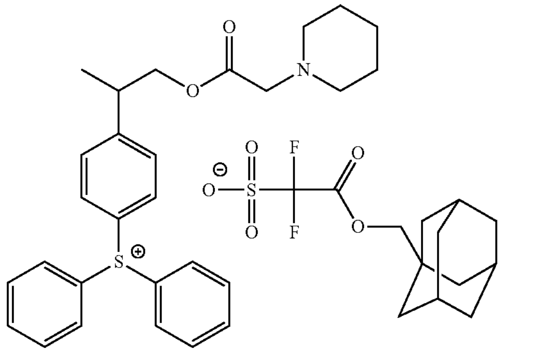

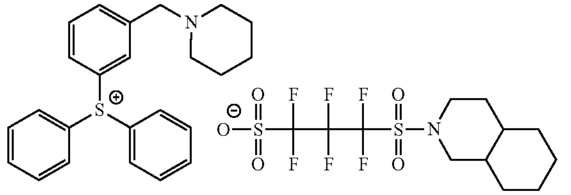

One acid diffusion control agent may be used alone, or two or more acid diffusion control agents may be used.

The content of the acid diffusion control agent with respect to the total solid content of the resist composition is preferably 0.001% to 10% by mass, and more preferably 0.005% to 5% by mass.

It is preferable that the ratio of the photo acid generator and the acid diffusion control agent used in the composition that is expressed as photo acid generator/acid diffusion control agent (molar ratio)=2.5 to 300. In view of further improving the effect of the present invention, the molar ratio is preferably 2.5 or more. In view of suppressing resolution deterioration resulting from thickening of the resist pattern with the passage of time until the post-exposure heating treatment, the molar ratio is preferably 300 or less. Photo acid generator/acid diffusion control agent (molar ratio) is more preferably 5.0 to 200, and even more preferably 7.0 to 150.

As the acid diffusion control agent, for example, it is possible to use the compounds described in paragraphs "0140" to "0144" of JP2013-11833A (an amine compound, an amide group-containing compound, a urea compound, a nitrogen-containing heterocyclic compound, and the like).

<Hydrophobic Resin>

The resist composition may contain a hydrophobic resin in addition to the resin (A).

It is preferable to design the hydrophobic resin such that the resin is distributed only within the surface of a resist film. However, unlike a surfactant, the hydrophobic resin does not need to have a hydrophilic group in a molecule and may not make a contribution to the homogeneous mixing of polar/nonpolar substances.

The addition of the hydrophobic resin brings about effects such as the control of static and dynamic contact angle formed between water and the resist film surface and the inhibition of outgas.

From the viewpoint of the distribution of the hydrophobic resin only within the surface layer of a film, the hydrophobic resin preferably has any one or more groups among a fluorine atom, a silicon atom, and a $CH_3$ partial structure contained in a side chain portion of the resin, and more preferably has two or more groups among the above. Furthermore, it is preferable that the hydrophobic resin contain a hydrocarbon group having 5 or more carbon atoms. These groups may be positioned in the main chain of the resin or may substitute a side chain of the resin.

In a case where the hydrophobic resin contains a fluorine atom and/or a silicon atom, the fluorine atom and/or the silicon atom in the hydrophobic resin may be contained in the main chain or the side chain of the resin.

In a case where the hydrophobic resin has a fluorine atom, the resin preferably has, as a partial structure having the fluorine atom; a fluorine atom-containing alkyl group, a fluorine atom-containing cycloalkyl group, or a fluorine atom-containing aryl group.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom and which may further have a substituent other than a fluorine atom.

The fluorine atom-containing cycloalkyl group is a monocyclic or polycyclic cycloalkyl group in which at least one hydrogen atom is substituted with a fluorine atom and which may further have a substituent other than a fluorine atom.

Examples of the fluorine atom-containing aryl group include an aryl group in which at least one hydrogen atom is substituted with a fluorine atom, such as a phenyl group or a naphthyl group. The fluorine atom-containing aryl group may further have a substituent other than a fluorine atom.

Examples of the repeating unit having a fluorine atom or a silicon atom include the repeating units exemplified in paragraph "0519" in US2012/0251948A1.

As described above, it is also preferable that the hydrophobic resin contains a $CH_3$ partial structure in a side chain portion.

The $CH_3$ partial structure that the side chain portion of the hydrophobic resin has includes a $CH_3$ partial structure having an ethyl group, a propyl group, or the like.

A methyl group directly bonded to the main chain of the hydrophobic resin (for example, an α-methyl group of a repeating unit having a methacrylic acid structure) contributes little for the hydrophobic resin to be distributed only within the surface due to the influence of the main chain. Accordingly, such a methyl group is not included in the $CH_3$ partial structure in the present invention.

Regarding the hydrophobic resin, the description in paragraphs "0348" to "0415" in JP2014-010245A can be referred to, and the entire contents thereof are incorporated into the present specification.

As the hydrophobic resin, in addition to the above resins, the resins described in JP2011-248019A, JP2010-175859A, and/or JP2012-032544A can also be preferably used.

<Surfactant>

The resist composition may further contain a surfactant. Incorporating a surfactant into the resist composition makes it possible to form a pattern having excellent resolution, lower adhesiveness, and fewer development defects with excellent sensitivity particularly in a case where an exposure light source having a wavelength of 250 nm or less, especially 220 nm or less, is used.

As the surfactant, it is particularly preferable to use a fluorine-based and/or silicon-based surfactant.

Examples of the fluorine-based and/or silicon-based surfactant include the surfactants described in paragraph "0276" of US2008/0248425A. In addition, EFTOP EF301 or EF303 (manufactured by Shin-Akita Kasei K.K.); FLUORAD FC430, 431, or 4430 (manufactured by Sumitomo 3M Ltd.); MEGAFACE F171, F173, F176, F189, F113, F110, F177, F120, or R08 (manufactured by DIC Corporation); SURFLON 5-382, SC101, 102, 103, 104, 105, or 106 (manufactured by AGC SEIMI CHEMICAL CO., LTD.); TROYSOL S-366 (manufactured by Troy Chemical Industries); GF-300 or GF-150 (manufactured by Toagosei Co., Ltd.), SURFLON S-393 (manufactured by AGC SEIMI CHEMICAL CO., LTD.); EFTOP EF121, EF122A, EF122B, RF122C, EF125M, EF135M, EF351, EF352, EF801, EF802, or EF601 (manufactured by Jemco); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS COMPANY LIMITED) may also be used. A polysiloxane polymer KP-341 (manufactured by Shin-Etsu Chemical Co., Ltd.) can also be used as the silicon-based surfactant.

Furthermore, the surfactant may be synthesized using a fluoroaliphatic compound manufactured by a telomerization method (also called a telomer method) or an oligomerization method (also called an oligomer method), in addition to the above known compounds. Specifically, a polymer comprising a fluoroaliphatic group derived from this fluoroaliphatic compound may be used as a surfactant. This fluoroaliphatic compound can be synthesized, for example, by the method described in JP2002-90991A.

Furthermore, surfactants other than the fluorine-based and/or silicon-based surfactants described in paragraph "0280" of US2008/0248425A may also be used.

One surfactant may be used alone, or two or more surfactants may be used.

In a case where the resist composition contains a surfactant, the content of the surfactant with respect to the total solid content of the composition is preferably 0% to 2% by mass, more preferably 0.0001% to 2% by mass, and even more preferably 0.0005% to 1% by mass.

<Other Additives>

The chemically amplified resist composition may further contain a dissolution inhibiting compound, a dye, a plasticizer, a photosensitizer, a light absorbing agent, and/or a compound that promotes solubility in a developer (for example, a phenol compound having a molecular weight of 1000 or less or an alicyclic or aliphatic compound having a carboxyl group).

The resist composition may further contain a dissolution inhibiting compound.

"Dissolution inhibiting compound" is a compound which experiences a decrease in solubility in an organic developer by being decomposed due to the action of an acid and has a molecular weight of 3,000 or less.

[Manufacturing Method of Rinsing Liquid]

In order that the content of metal components, organic substances having a boiling point of 300° C. or higher, and the like is within the desired range, it is preferable that the rinsing liquid according to the embodiment of the present invention be subjected to the following purification step.

<Purification Step>

The purification step may be performed at any timing. Examples of the purification step include the following purification treatments I to IV.

That is, the purification treatment I is a treatment of purifying raw materials used for manufacturing a solvent composing the rinsing liquid before the manufacturing of the solvent.

The purification treatment II is a treatment of purifying a solvent composing the rinsing liquid during and/or after the manufacturing of the solvent.

The purification treatment III is a treatment of purifying each component before mixing two or more solvents in manufacturing the rinsing liquid.

The purification treatment IV is a treatment of purifying a mixture after two or more solvents are mixed in manufacturing the rinsing liquid.

As described above, to obtain the target rinsing liquid, it is preferable to perform purification. The solvents may be individually purified and then mixed together. Alternatively, the solvents may be mixed together and then purified. Particularly, a method of blending purified solvents is preferable, because this method making it possible to manufacture the solvent at a constant blending ratio.

Each of the purification treatments I to IV may be carried out only once or twice or more.

As the solvent to be used, a high-purity grade product (particularly, a solvent in which the content of organic impurities, metal impurities, water, and the like described above is low) can be purchased and used after going through the purification treatment that will be described later.

An example of the purification step will be shown below. In the following description, the purification target in the purification step is simply collectively called "liquid to be purified".

For example, as the purification step, there is an aspect in which a first ion exchange treatment of performing an ion exchange treatment on a liquid to be purified, a dehydration treatment of performing dehydration on the liquid to be purified having undergone the first ion exchange treatment, a distillation treatment of performing distillation on the liquid to be purified having undergone the dehydration treatment, a second ion exchange treatment of performing an ion exchange treatment on the liquid to be purified having undergone the distillation treatment, and an organic impurity-removing treatment of removing organic impurities from the liquid to be purified having undergone the second ion exchange treatment are performed in this order. Hereinafter, an example of the purification step will be described, but the purification method for preparing the rinsing liquid according to the embodiment of the present invention is not limited thereto. For example, an aspect may be adopted in which the dehydration treatment of performing dehydration on the liquid to be purified is performed first and then the distillation treatment of performing distillation on the liquid to be purified having undergone the dehydration treatment, the first ion exchange treatment of performing an ion exchange treatment on the liquid to be purified, and the organic impurity-removing treatment of removing organic impurities from the liquid to be purified having undergone the second ion exchange treatment are performed in this order.

With the first ion exchange treatment, it is possible to remove an ion component (for example, a metal component or the like) in the liquid to be purified.

In the first ion exchange treatment, first ion exchange means such as an ion exchange resin is used. The ion exchange resin may be any of a cation exchange resin or an anion exchange resin provided in the form of a single bed, a cation exchange resin and an anion exchange resin provided in the form of a double bed, and a cation exchange resin and an anion exchange resin provided in the form of a mixed bed.

As the ion exchange resin, in order to reduce the elution of moisture from the ion exchange resin, it is preferable to use a dry resin containing as little water as possible. As such a dry resin, commercially available products can be used. Examples thereof include 15JS-HG-DRY (trade name, dry cation exchange resin, moisture content of 2% or less) manufactured by ORGANO CORPORATION), MSPS2-1-DRY (trade name, mixed-bed resin, moisture content of 10% or less), and the like.

With the dehydration treatment, it is possible to remove water in the liquid to be purified. In a case where zeolite (particularly, a molecular sieve (trade name) manufactured by UNION SHOWA K.K.), which will be described later, or the like is used in the dehydration treatment, olefins can also be removed.

Examples of dehydration means used in the dehydration treatment include a dehydrating film, water adsorbent insoluble in a liquid to be purified, an aerating purge device using a dried inert gas, a heating or vacuum heating device, and the like.

In a case where a dehydrating film is used, membrane dehydration by pervaporation (PV) or vapor permeation (VP) is performed. The dehydrating film is composed as, for example, a water-permeable film module. As the dehydrating film, it is possible to use films consisting of polymer-based materials, such as a polyimide-based material, a cellulose-based material, and a polyvinyl alcohol-based material, or an inorganic material such as a zeolite.

The water adsorbent is used by being added to the liquid to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

With the distillation treatment, it is possible to remove impurities eluted from the dehydrating film, metal components in the liquid to be, purified that are difficult to remove with the first ion exchange treatment, fine particles (including fine particles of metal components in a case where the metal components are fine particles), and water in the liquid to be purified.

Distillation means is composed of, for example, a single-stage distillation device. Although impurities are concentrated in a distillation device, or the like by the distillation treatment, in order to prevent some of the concentrated impurities from leaking, it is preferable that the distillation means be provided with means for periodically or steadily discharging a part of the liquid containing the concentrated impurities.

In a case where the impurities accumulated in the distillation device leak, the leaking impurities can be removed by the second ion exchange treatment. Furthermore, with the second ion exchange treatment, it is possible to remove an eluate from a stainless steel (SUS) pipe or the like used as a liquid feeding line.

Examples of the second ion exchange means include a tower-like container filled with an ion exchange resin and an ion adsorption film. Among these, in view of making it possible to perform the treatment at a high flow rate, an ion adsorption film is preferable.

Examples of the ion adsorption film include NEOSEPTA (trade name, manufactured by ASTOM Corporation).

It is preferable that each of the above treatments is performed in a sealed condition and in an inert gas atmosphere in which water is unlikely to be mixed into the liquid to be purified.

Furthermore, in order to suppress the mixing of moisture as much as possible, each treatment is preferably performed in an inert gas atmosphere having a dew point temperature of −70° C. or lower. This is because, in an inert gas atmosphere of −70° C. or lower, the water concentration in the gas phase is 2 ppm by mass or less, and thus water is unlikely to be mixed into the liquid to be purified.

Examples of the purification step include the adsorption and purification treatment for metal components using silicon carbide described in WO2012/043496A, in addition to the above treatments.

With the organic impurity-removing treatment, it is possible to remove high-boiling-point organic impurities and the like (including organic substances having a boiling point of 300° C. or higher) which are contained in the liquid to be purified having undergone the distillation treatment and are difficult to remove by the distillation treatment.

The organic impurities can be removed by organic impurity-removing means, for example, an organic impurity adsorption member provided with an organic impurity adsorption filter capable of adsorbing organic impurities. The organic impurity adsorption member is usually composed of the aforementioned organic impurity adsorption filter and a substrate on which the impurity adsorption filter is fixed.

From the viewpoint of improving the organic impurity adsorption performance, it is preferable that the organic impurity adsorption filter has the skeleton of an organic substance, which can interact with the organic impurities, on the surface thereof (in other words, it is preferable that the surface of the organic impurity adsorption filter is modified with the skeleton of an organic substance which can interact with the organic impurities). One of the examples of "has the skeleton of an organic substance, which can interact with the organic impurities, on the surface thereof" include a form in which the skeleton of an organic substance which can interact with the organic impurities is provided on the surface of a substrate constituting the organic impurity adsorption filter that will be described later.

Examples of the skeleton of an organic substance which can interact with the organic impurity include a chemical structure which can react with the organic impurities so as to make the organic impurities trapped in the organic impurity adsorption filter. More specifically, in a case where the organic impurities include dioctyl phthalate, diisononyl phthalate, dioctyl adipate, or dibutyl phthalate, examples of the organic skeleton include a benzene ring skeleton. In addition, in a case where the organic impurities include ethylene propylene rubber, examples of the skeleton of an organic substance include an alkylene skeleton. Furthermore, in a case where the organic impurities include a long-chain n-alkyl alcohol (corresponding to a structural isomer in a case where the long-chain 1-alkyl alcohol is used as a solvent), examples of the skeleton of an organic substance include an alkyl group.

Examples of the substrate (material) of organic impurity adsorption filter include cellulose supporting activated carbon, diatomite, nylon, polyethylene, polypropylene, polystyrene, a fluororesin, and the like.

Furthermore, as an organic impurity-removing filter, it is also possible to use a filter prepared by fixing activated carbon to nonwoven fabric described in JP2002-273123A and JP2013-150979A.

The organic impurity-removing treatment is not limited to the aforementioned aspect in which the organic impurity adsorption filter capable of adsorbing organic impurities is used, and may be, for example, an aspect in which organic impurities are physically collected. Organic impurities having a boiling point of 250° C. or higher, which is relatively high boiling point, are coarse in many cases (for example, a compound having 8 or more carbon atoms). Therefore, it is possible to collect such organic impurities by using a filter having a pore diameter of about 1 nm.

For example, in a case where the organic impurities include dioctyl phthalate, the structure of dioctyl phthalate is larger than 10 Å (=1 nm). Therefore, in a case where an organic impurity-removing filter having a pore diameter of 1 nm is used, dioctyl phthalate cannot pass through the pores of the filter. That is, being physically collected by the filter, dioctyl phthalate is removed from the liquid to be purified.

In this way, for removing organic impurities, not only a chemical interaction but also a physical removing method can be used. Here, in this case, a filter having a pore diameter of 3 nm or more is used as a "filtration member" that will be described later, and a filter having a pore diameter less than 3 nm is used as an "organic impurity-removing filter".

The purification step may further include, for example, a purification treatment V and a purification treatment VI that will be described later. Both the purification treatment V and purification treatment VI may be carried out at any timing. For example, these may be performed after the purification step IV is carried out.

The purification treatment V is a filtering treatment using a metal ion adsorption member for the purpose of removing metal ions.

The purification treatment VI is a filtration treatment for removing coarse particles.

Hereinafter; the purification treatment V and the purification treatment VI will be described.

One of the examples of means for removing metal ions in the purification treatment VI include filtering using a metal ion adsorption member comprising a metal ion adsorption filter.

The metal ion adsorption member may be composed of at least one metal ion adsorption member, or may be composed of a plurality of stacked metal ion adsorption filters depending on the intended purification level. The metal ion adsorption member is usually composed of the metal ion adsorption filter and a substrate on which the metal ion adsorption filter is fixed.

The metal ion adsorption filter comprises a function of adsorbing metal ions in the liquid to be purified. In addition, the metal ion adsorption filter is preferably a filter capable of exchanging ions.

The metal ions to be adsorbed is not particularly limited, but are preferably Fe, Cr, Ni, and Pb because these are likely to cause defects in a semiconductor device.

From the viewpoint of improving the metal ion adsorption performance, it is preferable that the metal ion adsorption filter have an acid group on the surface thereof. Examples of the acid group include a sulfo group, a carboxyl group, and the like.

Examples of the substrate (material) constituting the metal ion adsorption filter include cellulose, diatomite, nylon, polyethylene, polypropylene, polystyrene, a fluororesin, and the like.

One of the examples of filtration means in the purification treatment VI include an aspect in which filtration is performed using a filtration member comprising a filter having a diameter of particles to be removed of 20 nm or less. Adding such a filter makes it possible to remove particulate impurities from the, liquid to be purified. Examples of "particulate impurities" include particles such as dust, dirt, organic solids, and inorganic solids contained as impurities in the raw material used in manufacturing the liquid to be purified, particles of dust, dirt, organic solids, and inorganic solids incorporated as contaminants into the liquid to be purified during the purification of the liquid to be purified is purified, and the like. "Particulate impurities" correspond to the substances that exist as particles to the end without being dissolved in the liquid to be purified.

In addition, "particulate impurities" also include colloidized impurities containing metal atoms. The metal atoms are not particularly limited. In a case where the content of at least one metal atom selected from the group consisting of Na, K, Ca, Fe, Cu, Mg, Mn, Li, Al, Cr, Ni, Zn, and Pb (preferably Fe, Cr, Ni, and Pb) is particularly low (for example, in a case where the content of each type of the above metal atoms in the liquid to be purified is 1,000 ppt by mass or less), the impurities containing the metal atoms are easily colloidized. With the aforementioned metal ion adsorption member, removing the colloidized impurities tends to be difficult. Therefore, a filter having a diameter of particles to be removed of 20 nm or less (for example, a microfiltration film having a pore diameter of 20 nm or less) is used to effectively remove the colloidized impurities.

The particulate impurities have a size that enables the impurities to be removed by a filter having a diameter of particles to be removed of 20 nm or less. Specifically, the particulate impurities are particles having a diameter of 20 nm or more. In the present specification, the particulate impurities are called "coarse particles" in some cases.

The diameter of particles to be removed by the above filter is preferably 1 to 15 nm, and more preferably 1 to 12 nm. In a case where the diameter of particles to be removed is 15-nm or less, finer particulate impurities can be removed. In a case where the diameter of particles to be removed is 1 nm or more, the filtration efficiency of the liquid to be purified is improved.

The diameter of particles to be removed means the minimum size of particles that can be removed by the filter. For example, in a case where the diameter of particles to be removed by the filter is 20 nm, particles having a diameter of 20 nm or more can be removed.

Examples of the material of the filter include 6-nylon, 6,6-nylon, polyethylene, polypropylene, polystyrene, a fluororesin, and the like.

The filtration member may further comprise a filter having a diameter of particles to be removed of 50 nm or more (for example, a microfiltration film having a pore diameter of 50 nm or more for removing fine particles). In a case where the liquid to be purified also contains fine particles in addition to the colloidized impurities, particularly, the colloidized impurities including metal atoms such as iron or aluminum, filtering the liquid to be purified by using a filter having a diameter of particles to be removed of 50 nm or more (for example, a microfiltration film having a pore diameter of 50 nm or more for removing fine particles) before filtration using a filter having a diameter of particles to be removed of 20 nm or less (for example, a microfiltration film having a pore diameter of 20 nm or less) improves the filtration efficiency of the filter having a diameter of particles to be removed of 20 nm or less (for example, a microfiltration film having a pore diameter of 20 nm or less), which further improves the coarse particle removing performance.

The liquid to be purified obtained through the above treatments can be used for preparing the rinsing liquid according to the embodiment of the present invention or directly used as the rinsing liquid according to the embodiment of the present invention.

Hitherto, as an example of the aforementioned purification step, a case where all the treatments are performed has been described. However, the present invention is not limited thereto, and each of the treatments may be alone, or a plurality of the treatments may be performed in combination. In addition, each of the treatments may be performed once or a plurality of times.

In addition the aforementioned purification step, for example, by a method of storing the raw materials of solvents constituting the rinsing liquid or storing the rinsing liquid in a container that is unlikely to cause elution of impurities, the content of an organic substance having a boiling point of 300° C. or higher, metal components, and water contained in the rinsing liquid falls into a desired range. In addition, in order to prevent metal components from being eluted from "pipe" or the like used in manufacturing the rinsing liquid, for example, a method of lining the interior wall of the pipe with a fluorine-based resin may also be used.

[Container (Storage Container)]

The rinsing liquid according to the embodiment of the present invention can be filled in any container and stored, transported, and used, unless corrosiveness or the like is a problem.

It is preferable to use a container for semiconductors which has a high internal cleanliness and is unlikely to cause elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these. The interior wall of the container (the liquid contact portion in contact with the solution in the container) is preferably formed of a nonmetallic material.

As the nonmetallic material, at least one material selected from the group consisting of a polyethylene resin, a polypropylene resin, a polyethylene-polypropylene resin, a tetrafluoroethylene resin (PTFE), a trafluoroethylene-perfluoroalkyl vinyl ether copolymer (PFA), a tetrafluoroethylene-hexafluoropropylene copolymer resin (FEP), a tetrafluoroethylene-ethylene copolymer resin (ETFE), a chlorotrifluoroethylene-ethylene copolymer resin (ECTFE), a vinylidene fluoride resin (PVDF), a chlorotrifluoroethylene copolymer resin (PCTFE), a vinyl fluoride resin (PVF) is more preferable.

Particularly, among the above, in a case where a container having interior wall made of a fluororesin is used, the occurrence of problems such as elution of an ethylene or propylene oligomer can be further suppressed, than in a case where a container having interior wall formed of a polyethylene resin, a polypropylene resin, or a polyethylene-polypropylene resin is used.

Specific examples of such a container having interior wall made of a fluororesin include a FluoroPure PFA composite drum manufactured by Entegris, and the like. In addition, it is also possible to use the containers described on page 4 of JP1991-502677A (JP-H03-502677A), page 3 of WO2004/016526A, pages 9 and 16 of the WO99/46309A, and the like.

In a case where the interior wall made of a nonmetallic material is used, it is preferable that the elution of organic components in the nonmetallic material into the rinsing liquid be suppressed.

In the interior wall of the container, in addition to the nonmetallic material described above, quartz or a metal material (more preferably, an electropolished metal material, in other words, a metal material finished up with electropolishing) is also preferably used.

In such a metal material (particularly, a metal material used for manufacturing an electropolished metal material), the content of chromium is preferably more than 25% by mass with respect to the total mass of the metal material. Examples of such a metal material include stainless steel.

The content of chromium in the metal material is preferably 30% by mass or more with respect to the total mass of the metal material. The upper limit thereof is not particularly limited, but is preferably 90% by mass or less.

As the stainless steel, known stainless steel can be used without particular limitation.

Particularly, an alloy with a nickel content of 8% by mass or more is preferable, and austenite-based stainless steel with a nickel content of 8% by mass or more is more preferable.

Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the method of electropolishing the metal material, known methods can be used without particular limitation. For example, it is possible to use the methods described in paragraphs “00.11” to “0014” in JP2015-227501A, paragraphs “0036” to “0042” in JP2008-264929A, and the like.

Presumably, in a case where the metal material is electropolished, the chromium content in a passive layer on the surface thereof may become higher than the chromium content in the parent phase. Presumably, therefore, metal components are unlikely to be discharged into a solution from the interior wall coated with the electropolished metal material, which may make it possible to obtain a solution in which the content of the metal components (metal impurities) is reduced.

It is preferable that the metal material have undergone buffing. As the buffing method, known methods can be used without particular limitation. The size of abrasive grains used for finishing the buffing is not particularly limited, but is preferably #400 or less because such grains make it easy to further reduce the surface asperity of the metal material.

The buffing is preferably performed before the electropolishing.

Furthermore, one of the multistage buffing carried out by changing the size of abrasive grains, acid pickling, magnetorheological finishing, and the like or a combination of two or more treatments selected from the above may be performed on the metal material.

In the present invention, a substance having the aforementioned container and the aforementioned rinsing liquid stored in the container is also called a solution container.

It is preferable that the inside of these containers be washed before the containers are filled with the rinsing liquid. In a case where the rinsing liquid according to the embodiment of the present invention or the solvent contained in the rinsing liquid according to the embodiment of the present invention is used as a liquid for rinsing, the effects of the present invention are reliably obtained. After being manufactured, the rinsing liquid according to the embodiment of the present invention may be bottled using a container, such as a gallon bottle or a quart bottle, and transported and stored. A glass material or other materials may be used in the gallon bottle.

In order to prevent changes in the components of the rinsing liquid during storage, the inside of the container may be purged with an inert gas (such as nitrogen or argon) having a purity of 99.99995% by volume or higher. Particularly, a gas with a low moisture content is preferable. Although the rinsing liquid may be transported and stored at room temperature, in order to prevent deterioration, the temperature may be controlled in a range of −20° C. to 20° C.

[Clean Room]

It is preferable that all of the manufacturing of the rinsing liquid according to the embodiment of the present invention, the opening and/or cleaning of the storage container, the handling including the filling with the rinsing liquid and the like, the treatment and analysis, and the measurement be performed in a clean room. It is preferable that the clean room meets the ISO 14644-1 clean room standard. Specifically, the clean room preferably meets any of international organization of standardization (ISO) class 1, ISO class 2, ISO class 3, or ISO class 4, more preferably meets ISO class 1 or ISO class 2, and even more preferably meets ISO class 1. In Examples that will be described later, the manufacturing of the rinsing liquid, the opening and/or cleaning of the storage container, the handling including the filling with the rinsing liquid and the like, the treatment and analysis, and the measurement are performed in a class 2 clean room.

[Electricity Removing Step]

The preparation and purification of the rinsing liquid according to the embodiment of the present invention or the preparation and purification of the solvents contained in the rinsing liquid may further include an electricity removing step. The electricity removing step is a step of removing electricity of at least one substance selected from the group consisting of a raw material, a reactant, and a purified substance (hereinafter, called “purified substance or the like”) to reduce the charging potential of a purified substance or the like.

As the electricity removing method, known electricity removing methods can be used without particular limitation. Examples of the electricity removing method include a method of bringing the purified substance or the like into contact with a conductive material.

The contact time for which the purified substance or the like is brought into contact with a conductive material is preferably 0.001 to 60 seconds, more preferably 0.001 to 1 second, and even more preferably 0.01 to 0.1 seconds.

Examples of the conductive material include stainless steel, gold, platinum, diamond, glassy carbon, and the like.

Examples of the method of bringing the purified substance or the like into contact with a conductive material include a method of disposing a grounded mesh consisting of a conductive material in the interior of a pipe line and passing the purified substance or the like through the mesh, and the like.

The electricity removing step may be performed at any point in time from the supply of raw materials to the filling with the purified substance. For example, the electricity removing step is preferably included before at least one step selected from the group consisting of a raw material supply step, a reaction step, a liquid preparation step, a purification step, a filtration step, and a filling step, and more preferably performed before the purified substance or the like is injected into a container used in each of the above steps. In a case where the electricity removing step is performed at such a timing, it is possible to inhibit the impurities derived from a container or the like from being mixed into the purified substance or the like.

EXAMPLES

Hereinafter, the present invention will be described with reference to examples, but the present invention is not limited thereto.

[Actinic Ray-Sensitive or Radiation-Sensitive Composition (Resist Composition)]

An actinic ray-sensitive or radiation-sensitive composition (resist composition) was prepared using the following materials.

<Resin (A)>

(Synthesis Example 1): Synthesis of Resin (A-1)

Cyclohexanone (600 g) was put in a 2 L flask and purged with nitrogen at a flow rate of 100 mL/min for 1 hour. Then, a polymerization initiator V-601 (manufactured by FUJIFILM Wako Pure Chemical Corporation) (4.60 g (0.02 mol)) was added to the flask, followed by heating until the internal temperature of the contents of the flask was raised to 80° C. Thereafter, 4-acetoxystyrene (48.66 g (0.3 mol)), 1-ethylcyclopentyl methacrylate (109.4 g (0.6 mol)), and a monomer 1 (22.2 g (0.1 mol)), and a polymerization initiator V-601 (manufactured by FUJIFILM Wako Pure Chemical Corporation) (4.60 g (0.02 mol)) were dissolved in cyclohexanone (200 g), thereby preparing a monomer solution.

The monomer solution was added dropwise for 6 hours to the flask heated to an internal temperature of 80° C. as described above. After the dropwise addition ended, the reaction was further performed for 2 hours at an internal temperature of 80° C. Each monomer will be shown below.

4-Acetoxystyrene

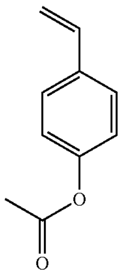

-continued

1-Ethylcyclopentyl methacrylate

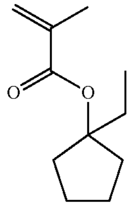

Monomer 1

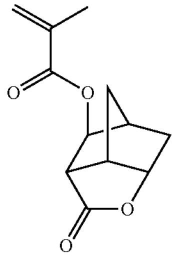

The reaction solution (contents of the flask) was cooled to room temperature and then added dropwise to hexane (3 L), thereby obtaining a mixed solution in which the polymer was precipitated. The mixed solution was filtered, thereby obtaining a solid (filtered substance). The obtained solid (filtered substance) was dissolved in acetone (500 ml) and added dropwise to hexane (3 L) again, thereby obtaining a solid (filtered substance) again in the same manner as described above. The obtained solid was dried under reduced pressure, thereby obtaining 4-acetoxystyrene/l-ethylcyclopentyl methacrylate/monomer 1 copolymer (A-1a) (160 g).

In a reaction container, the copolymer (A-1a) (10 g) obtained as above, methanol (40 mL), 1-methoxy-2-propanol (200 mL), and concentrated hydrochloric acid (1.5 mL) were added to an empty flask, and the reaction solution (contents of the flask) was heated to 80° C. and stirred for 5 hours. The reaction solution was left to cool to room temperature and then added dropwise to distilled water (3 L), thereby obtaining a mixed solution. The mixed solution was filtered, thereby obtaining a solid (filtered substance). The obtained solid (filtered substance) was dissolved in acetone (200 ml) and added dropwise to distilled water (3 L) again, thereby obtaining a solid (filtered substance) again in the same manner as described above. The obtained solid was dried under reduced pressure, thereby obtaining a resin (A-1) (8.5 g). The resin (A-1) had a weight-average molecular weight of 10,800 and a molecular weight dispersion (Mw/Mn) of 1.55.

(Synthesis Examples 2 to 5): Synthesis of Resins (A-2) to (A-5)

Resins (A-2) to (A-5) were synthesized by the same method as in Synthesis Example 1, except that the monomer used for the synthesis of the resin was changed. The compositional ratio (molar ratio) of repeating units in each resin was calculated by 1H-NMR (Nuclear Magnetic Resonance) spectroscopy.

The following table shows the resins used in the resist composition.

In the table, the column of "Compositional ratio (molar ratio)" shows the content (compositional ratio (molar ratio)) of repeating units constituting each resin. The contents of the repeating units shown in the column of "Structure" correspond to the values shown in the column of "Compositional ratio (molar ratio)" in order from the left.

The column of "Mw" shows the weight-average molecular weight of each resin.
The column of "Mw/Mn" shows the molecular weight dispersion of each resin.
TABLE 1
| | Structure | Compo-sitional ratio (molar ratio) | Mw | Mw/Mn |
|---|---|---|---|---|
| A-1 | 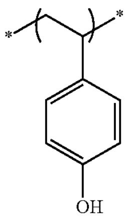 | 30/60/10 | 10,800 | 1.55 |
| | 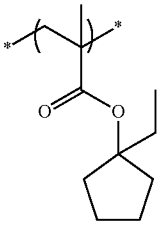 | | | |
| | 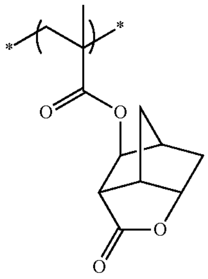 | | | |
| A-2 | 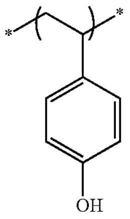 | 30/55/15 | 9,500 | 1.56 |
| | 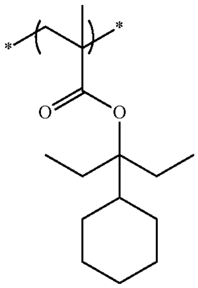 | | | |
TABLE 1-continued
| | Structure | Compo-sitional ratio (molar ratio) | Mw | Mw/Mn |
|---|---|---|---|---|
| | 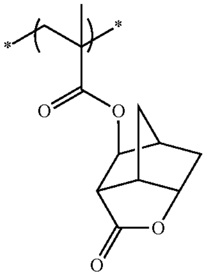 | | | |
| A-3 | 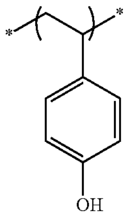 | 30/60/20 | 10,100 | 1.55 |
| | 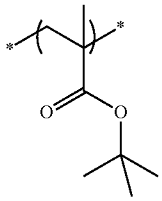 | | | |
| | 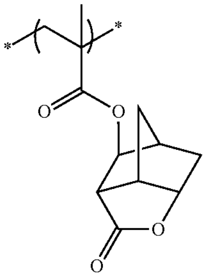 | | | |
| A-4 | 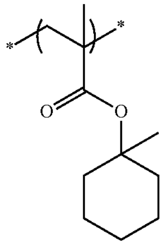 | 60/40 | 11,000 | 1.60 |
| | 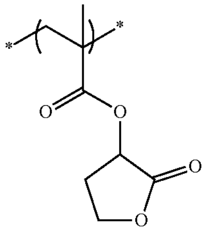 | | | |

TABLE 1-continued

| | Structure | Compositional ratio (molar ratio) | Mw | Mw/Mn |
|---|---|---|---|---|
| A-5 | 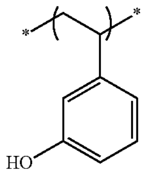 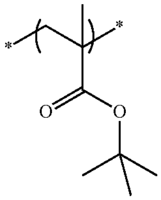 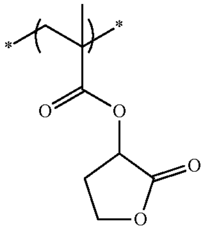 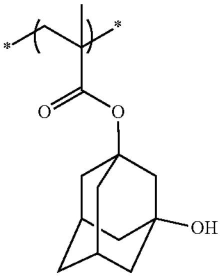 | 20/50/20/10 | 8,500 | 1.65 |

<Photo Acid Generator>

The following components were used as photo acid generators.

(B-1)

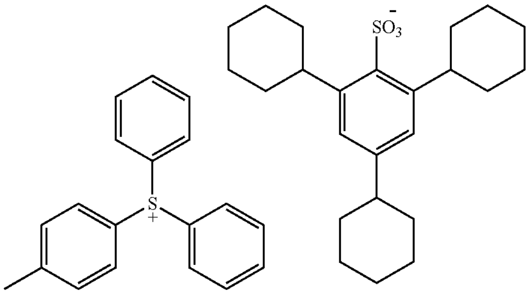

-continued (B-2)

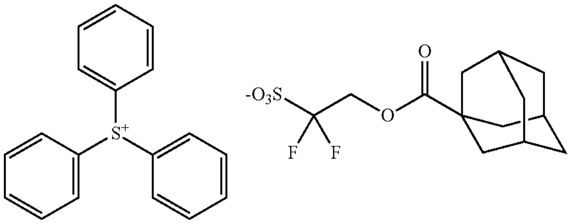

(B-3)

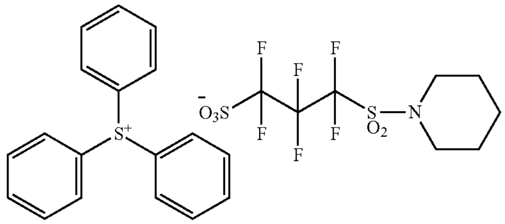

<Basic Compound (Acid Diffusion Control Agent)>

The following components were used as basic compounds.

(E-1)

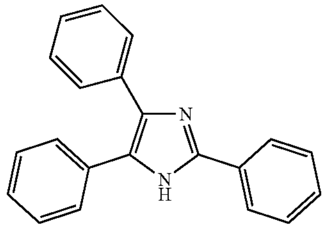

(E-2)

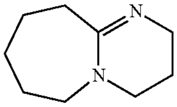

(E-3)

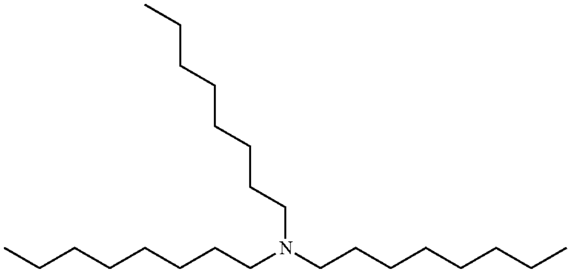

<Solvent>

The following components were used as solvents.

C-1: Propylene glycol monomethyl ether acetate

C-2: Propylene glycol

C-3: Ethyl lactate

C-4: Cyclohexanone

<Other Additives>

The following components were used as other additives.

Additive 1: 2-Hydroxy-3-naphthoic acid

Additive 2: Surfactant PF6320 (manufactured by OMNOVA Solutions Inc.)

<Preparation of Resist Composition>

The components shown in Table 2 below were dissolved in the solvent shown in the same table according to the formulation shown in the same table. The obtained mixed solution was filtered using a polyethylene filter having a pore size of 0.03 m, thereby obtaining resist compositions 1 to 7.

TABLE 2

| | Resin (A) | Photo acid generator | Basic compound | Solvent | | Other additives |
|---|---|---|---|---|---|---|
| Resist composition 1 | A-1 0.78 g | B-3 0.19 g | E-3 0.02 g | C-1 40 g | C-3 10 g | |
| Resist composition 2 | A-2 0.77 g | B-1 0.20 g | E-1 0.03 g | C-1 30 g | C-4 20 g | |
| Resist composition 3 | A-3 0.79 g | B-2 0.18 g | E-1 0.03 g | C-1 40 g | C-3 10 g | |
| Resist composition 4 | A-4 0.81 g | B-2 0.18 g | E-2 0.008 g | C-1 40 g | C-2 10 g | |
| Resist composition 5 | A-5 0.78 g | B-3 0.19 g | E-1 0.02 g | C-1 20 g | C-4 30 g | Additive 2 0.01 g |
| Resist composition 6 | A-1 0.77 g | B-1 0.20 g | E-1 0.02 g | C-1 30 g | C-4 20 g | Additive 1 0.03 g |
| Resist composition 7 | A-1 0.77 g | B-2 0.20 g | E-1 0.03 g | C-1 67.5 g | C-3 7.5 g | |

[Test]

[Simple Evaluation on Resolution Performance: EB Exposure Evaluation: Examples 1 to 29 and Comparative Examples 1 to 17]

By using the resist compositions 1 to 6 shown in Table 2, a resist pattern was formed by the following operation. Tables 3 and 4 show the resist pattern forming conditions. In both the EB exposure and EUV exposure, the resist film is ionized by the exposure, secondary electrons are generated, the photo acid generator decomposes by the generated secondary electrons, and an acid is generated. Therefore, even though the EB exposure is used for evaluation as a simple exposure evaluation instead of the EUV exposure, the same result as that of the EUV exposure can be reproduced.

<Preparation of Pattern>

(Coating with Resist Composition and Post-Coating Baking)

A 6-inch silicon wafer was coated with a composition for forming an organic film (trade name: AL412, manufactured by Brewer Science, Inc.) and backed at 205° C. for 60 seconds, thereby forming an organic film having a film thickness of 20 nm. The organic film was coated with each of the resist compositions shown in Table 2, followed by baking (post-coating baking) under the conditions shown in the following Table 4, thereby forming a resist film having a film thickness of 60 nm.

(Exposure)

The resist film on the wafer (wafer with the resist film) on which the resist film was formed as described above was exposed at each exposure amount shown in Table 3 by using an electron beam irradiation device (G100 manufactured by ELIONIX INC.; acceleration voltage 100 keV, beam current 100 pA) such that a line-and-space pattern (0.2 mm in the length direction, number of lines drawnwan: 45) having a half pitch of 22 nm was formed. Specifically, exposure was performed at an exposure amount corresponding to each shot number in the following Table 3.

The resist film was exposed (shot) at each exposure amount, and the resist film exposed at each exposure amount was subjected to the subsequent steps.

The exposure amounts in Table 3 are set such that they are logarithmically evenly spaced in the order of shot numbers.

Even though the resist films used in the evaluation have different sensitivities, by comparing the shot numbers at which the pattern could finally be resolved without a problem (the number of exposure amounts at which the pattern could be resolved without a problem), it is possible to compare the resolution performance.

TABLE 3

| Shot number | Exposure amount ($\mu C/m^2$) |
|---|---|
| 1 | 250 |
| 2 | 222 |
| 3 | 198 |
| 4 | 177 |
| 5 | 157 |
| 6 | 140 |
| 7 | 125 |
| 8 | 112 |
| 9 | 99 |
| 10 | 89 |
| 11 | 79 |
| 12 | 70 |
| 13 | 63 |
| 14 | 56 |
| 15 | 50 |

(Post-Exposure Baking)

After the exposure, the wafer was taken out of the electron beam irradiation device and immediately heated (post-exposure baking) on a hot plate under the conditions shown in Table 4.

(Development Step)

By using a shower-type development device (ADE3000S manufactured by ActesKyosan inc.), the developer (23° C.) shown in Table 4 was jetted for 10 seconds onto the wafer at a flow rate of 200 mL/min while the wafer was being rotated at 50 rpm, thereby performing development.

(Rinsing Step)

Then, the rinsing liquid (23° C.) shown in Table 4 was jetted for 5 seconds onto the wafer at a flow rate of 200 mL/min while rotating the wafer was being rotated at 50 rpm, thereby performing a rinsing treatment. In Comparative Examples 1 to 5, the rinsing treatment was not performed.

Finally, the wafer was dried by being rotated at a high speed, 2,000 rpm, for 60 seconds.

Table 4 shows the conditions of pattern formation in each of examples and comparative examples.

In Table 4, the column of “Resist composition” shows the number of the resist composition used for forming the resist film. The formulations of the developers and rinsing liquids shown in Table 4 are shown in Tables 5 and 6.

TABLE 4

| | Resist composition | Exposure | Post-coating baking | Post-exposure baking | Developer | Rinsing liquid |
|---|---|---|---|---|---|---|
| Example 1 | 1 | EB | 120° C. × 60 seconds | 110° C. × 60 seconds | S-30 | S-1 |
| Example 2 | 1 | EB | 120° C. × 60 seconds | 110° C. × 60 seconds | S-30 | S-2 |
| Example 3 | 1 | EB | 120° C. × 60 seconds | 110° C. × 60 seconds | S-30 | S-3 |
| Example 4 | 1 | EB | 120° C. × 60 seconds | 110° C. × 60 seconds | S-30 | S-4 |
| Example 5 | 2 | EB | 120° C. × 60 seconds | 110° C. × 60 seconds | S-30 | S-1 |
| Example 6 | 3 | EB | 120° C. × 60 seconds | 110° C. × 60 seconds | S-30 | S-1 |
| Example 7 | 4 | EB | 120° C. × 60 seconds | 110° C. × 60 seconds | S-30 | S-1 |
| Example 8 | 5 | EB | 120° C. × 60 seconds | 110° C. × 60 seconds | S-30 | S-1 |
| Example 9 | 1 | EB | 120° C. × 60 seconds | 110° C. × 60 seconds | S-30 | S-5 |
| Example 10 | 1 | EB | 120° C. × 60 seconds | 110° C. × 60 seconds | S-30 | S-6 |
| Example 11 | 1 | EB | 120° C. × 60 seconds | 110° C. × 60 seconds | S-30 | S-7 |
| Example 12 | 1 | EB | 120° C. × 60 seconds | 110° C. × 60 seconds | S-30 | S-8 |
| Example 13 | 1 | EB | 120° C. × 60 seconds | 110° C. × 60 seconds | S-30 | S-9 |
| Example 14 | 1 | EB | 120° C. × 60 seconds | 110° C. × 60 seconds | S-30 | S-10 |
| Example 15 | 1 | EB | 120° C. × 60 seconds | 110° C. × 60 seconds | S-30 | S-11 |
| Example 16 | 1 | EB | 120° C. × 60 seconds | 110° C. × 60 seconds | S-30 | S-12 |
| Example 17 | 1 | EB | 120° C. × 60 seconds | 110° C. × 60 seconds | S-30 | S-13 |
| Example 18 | 1 | EB | 120° C. × 60 seconds | 110° C. × 60 seconds | S-30 | S-14 |
| Example 19 | 1 | EB | 120° C. × 60 seconds | 110° C. × 60 seconds | S-30 | S-15 |
| Example 20 | 1 | EB | 120° C. × 60 seconds | 110° C. × 60 seconds | S-30 | S-16 |
| Example 21 | 1 | EB | 120° C. × 60 seconds | 110° C. × 60 seconds | S-30 | S-17 |
| Example 22 | 1 | EB | 120° C. × 60 seconds | 110° C. × 60 seconds | S-30 | S-18 |
| Example 23 | 1 | EB | 120° C. × 60 seconds | 110° C. × 60 seconds | S-30 | S-19 |
| Example 24 | 1 | EB | 120° C. × 60 seconds | 110° C. × 60 seconds | S-30 | S-20 |
| Example 25 | 1 | EB | 120° C. × 60 seconds | 110° C. × 60 seconds | S-30 | S-21 |
| Example 26 | 1 | EB | 120° C. × 60 seconds | 110° C. × 60 seconds | S-30 | S-22 |
| Example 27 | 1 | EB | 120° C. × 60 seconds | 110° C. × 60 seconds | S-30 | S-23 |
| Example 28 | 1 | EB | 120° C. × 60 seconds | 110° C. × 60 seconds | S-30 | S-24 |
| Example 29 | 1 | EB | 120° C. × 60 seconds | 110° C. × 60 seconds | S-30 | S-25 |
| Comparative Example 1 | 1 | EB | 120° C. × 60 seconds | 110° C. × 60 seconds | S-30 | |
| Comparative Example 2 | 2 | EB | 120° C. × 60 seconds | 110° C. × 60 seconds | S-30 | |
| Comparative Example 3 | 3 | EB | 120° C. × 60 seconds | 110° C. × 60 seconds | S-30 | |
| Comparative Example 4 | 4 | EB | 120° C. × 60 seconds | 110° C. × 60 seconds | S-30 | |
| Comparative Example 5 | 5 | EB | 120° C. × 60 seconds | 110° C. × 60 seconds | S-30 | |
| Comparative Example 6 | 1 | EB | 120° C. × 60 seconds | 110° C. × 60 seconds | S-30 | S-26 |
| Comparative Example 7 | 1 | EB | 120° C. × 60 seconds | 110° C. × 60 seconds | S-30 | S-27 |
| Comparative Example 8 | 1 | EB | 120° C. × 60 seconds | 110° C. × 60 seconds | S-30 | S-28 |
| Comparative Example 9 | 3 | EB | 120° C. × 60 seconds | 110° C. × 60 seconds | S-30 | S-29 |
| Comparative Example 10 | 1 | EB | 120° C. × 60 seconds | 110° C. × 60 seconds | S-30 | S-30 |
| Comparative Example 11 | 1 | EB | 120° C. × 60 seconds | 110° C. × 60 seconds | S-30 | S-31 |
| Comparative Example 12 | 1 | EB | 120° C. × 60 seconds | 110° C. × 60 seconds | S-30 | S-32 |
| Comparative Example 13 | 1 | EB | 120° C. × 60 seconds | 110° C. × 60 seconds | S-30 | S-33 |
| Comparative Example 14 | 1 | EB | 120° C. × 60 seconds | 110° C. × 60 seconds | S-30 | S-34 |
| Comparative Example 15 | 1 | EB | 120° C. × 60 seconds | 110° C. × 60 seconds | S-30 | S-35 |
| Comparative Example 16 | 1 | EB | 120° C. × 60 seconds | 110° C. × 60 seconds | S-30 | S-36 |
| Comparative Example 17 | 1 | EB | 120° C. × 60 seconds | 110° C. × 60 seconds | S-30 | S-37 |

<Evaluation>

The obtained pattern was evaluated regarding the following items. The results are shown in Table 5.

(Charging Properties (ESD Risk Evaluation))

The rinsing liquid was passed through a PFA pipe (inner diameter 4 mm, outer diameter 6 mm, NAFLON® manufactured by NICHIAS Corporation) at a flow rate of 0.5 L/min. At this time, the potential of the pipe surface was measured with a digital electrostatic potential measuring device (KSD-2000, manufactured by KASUGA DENKI, INC.). Evaluation was performed according to the following evaluation standard.

(Evaluation Standard for Charging Properties)

A: 500 mV or less

B: More than 500 mV and 1,000 mV or less

C: More than 1,000 mV and 5,000 mV or less

D: More than 5,000 mV and 7,500 mV or less

E: More than 7,500 mV (Sensitivity)

The obtained pattern was observed using a scanning electron microscope (S-9260 manufactured by Hitachi, Ltd.). The irradiation energy at which the line and the space are separately resolved at a ratio of 1:1 at a line width of 22 nm was defined as the sensitivity ($\mu C/cm^2$) of the resist film.

(Resolution (Number of Resolution Frames))

By using a scanning electron microscope (S-9260 manufactured by Hitachi, Ltd.), the state where the 22 nm line-and-space pattern was resolved at each exposure amount was observed. The shot number at which the pattern was resolved without a problem at each exposure amount was counted to evaluate resolution.

FIG. 1 shows microphotographs of patterns formed by exposure at the exposure amounts of shot numbers 3 to 10 in Example 19 and Comparative Example 1.

In Comparative Example 1, only the case where exposure was performed at the exposure amount of the shot number 4 was determined as resolved without a problem. That is, in Comparative Example 1, the shot number (number of resolution frames) at which the pattern could be resolved without a problem was 1.

In Example 19, the cases where exposure was performed at the exposure amount of the shot numbers 4 to 8 were determined as resolved without a problem. That is, in Example 19, the shot number (number of resolution frames) at which the pattern could be resolved without a problem was 5.

Based on the same evaluation standard, the number of resolution frames was also determined for other examples and comparative examples.

(Residue (Residue Suppressiveness))

A non-exposed portion of the wafer was observed using a scanning electron microscope (S-9260 manufactured by Hitachi, Ltd.) to check the presence or absence of residues.

(Film Thickness Loss Suppressiveness (Pattern Shape))

The shape of the pattern having a line width of 22 nm at the irradiation amount at which the pattern exhibits the aforementioned sensitivity was observed using a scanning electron microscope (S-4800 manufactured by Hitachi, Ltd.), and the shape of the obtained pattern was evaluated according to the following evaluation standard.

It can be determined that the film thickness loss can be further suppressed as the shape of the pattern is closer to a rectangle. Furthermore, it can be determined that the film thickness loss is greater as the shape of the pattern more significantly deteriorates.

A: Rectangular

B: The shape slightly deteriorates.

C: The shape significantly deteriorates or the pattern fails to be resolved.

TABLE 5

| | | Rinsing liquid | | | | | | | | | |
|---|---|---|---|---|---|---|---|---|---|---|---|
| | Resist- | | First ester-based solvent | | | Second organic solvent | | | | | |
| | compo-sition | Type | Type | Proportion (%) | Structure | Type | Proportion (%) | Structure | Type | Proportion (%) | Struc-ture |
| Example 1 | 1 | S-1 | Butyl propionate | 20 | Linear | Isopentyl formate | 80 | Branched | | | |
| Example 2 | 1 | S-2 | Butyl propionate | 50 | Linear | Isopentyl formate | 50 | Branched | | | |
| Example 3 | 1 | S-3 | Butyl propionate | 80 | Linear | Isopentyl formate | 20 | Branched | | | |
| Example 4 | 1 | S-4 | Butyl propionate | 10 | Linear | Isopentyl formatc | 90 | Branched | | | |
| Example 5 | 2 | S-1 | Butyl propionate | 20 | Linear | Isopentyl formate | 80 | Branched | | | |
| Example 6 | 3 | S-1 | Butyl propionate | 20 | Linear | Isopentyl formate | 80 | Branched | | | |
| Example 7 | 4 | S-1 | Butyl propionate | 20 | Linear | Isopentyl formate | 80 | Branched | | | |
| Example 8 | 5 | S-1 | Butyl propionate | 20 | Linear | Isopentyl formate | 80 | Branched | | | |
| Example 9 | 1 | S-5 | Butyl propionate | 20 | Linear | Diethyl carbonate | 80 | Lincar | | | |
| Example 10 | 1 | S-6 | Butyl propionate | 80 | Linear | Diethyl carbonate | 20 | Linear | | | |
| Example 11 | 1 | S-7 | Ethyl valerate | 20 | Linear | Isopentyl formate | 80 | Branched | | | |
| Example 12 | 1 | S-8 | Propyl butyrate | 20 | Linear | Isopentyl formate | 80 | Branched | | | |
| Example 13 | 1 | S-9 | Isobutyl propionate | 20 | Branched | Isopentyl formate | 80 | Branched | | | |

TABLE 5-continued

| | | | | | | | | |
|---|---|---|---|---|---|---|---|---|
| Example 14 | 1 | S-10 | Isopropyl butyrate | 20 | Branched | Isopentyl formate | 80 | Branched |
| Example 15 | 1 | S-11 | Ethyl isovalerate | 20 | Branched | Isopentyl formate | 80 | Branched |
| Example 16 | 1 | S-12 | Butyl propionate | 100 | Linear | | | |
| Example 17 | 1 | S-13 | Ethyl valerate | 100 | Linear | | | |
| Example 18 | 1 | S-14 | Propyl butyrate | 100 | Linear | | | |
| Example 19 | 1 | S-15 | Butyl propionate | 20 | Linear | Butyl acetate | 80 | Lincar |
| Example 20 | 1 | S-16 | Butyl propionate | 20 | Linear | Isobutyl acetate | 80 | Branched |
| Example 21 | 1 | S-17 | Butyl propionate | 20 | Linear | Isopropyl propionate | 80 | Branched |

| | Result | | | | |
|---|---|---|---|---|---|
| | Charging properties | Sensitivity ($\mu C/cm^2$) | Resolution (number of resolution frames) | Residue | Film thickness loss suppressiveness (shape) |
| Example 1 | A | 152 | 7 | Absent | A |
| Example 2 | B | 147 | 7 | Absent | A |
| Example 3 | C | 147 | 7 | Absent | A |
| Example 4 | A | 162 | 6 | Absent | A |
| Example S | A | 157 | 7 | Absent | A |
| Example 6 | A | 157 | 7 | Absent | A |
| Example 7 | A | 167 | 3 | Absent | A |
| Example 8 | A | 167 | 6 | Absent | A |
| Example 9 | A | 157 | 6 | Absent | A |
| Example 10 | B | 157 | 6 | Absent | A |
| Example 11 | A | 157 | 6 | Absent | A |
| Example 12 | A | 157 | 6 | Absent | A |
| Example 13 | A | 177 | 4 | Absent | A |
| Example 14 | A | 177 | 3 | Absent | A |
| Example 15 | A | 177 | 3 | Absent | A |
| Example 16 | B | 147 | 7 | Absent | A |
| Example 17 | B | 157 | 6 | Absent | A |
| Example 18 | B | 157 | 6 | Absent | A |
| Example 19 | A | 167 | 5 | Absent | A |
| Example 20 | A | 157 | 6 | Absent | A |
| Example 21 | A | 152 | 7 | Absent | A |

TABLE 6

| | | Rinsing liquid | | | | | | | | | |
|---|---|---|---|---|---|---|---|---|---|---|---|
| | | | First ester-based solvent | | | Second organic solvent | | | | | |
| | Resist composition | Type | Type | Proportion (%) | structure | Type | Proportion (%) | Structure | Type | Proportion (%) | Structure |
| Example 22 | 1 | S-18 | Butyl propionate | 80 | Linear | 2,6-Dimethyl-4-heptanone | 20 | Branched | | | |
| Example 23 | 1 | S-19 | Butyl propionate | 80 | Linear | 2-Heptanone | 20 | Linear | | | |
| Example 24 | 1 | S-20 | Butyl propionate | 90 | Lincar | Undecane | 10 | Linear | | | |
| Example 25 | 1 | S-21 | Butyl propionate | 5 | Linear | Isopentyl formate | 95 | Branched | | | |
| Example 26 | 1 | S-22 | Ethyl valerate | 5 | Linear | Isopentyl formate | 95 | Branched | | | |
| Example 27 | 1 | S-23 | Propyl butyrate | 5 | Linear | Isopentyl formate | 95 | Branched | | | |
| Example 28 | 1 | S-24 | Butyl propionate | 80 | Linear | Dibutyl ether | 20 | Linear | | | |
| Example 29 | 1 | S-25 | Butyl propionate | 80 | Linear | Diisopentyl ether | 20 | Branched | | | |
| Comparative Example 1 | 1 | | | | | | | | | | |
| Comparative Example 2 | 2 | | | | | | | | | | |
| Comparative Example 3 | 3 | | | | | | | | | | |

TABLE 6-continued

| | | | | | | | | |
|---|---|---|---|---|---|---|---|---|
| Comparative Example 4 | 4 | | | | | | | |
| Comparative Example 5 | 5 | | | | | | | |
| Comparative Example 6 | 1 | S-26 | Isopentyl acetate | 100 | Branched | | | |
| Comparative Example 7 | 1 | S-27 | Isopentyl acetate | 20 | Branched | Isopentyl formate | 80 | Branched |
| Comparative Example 8 | 1 | S-28 | Isopentyl formate | 100 | Lincar | | | |
| Comparative Example 9 | 3 | S-29 | Diethyl carbonate | 100 | Linear | | | |
| Comparative Example 10 | 1 | S-30 | Butyl acetate | 100 | Linear | | | |
| Comparative Example 11 | 1 | S-31 | 2-Heptanone | 100 | Linear | | | |
| Comparative Example 12 | 1 | S-32 | Undecane | 100 | Linear | | | |
| Comparative Example 13 | 1 | S-33 | Dibutyl ether | 100 | Linear | | | |
| Comparative Example 14 | 1 | S-34 | 4-Methyl-2-pentanol | 100 | Branched | | | |
| Comparative Example 15 | 1 | S-35 | Isopentyl acetate | 20 | Branched | 4-Methyl-2-pentanol | 80 | Branched |
| Comparative Example 16 | 1 | S-36 | Methyl valerate | 20 | Linear | Isopentyl formatc | 80 | Branched |
| Comparative Example 17 | 1 | S-37 | Methyl heptanoate | 20 | Linear | Isopentyl formate | 80 | Branched |

| | Charging properties | Result | | | |
|---|---|---|---|---|---|
| | | Sensitivity (μC/$cm^2$) | Resolution (number of resolution frames) | Residue | Film thickness loss suppressiveness (shape) |
| Example 22 | C | 157 | 6 | Absent | A |
| Example 23 | C | 172 | 4 | Absent | A |
| Example 24 | C | 137 | 8 | Absent | A |
| Example 25 | A | 172 | 4 | Absent | A |
| Example 26 | A | 177 | 3 | Absent | A |
| Example 27 | A | 177 | 3 | Absent | A |
| Example 28 | A | 157 | 6 | Absent | A |
| Example 29 | C | 147 | 7 | Absent | A |
| Comparative Example 1 | | 187 | 1 | Absent | C |
| Comparative Example 2 | | 187 | 1 | Absent | C |
| Comparative Example 3 | | 187 | 1 | Absent | C |
| Comparative Example 4 | | 187 | 2 | Absent | C |
| Comparative Example 5 | | 197 | 0 | Absent | C |
| Comparative Example 6 | B | 172 | 2 | Absent | B |
| Comparative Example 7 | A | 177 | 2 | Absent | B |
| Comparative Example 8 | A | 177 | 2 | Absent | B |
| Comparative Example 9 | A | 177 | 2 | Absent | B |
| Comparative Example 10 | A | 187 | 1 | Absent | B |
| Comparative Example 11 | A | 192 | 0 | Absent | C |
| Comparative Example 12 | E | 157 | 4 | Present | C |
| Comparative Example 13 | B | 182 | 2 | Present | B |
| Comparative Example 14 | A | 192 | 0 | Absent | C |
| Comparative Example 15 | A | 177 | 1 | Absent | C |
| Comparative Example 16 | A | 182 | 1 | Absent | B |
| Comparative Example 17 | A | 177 | 2 | Absent | B |

In Tables 5 and 6, the column of "Ratio (%)" shows the percentage of the mass ratio of the content of the first ester-based solvent or the second organic solvent to the total mass of the rinsing liquid.

The column of "Structure" shows whether or not the first ester-based solvent or the second organic solvent has a linear alkyl group or a branched alkyl group. The description of "branched" means that the first ester-based, solvent or the second organic solvent has a branched alkyl group. The description of "linear" means that the first ester-based solvent or the second organic solvent has a linear alkyl group and does not have a branched alkyl group.

<Result>

From the results shown in Tables 5 and 6, it has been confirmed that a desired effect is obtained in a case where the rinsing liquid according to the embodiment of the present invention is used.

By the comparison between Examples 1 to 4 and Examples 25 to 27, it has been confirmed that the effect is further improved in a case where the content of the first ester-based solvent is 10% to 100% by mass with respect to the total mass of the rinsing liquid.

By the comparison between Example 1 or the like and Examples 13 to 15, it has been confirmed that the effect is further improved in a case where first ester-based solvent has a linear alkyl group.

By the comparison between Example 1 and Examples 11 to 15, it has been confirmed that the effect is further improved in a case where first ester-based solvent is butyl propionate. By the comparison between Example 1 or the like and Example 7, it has been confirmed that the effect is further improved in a case where the actinic ray-sensitive or radiation-sensitive composition contains a resin having a hydroxystyrene-based repeating unit.

EUV Exposure Evaluation (Process Window Evaluation): Examples 30 to 31 and Comparative Example 18

By using the composition 7 shown in Table 2, a resist pattern was formed by the following operation. Details of the resist pattern forming conditions are shown in Table 7.

<Formation of Pattern>

(Coating with Resist Composition and Post-Coating Baking)

A 12-inch silicon wafer was coated with a composition AL412 for forming an organic film (manufactured by Brewer Science, Inc.) and backed at 205° C. for 60 seconds, thereby forming an organic film having a film thickness of 20 nm. The organic film was coated with each of the resist compositions shown in Table 2, followed by baking (post-coating baking) under the conditions shown in the following Table 7, thereby forming a resist film having a film thickness of 40 nm.

(Exposure)

By using an EUV exposure device, the wafer on which the resist film was formed as above (wafer with a resist film) was exposed by changing focus and exposure amount, such that a dot pattern having HP (half pitch) of 28 nm was formed.

Specifically, the focal condition was changed by 0.02 μm in a range of −0.06 to 0.10 μm, such that a total of 9 types of focal conditions were created. Furthermore, as the exposure amount condition, the exposure amount was changed by 1 $mJ/cm^2$ in a range of 41 to 69 $mJ/cm^2$, such that a total of 29 types of exposure amount conditions were created. The 9 types of focal conditions and 29 types of exposure amount conditions were combined, such that the exposure was performed under a total of 261 types of exposure conditions.

(Post-Exposure Baking)

After the exposure, the wafer was taken out of the exposure device and immediately baked (post-exposure baking) for 60 seconds at a condition of 110° C. by using a hot plate provided in a development device (ACT12 manufactured by Tokyo Electron Limited.)

(Development Step)

By using a development device (ACT12 manufactured by Tokyo Electron Limited.), the developer (23° C.) shown in Table 7 was jetted for 10 seconds onto the wafer at a flow rate of 200 mL/min while the wafer was being rotated at 50 rpm, thereby performing development.

(Rinsing Step)

Then, the rinsing liquid (23° C.) shown in Table 7 was jetted for 5 seconds onto the wafer at a flow rate of 200 mL/min while rotating the wafer was being rotated at 50 rpm, thereby performing a rinsing treatment. In Comparative Example 18, the rinsing treatment was not performed.

Finally, the wafer was dried by being rotated at a high speed, 2,000 rpm, for 60 seconds.

TABLE 7

| | Resist composition | Exposure | Post-coating baking | Post-exposure baking | Developer | Rinsing liquid |
|---|---|---|---|---|---|---|
| Example 30 | 7 | EUV | 120° C. × 60 seconds | 110° C. × 60 seconds | S-30 | S-1 |
| Example 31 | 7 | EUV | 120° C. × 60 seconds | 110° C. × 60 seconds | S-30 | S-2 |
| Comparative Example 18 | 7 | EUV | 120° C. × 60 seconds | 110° C. × 60 seconds | S-30 | — |

<Evaluation>

The obtained pattern was evaluated regarding the following items. Details of the results are shown in Table 8.

The column of "sensitivity" in Table 8 shows the irradiation energy (exposure amount, unit: $mJ/cm^2$) at which the dot pattern having HP (half pitch) of 28 nm was resolved.

(Process Margin Evaluation (Resolution (Number of Resolution Frames)))

The obtained pattern was observed using a scanning electron microscope (S-9380 manufactured by Hitachi, Ltd.). The number of frames in which the dot pattern was resolved without a problem (the number of resolution frames; the number of exposure amounts and the number of focal depths at which the pattern could be resolved without a problem) was counted. The number of resolution frames of a focus at which the number of resolution frames is maximized as a result of performing exposure in the manner in (Exposure) was evaluated as the number of resolution frames in the direction of the exposure amount.

Furthermore, the number of resolution frames of an exposure amount at which the number of resolution frames is maximized as a result of performing exposure in the manner in (Exposure) was evaluated as the number of resolution frames in the direction of the focal depth.

The charging properties, residue, and film thickness loss suppressiveness were evaluated by the same procedure as in the evaluation of the charging properties, residue, and film thickness loss suppressiveness in [Simple evaluation on resolution performance: EB exposure evaluation: Examples 1 to 29 and Comparative Examples 1 to 17].

TABLE 8

| | Charging properties | Sensitivity mJ/cm$^2$ | Number of resolution frames Directon of exposure amount/direction of focal depth | Residue | Film thickness loss suppressiveness (shape) |
|---|---|---|---|---|---|
| Example 30 | A | 55 | 5/5 | Absent | A |
| Example 31 | B | 55 | 5/5 | Absent | A |
| Comparative Example 18 | — | 55 | 1/1 | Absent | A |

From the above evaluation results, it has been confirmed that the pattern forming method using the rinsing liquid according to the embodiment of the present invention can bring about a desired effect.

What is claimed is:

1. A rinsing liquid for resist film patterning for a resist film obtained from an actinic ray-sensitive or radiation-sensitive composition, the rinsing liquid comprising:

at least a first ester-based solvent having 7 carbon atoms other than an acetate, wherein a content of the first ester-based solvent is 10% to 100% by mass with respect to a total mass of the rinsing liquid.

2. The rinsing liquid according to claim 1, wherein the first ester-based solvent includes at least one compound selected from the group consisting of butyl propionate, propyl butyrate, ethyl valerate, isobutyl propionate, isopropyl butyrate, propyl isobutyrate, isopropyl isobutyrate, ethyl isovalerate, and methyl hexanoate.

3. The rinsing liquid according to claim 1, wherein the first ester-based solvent has a linear alkyl group.

4. The rinsing liquid according to claim 1, wherein the first ester-based solvent is butyl propionate.

5. The rinsing liquid according to claim 1, further comprising:

an organic solvent other than the first ester-based solvent.

6. The rinsing liquid according to claim 5, wherein the organic solvent includes at least one solvent selected from the group consisting of a ketone-based solvent, an ether-based solvent, a hydrocarbon-based solvent, and a second ester-based solvent other than the first ester-based solvent.

7. The rinsing liquid according to claim 5, wherein the organic solvent further includes a ketone-based solvent, and the ketone-based solvent includes at least one compound selected from the group consisting of 2-heptanone, 2,6-dimethyl-4-heptanone, 3-methyl-2-butanone, 3,3-dimethyl-2-butanone, 2-methyl-3-pentanone, 3-methyl-2-pentanone, 4-methyl-2-pentanone, diisopropylketone, 2-methyl-3-hexanone, and 5-methyl-2-hexanone.

8. The rinsing liquid according to claim 5, wherein the organic solvent further includes an ether-based solvent, and the ether-based solvent includes at least one compound selected from the group consisting of diisobutyl ether and diisopentyl ether.

9. The rinsing liquid according to claim 5, wherein the organic solvent further includes a hydrocarbon-based solvent, and the hydrocarbon-based solvent includes at least one compound selected from the group consisting of decane, undecane, and mesitylene.

10. The rinsing liquid according to claim 5, wherein the organic solvent further includes a second ester-based solvent, and the second ester-based solvent includes at least one compound selected from the group consisting of butyl acetate, isobutyl acetate, tert-butyl acetate, pentyl formate, isopentyl formate, tert-pentyl formate, isopropyl propionate, ethyl butyrate, and diethyl carbonate.

11. The rinsing liquid according to claim 1, wherein the actinic ray-sensitive or radiation-sensitive composition contains a resin having a hydroxystyrene-based repeating unit.

12. A pattern forming method comprising:

a resist film forming step of forming a resist film by using the actinic ray-sensitive or radiation-sensitive composition;

an exposure step of exposing the resist film; and a treatment step of treating the exposed resist film with the rinsing liquid according to claim 1.

13. A pattern forming method comprising:

a resist film forming step of forming a resist film by using the actinic ray-sensitive or radiation-sensitive composition;

an exposure step of exposing the resist film; and a treatment step of treating the exposed resist film, wherein the treatment step includes a development step of developing the resist film with a developer and a rinsing step of rinsing the resist film with a rinsing liquid, and the rinsing liquid is the rinsing liquid according to claim 1.

* * * * *